(12) United States Patent
Raring et al.

(10) Patent No.: US 10,854,776 B1
(45) Date of Patent: Dec. 1, 2020

(54) MANUFACTURABLE THIN FILM GALLIUM AND NITROGEN CONTAINING DEVICES INTEGRATED WITH SILICON ELECTRONIC DEVICES

(71) Applicant: Soraa Laser Diode, Inc., Goleta, CA (US)

(72) Inventors: James W. Raring, Santa Barbara, CA (US); Melvin McLaurin, Santa Barbara, CA (US); Alexander Sztein, Santa Barbara, CA (US); Po Shan Hsu, Arcadia, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 16/796,154

(22) Filed: Feb. 20, 2020

Related U.S. Application Data

(63) Continuation of application No. 16/005,255, filed on Jun. 11, 2018, now Pat. No. 10,629,689, which is a
(Continued)

(51) Int. Cl.
*H01L 33/00* (2010.01)
*H01L 29/205* (2006.01)
(Continued)

(52) U.S. Cl.
CPC .... *H01L 33/0093* (2020.05); *H01L 21/02458* (2013.01); *H01L 21/311* (2013.01);
(Continued)

(58) Field of Classification Search
CPC ..... H01L 33/005–0091; H01L 33/0093; H01L 27/15–156; H01L 21/311–31144
See application file for complete search history.

(56) References Cited

U.S. PATENT DOCUMENTS

| 4,341,592 A | 7/1982 | Shortes et al. |
| 4,860,687 A | 8/1989 | Frijlink |
| (Continued) | | |

FOREIGN PATENT DOCUMENTS

| CN | 101262118 A | 9/2008 |
| CN | 102792447 A | 11/2012 |
| (Continued) | | |

OTHER PUBLICATIONS

Power Electronics, Retrieved from the internet: http://en.wikipedia.org/wiki/Power_electronics, Dec. 31, 2014, 24 pages.
(Continued)

*Primary Examiner* — Scott B Geyer
(74) *Attorney, Agent, or Firm* — Kilpatrick Townsend & Stockton LLP

(57) ABSTRACT

A method for manufacturing a display panel comprising light emitting device including micro LEDs includes providing multiple donor wafers having a surface region and forming an epitaxial material overlying the surface region. The epitaxial material includes an n-type region, an active region comprising at least one light emitting layer overlying the n-type region, and a p-type region overlying the active layer region. The multiple donor wafers are configured to emit different color emissions. The epitaxial material on the multiple donor wafers is patterned to form a plurality of dice, characterized by a first pitch between a pair of dice less than a design width. At least some of the dice are selectively transferred from the multiple donor wafers to a common carrier wafer such that the carrier wafer is configured with different color emitting LEDs. The different color LEDs could comprise red-green-blue LEDs to form a RGB display panel.

29 Claims, 68 Drawing Sheets

Device integration on carrier wafer

Related U.S. Application Data continuation of application No. 15/480,239, filed on Apr. 5, 2017, now Pat. No. 10,002,928, which is a continuation of application No. 15/209,309, filed on Jul. 13, 2016, now Pat. No. 9,653,642, which is a continuation-in-part of application No. 14/580,693, filed on Dec. 23, 2014, now Pat. No. 9,666,677.

(51) Int. Cl.

| | | |
|---|---|---|
| H01L 33/06 | (2010.01) | |
| H01L 29/66 | (2006.01) | |
| H01L 23/00 | (2006.01) | |
| H01L 33/32 | (2010.01) | |
| H01S 5/02 | (2006.01) | |
| H01L 21/311 | (2006.01) | |
| H01L 21/683 | (2006.01) | |
| H01L 27/06 | (2006.01) | |
| H01L 27/12 | (2006.01) | |
| H01L 21/02 | (2006.01) | |
| H01L 29/20 | (2006.01) | |
| H01L 27/088 | (2006.01) | |
| H01L 27/15 | (2006.01) | |
| H01S 5/227 | (2006.01) | |
| H01S 5/343 | (2006.01) | |

(52) U.S. Cl.
CPC ......... *H01L 21/6835* (2013.01); *H01L 24/00* (2013.01); *H01L 27/0629* (2013.01); *H01L 27/0676* (2013.01); *H01L 27/088* (2013.01); *H01L 27/1255* (2013.01); *H01L 27/1259* (2013.01); *H01L 27/15* (2013.01); *H01L 29/2003* (2013.01); *H01L 29/205* (2013.01); *H01L 29/66136* (2013.01); *H01L 29/66143* (2013.01); *H01L 29/66318* (2013.01); *H01L 29/66462* (2013.01); *H01L 29/66916* (2013.01); *H01L 33/007* (2013.01); *H01L 33/0025* (2013.01); *H01L 33/0066* (2013.01); *H01L 33/0075* (2013.01); *H01L 33/06* (2013.01); *H01L 33/32* (2013.01); *H01S 5/0203* (2013.01); *H01S 5/0217* (2013.01); *H01S 5/227* (2013.01); *H01S 5/34333* (2013.01)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Iida et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 8,634,442 B1 | 1/2014 | Raring et al. |
| 8,847,249 B2 | 9/2014 | Raring et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,520,695 B2 | 12/2016 | Hsu et al. |
| 9,520,697 B2 | 12/2016 | Steigerwald et al. |
| 9,543,738 B2 | 1/2017 | Raring et al. |
| 9,653,642 B1 | 5/2017 | Raring et al. |
| 9,666,677 B1 | 5/2017 | Raring et al. |
| 9,711,949 B1 | 7/2017 | Raring et al. |
| 9,755,398 B2 | 9/2017 | Sztein et al. |
| 9,774,170 B2 | 9/2017 | McLaurin et al. |
| 9,871,350 B2 | 1/2018 | McLaurin et al. |
| 9,882,353 B2 | 1/2018 | Hsu et al. |
| 10,002,928 B1 | 6/2018 | Raring et al. |
| 10,141,714 B2 | 11/2018 | Sztein et al. |
| 10,193,309 B1 | 1/2019 | Raring et al. |
| 10,367,334 B2 | 7/2019 | McLaurin et al. |
| 10,439,364 B2 | 10/2019 | McLaurin et al. |
| 10,566,767 B2 | 2/2020 | Steigerwald et al. |
| 10,629,689 B1 | 4/2020 | Raring et al. |
| 10,658,810 B2 | 5/2020 | Sztein et al. |
| 2002/0050488 A1 | 5/2002 | Nikitin et al. |
| 2002/0085603 A1 | 7/2002 | Okumura |
| 2002/0097962 A1 | 7/2002 | Yoshimura et al. |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |

(56) References Cited

U.S. PATENT DOCUMENTS

| | | |
|---|---|---|
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0209402 A1 | 10/2004 | Chai et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0267238 A1 | 10/2008 | Takeuchi et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0028204 A1 | 1/2009 | Hiroyama et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0166668 A1 | 7/2009 | Shakuda |
| 2009/0173957 A1 | 7/2009 | Brunner et al. |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0008391 A1 | 1/2010 | Nakagawa et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0059790 A1 | 3/2010 | Takeuchi |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'evelyn |
| 2010/0195687 A1 | 8/2010 | Okamoto et al. |
| 2010/0220262 A1 | 9/2010 | Demille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0329297 A1 | 12/2010 | Rumpler et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0204376 A1 | 8/2011 | Su et al. |
| 2011/0216795 A1 | 9/2011 | Hsu et al. |
| 2011/0247556 A1 | 10/2011 | Raring et al. |
| 2012/0178198 A1 | 7/2012 | Raring et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2013/0313516 A1 | 11/2013 | David et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0294162 A1 | 10/2016 | McLaurin et al. |
| 2016/0359294 A1 | 12/2016 | Sztein et al. |
| 2016/0372893 A1 | 12/2016 | McLaurin et al. |
| 2017/0063045 A1 | 3/2017 | McLaurin et al. |
| 2017/0063047 A1 | 3/2017 | Steigerwald et al. |
| 2017/0365975 A1 | 12/2017 | Sztein et al. |
| 2018/0013265 A1 | 1/2018 | McLaurin et al. |

(56) References Cited

U.S. PATENT DOCUMENTS

2019/0109432 A1 4/2019 Sztein et al.
2020/0099196 A1 3/2020 McLaurin et al.

FOREIGN PATENT DOCUMENTS

| JP | 2007068398 | 3/2007 |
|---|---|---|
| JP | 2007173467 | 7/2007 |
| WO | 2008041521 | 4/2008 |

OTHER PUBLICATIONS

Transistor, Retrieved from http://en.wikipedia.org/wiki/Transistor, Dec. 31, 2014, 25 pages.
U.S. Appl. No. 12/481,543, Non-Final Office Action dated Jun. 27, 2011, 10 pages.
U.S. Appl. No. 12/482,440, Final Office Action dated Aug. 12, 2011, 7 pages.
U.S. Appl. No. 12/482,440, Non-Final Office Action dated Feb. 23, 2011, 6 pages.
U.S. Appl. No. 12/484,924, Final Office Action dated Oct. 31, 2011, 11 pages.
U.S. Appl. No. 12/484,924, Non-Final Office Action dated Apr. 14, 2011, 12 pages.
U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.
U.S. Appl. No. 12/502,058, Notice of Allowance dated Apr. 16, 2012, 10 pages.
U.S. Appl. No. 12/534,829, Non-Final Office Action dated Apr. 19, 2011, 9 pages.
U.S. Appl. No. 12/534,829, Notice of Allowance dated Dec. 21, 2011, 4 pages.
U.S. Appl. No. 12/534,829, Notice of Allowance dated Dec. 5, 2011, 7 pages.
U.S. Appl. No. 12/534,829, Notice of Allowance dated Oct. 28, 2011, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/573,820, filed Oct. 5, 2009, 32 pages.
U.S. Appl. No. 12/727,148, filed Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jun. 29, 2011, 20 pages.
U.S. Appl. No. 12/749,466, Non-Final Office Action dated Jul. 3, 2012, 18 pages.
U.S. Appl. No. 12/749,466, Notice of Allowance dated Jan. 2, 2013, 8 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated May 4, 2012, 8 pages.
U.S. Appl. No. 12/759,273, Non-Final Office Action dated Nov. 21, 2011, 10 pages.
U.S. Appl. No. 12/759,273, Final Office Action dated Jun. 26, 2012, 10 pages.
U.S. Appl. No. 12/759,273, Non-Final Office Action dated Apr. 3, 2014, 16 pages.
U.S. Appl. No. 12/759,273, Final Office Action dated Oct. 24, 2014, 16 pages.
U.S. Appl. No. 12/759,273, Non-Final Office Action dated Jan. 29, 2015, 16 pages.
U.S. Appl. No. 12/759,273, Final Office Action dated Jun. 8, 2015, 17 pages.
U.S. Appl. No. 12/759,273, Non-Final Office Action dated Sep. 23, 2015, 18 pages.
U.S. Appl. No. 12/759,273, Final Office Action dated Mar. 29, 2016, 12 pages.
U.S. Appl. No. 12/759,273, Notice of Allowance dated Aug. 19, 2016, 8 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 9 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/868,441, Non-Final Office Action dated Apr. 30, 2012, 12 pages.
U.S. Appl. No. 12/868,441, Final Office Action dated Dec. 18, 2012, 34 pages.
U.S. Appl. No. 12/868,441, Notice of Allowance dated Sep. 18, 2013, 13 pages.
U.S. Appl. No. 12/873,820, Non-Final Office Action dated Oct. 4, 2012, 10 pages.
U.S. Appl. No. 12/880,803, Non-Final Office Action dated Feb. 22, 2012, 9 pages.
U.S. Appl. No. 12/880,803, Notice of Allowance dated Jul. 18, 2012, 5 pages.
U.S. Appl. No. 12/880,889, filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/883,652, Final Office Action dated Jan. 11, 2013, 12 pages.
U.S. Appl. No. 12/883,652, Non-Final Office Action dated May 14, 2014, 14 pages.
U.S. Appl. No. 12/883,652, Final Office Action dated Dec. 19, 2014, 16 pages.
U.S. Appl. No. 12/883,652, Non-Final Office Action dated Jun. 3, 2015, 16 pages.
U.S. Appl. No. 12/883,652, Final Office Action dated Oct. 26, 2015, 11 pages.
U.S. Patent Application No. 12/883,652, Non-Final Office Action mailed on Apr. 5, 2016, 12 pages.
U.S. Patent Application No. 12/883,652, Notice of Allowance mailed on Aug. 30, 2016, 7 pages.
U.S. Patent Application No. 12/884,993, Final Office Action mailed on Aug. 2, 2012, 15 pages.
U.S. Patent Application No. 12/884,993, Non-Final Office Action mailed on Mar. 16, 2012, 15 pages.

(56) References Cited

OTHER PUBLICATIONS

U.S. Patent Application No. 12/884,993, Notice of Allowance mailed on Nov. 26, 2012, 11 pages.
U.S. Patent Application No. 13/014,622, Final Office Action mailed on Apr. 30, 2012, 14 pages.
U.S. Patent Application No. 13/014,622, Non-Final Office Action mailed on Nov. 28, 2011, 14 pages.
U.S. Patent Application No. 13/046,565, Final Office Action mailed on Feb. 2, 2012, 17 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/176,403, Non-Final Office Action dated Sep. 11, 2015, 13 pages.
U.S. Appl. No. 14/176,403, Notice of Allowance dated Feb. 12, 2016, 8 pages.
U.S. Appl. No. 14/312,427, Final Office Action dated Dec. 16, 2015, 18 pages.
U.S. Appl. No. 14/312,427, Non-Final Office Action dated Aug. 21, 2015, 13 pages.
U.S. Appl. No. 14/480,398, Non-Final Office Action dated Mar. 17, 2016, 17 pages.
U.S. Appl. No. 14/480,398, Notice of Allowance dated Aug. 12, 2016, 9 pages.
U.S. Appl. No. 14/534,636, Non-Final Office Action dated Jun. 3, 2015, 9 pages.
U.S. Appl. No. 14/534,636, Notice of Allowance dated Sep. 15, 2015, 11 pages.
U.S. Appl. No. 14/559,149, Notice of Allowance dated Feb. 17, 2016, 10 pages.
U.S. Appl. No. 14/580,693, Non-Final Office Action dated Jun. 16, 2016, 23 pages.
U.S. Appl. No. 14/580,693, Notice of Allowance dated Jan. 17, 2017, 8 pages.
U.S. Appl. No. 14/580,693, filed Dec. 23, 2014, 161 pages.
U.S. Appl. No. 14/600,506, Notice of Allowance dated Aug. 9, 2016, 8 pages.
U.S. Appl. No. 14/968,710, First Action Interview Pilot Program Pre-Interview Communication dated Jan. 12, 2017, 3 pages.
U.S. Appl. No. 14/968,710, Notice of Allowance dated Mar. 3, 2017, 12 pages.
U.S. Appl. No. 14/968,710, filed Dec. 14, 2015, 78 pages.
U.S. Appl. No. 15/173,441, Non-Final Office Action dated Dec. 29, 2016, 6 pages.
U.S. Appl. No. 15/173,441, Notice of Allowance dated Apr. 13, 2017, 8 pages.
U.S. Appl. No. 15/173,441, filed Jun. 3, 2016, 43 pages.
U.S. Appl. No. 15/176,076, Final Office Action dated Dec. 8, 2017, 12 pages.
U.S. Appl. No. 15/176,076, Non Final Office Action dated Apr. 30, 2018, 10 pages.
U.S. Appl. No. 15/176,076, Non-Final Office Action dated Jun. 6, 2017, 14 pages.
U.S. Appl. No. 15/176,076, Final Office Action dated Nov. 15, 2018, 10 pages.
U.S. Appl. No. 15/176,076, filed Jun. 7, 2016, 99 pages.
U.S. Appl. No. 15/176,076, Notice of Allowance dated Mar. 6, 2019, 7 pages.
U.S. Appl. No. 15/177,710, Non-Final Office Action dated Dec. 30, 2016, 8 pages.
U.S. Appl. No. 15/177,710, Notice of Allowance dated May 2, 2017, 10 pages.
U.S. Appl. No. 15/177,710, filed Jun. 9, 2016, 136 pages.
U.S. Appl. No. 15/612,897 Notice of Allowance dated Sep. 12, 2018, 7 pages.
U.S. Appl. No. 15/612,897, Non-Final Office Action dated Jun. 21, 2018, 5 pages.
U.S. Appl. No. 15/694,641, Restriction Requirement dated Sep. 26, 2018, 6 pages.
U.S. Appl. No. 15/694,641 Non-Final Office Action dated Jan. 24, 2019, 9 pages.
U.S. Appl. No. 15/694,641 Notice of Allowance dated May 8, 2019, 9 pages.
U.S. Appl. No. 16/199,974 Non-Final Office Action dated Sep. 24, 2019, 8 pages.
U.S. Appl. No. 16/199,974 Notice of Allowance dated Jan. 15, 2020, 8 pages.
U.S. Appl. No. 16/217,359 Non-Final Office Action dated Nov. 8, 2019, 8 pages.
U.S. Appl. No. 16/217,359 Notice of Allowance dated Mar. 10, 2020, 7 pages.
U.S. Appl. No. 15/820,160 Non-Final Office Action dated Nov. 20, 2019, 8 pages.
U.S. Appl. No. 15/820,160 Notice of Allowance dated Apr. 1, 2020, 9 pages.
U.S. Appl. No. 15/180,737, Notice of Allowance dated Aug. 25, 2017, 11 pages.
U.S. Appl. No. 15/180,737, filed Jun. 13, 2016, 162 pages.
U.S. Appl. No. 15/209,309, Notice of Allowance dated Dec. 19, 2016, 12 pages.
U.S. Appl. No. 15/209,309, filed Jul. 13, 2016, 192 pages.
U.S. Appl. No. 15/351,326, Final Office Action dated Jan. 18, 2018, 15 pages.
U.S. Appl. No. 15/351,326, Non-Final Office Action dated Jul. 14, 2017, 15 pages.
U.S. Appl. No. 15/351,326 Notice of Allowance dated Sep. 25, 2019, 8 pages.
U.S. Appl. No. 15/351,326, Non-Final Office Action dated Jun. 1, 2018, 13 pages.
U.S. Appl. No. 15/351,326, Final Office Action dated Dec. 7, 2018, 15 pages.
U.S. Appl. No. 15/356,302, Non-Final Office Action dated May 5, 2017, 8 pages.
U.S. Appl. No. 15/356,302, Notice of Allowance dated Sep. 19, 2017, 8 pages.
U.S. Appl. No. 15/480,239, Final Office Action dated Oct. 24, 2017, 15 pages.
U.S. Appl. No. 15/480,239, Non-Final Office Action dated Jul. 3, 2017, 13 pages.
U.S. Appl. No. 15/480,239, Notice of Allowance dated Feb. 20, 2018, 8 pages.
U.S. Appl. No. 15/675,532, Non-Final Office Action dated Dec. 18, 2017, 11 pages.
U.S. Appl. No. 15/675,532 Notice of Allowance dated Jul. 19, 2018, 7 pages.
U.S. Appl. No. 61/164,409, filed Mar. 28, 2009, 23 pages.
U.S. Appl. No. 61/182,105, filed May 29, 2009, 10 pages.
U.S. Appl. No. 61/249,568, filed Oct. 7, 2009, 62 pages.
Abare et al., Cleaved and Etched Facet Nitride Laser Diodes, IEEE Journal of Selected Topics in Quantum Electronics, vol. 4, No. 3, May-Jun. 1998, pp. 505-509.
Amano et al., P-Type Conduction in Mg-Doped GaN Treated with Low-Energy Electron Beam Irradiation (LEEBI), Japanese Journal of Applied Physics, vol. 28, No. 12, Dec. 1989, pp. L2112-L2114.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. 10024-10027.
Caneau et al., Studies on the Selective OMVPE of (Ga,In)/(As,P), Journal of Crystal Growth, vol. 124, Nov. 1, 1992, pp. 243-248.
Chen et al., Growth and Optical Properties of Highly Uniform and Periodic InGaN Nanostructures, Advanced Materials, vol. 19, 2007, pp. 1707-1710.
D'Evelyn et al., Bulk GaN Crystal Growth by the High-Pressure Ammonothermal Method, Journal of Crystal Growth, vol. 300, No. 1, Mar. 1, 2007, pp. 11-16.

(56) References Cited

OTHER PUBLICATIONS

Founta et al., Anisotropic Morphology of Nonpolar a-Plane GaN Quantum Dots and Quantum Wells, Journal of Applied Physics, vol. 102, No. 7, 2007, pp. 074304-1-074304-6.

Fujii et al., Increase in the Extraction Efficiency of GaN-Based Light-Emitting Diodes via Surface Roughening, Applied Physics Letters, vol. 84, No. 6, 2004, pp. 855-857.

Funato et al., Blue, Green, and Amber InGaN/GaN Light-Emitting Diodes on Semipolar {1122} GaN Bulk Substrates, Journal of Japanese Applied Physics, vol. 45, No. 26, 2006, pp. L659-L662.

Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.

Gardner et al., Blue-Emitting InGaN—GaN Double-Heterostructure Light-Emitting Diodes Reaching Maximum Quantum Efficiency Above 200A/cm2, Applied Physics Letters, vol. 91, 2007, pp. 243506-1-243506-3.

Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.

Hjort, Sacrificial Etching of III-V Compounds for Micromechanical Devices, J. Micromech. Miroeng., vol. 6, 1996, pp. 370-375.

Holder et al., Demonstration of Nonpolar GaN-Based Vertical-Cavity Surface-Emitting Lasers, Appl. Phys. Express, vol. 5, No. 9, 2012, pp. 092104-1-092104-3.

Iso et al., High Brightness Blue InGaN/GaN Light Emitting Diode on Nonpolar m-Plane Bulk GaN Substrate, Japanese Journal of Applied Physics, vol. 46, No. 40, 2007, pp. L960-L962.

Kendall et al., Energy Savings Potential of Solid State Lighting in General Lighting Applications, Report for the Department of Energy, 2001, pp. 1-35.

Khan et al., Cleaved Cavity Optically Pumped InGaN—GaN Laser Grown on Spinel Substrates, Applied Physics Letters, vol. 69, No. 16, Oct. 14, 1996, pp. 2418-2420.

Kim et al., Improved Electroluminescence on Nonpolar m-Plane InGaN/GaN Qantum Well LEDs, Physica Status Solidi (RRL), vol. 1, No. 3, 2007, pp. 125-127.

Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.

Lidow et al., Gallium Nitride (GaN) Technology Overview, EPC White Paper: WP001, 2012, pp. 1-6.

Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.

Masui et al., Electrical Characteristics of Nonpolar InGaN-Based Light-Emitting Diodes Evaluated at Low Temperature, Japanese Journal of Applied Physics, vol. 46, No. 11, 2007, pp. 7309-7310.

Michiue et al., Recent Development of Nitride LEDs and LDs, Proceedings of SPIE, vol. 7216, 2009, pp. 72161Z-1-72161Z-6.

Nakamura et al., Candela-Class High-Brightness InGaN/AlGaN Double-Heterostructure Blue-Light-Emitting Diodes, Appl. Phys. Lett., vol. 64, No. 13, 1994, pp. 1687-1689.

Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, 1998, pp. 211-213.

Nakamura et al., P—GaN/n-InGaN/n-GaN Double-Heterostructure Blue-Light-Emitting Diodes, Jpn. J. Appl. Phys., vol. 32, 1993, pp. L8-L11.

Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.

Okamoto et al., Continuous-Wave Operation of m-Plane InGaN Multiple Quantum Well Laser Diodes, The Japan Society of Applied Physics, JJAP Express Letter, vol. 46, No. 9, 2007, pp. L187-L189.

Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, Jun. 20, 2008, pp. 072201-1-072201-3.

Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.

Okubo, Nichia Develops Blue-green Semiconductor Laser w/ 488nm Wavelength, Tech-on, Retrieved from the internet: http://techon.nikkeibp.cojp/english/NEWS_EN/20080122/146009/?ST=english_PRINT, 2008, pp. 1-2.

Park, Crystal Orientation Effects on Electronic Properties of Wurtzite InGaN/GaN Quantum Wells, Journal of Applied Physics, vol. 91, No. 12, Jun. 15, 2002, pp. 9904-9908.

International Application No. PCT/US2009/046786, International Search Report and Written Opinion dated May 13, 2010, 8 pages.

International Application No. PCT/US2009/047107, International Search Report and Written Opinion dated Sep. 29, 2009, 10 pages.

International Application No. PCT/US2009/052611, International Search Report and Written Opinion dated Sep. 29, 2009, 11 pages.

International Application No. PCT/US2010/030939, International Search Report and Written Opinion dated Jun. 16, 2010, 9 pages.

International Application No. PCT/US2010/049172, International Search Report and Written Opinion dated Nov. 17, 2010, 7 pages.

International Application No. PCT/US2011/037792, International Search Report and Written Opinion dated Sep. 8, 2011, 9 pages.

International Application No. PCT/US2015/014567, International Search Report and Written Opinion dated Jul. 8, 2015, 19 pages.

Purvis, Changing the Crystal Face of Gallium Nitride, The Advance Semiconductor Magazine, III-Vs Review, vol. 18, No. 8, Nov. 8, 2005, 3 pages.

Romanov et al., Strain-Induced Polarization in Wurtzite III-Nitride Semipolar Layers, Journal of Applied Physics, vol. 100, Jul. 25, 2006, pp. 023522-1-023522-10.

Sato et al., High Power and High Efficiency Green Light Emitting Diode on Free-Standing Semipolar (1122) Bulk GaN Substrate, Physica Status Sol. (RRL), vol. 1, No. 4, Jun. 15, 2007, pp. 162-164.

Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.

Schmidt et al., Demonstration of Nonpolar m-Plane InGaN/GaN Laser Diodes, Japanese Journal of Applied Physics, vol. 46, No. 9, 2007, pp. L190-L191.

Schmidt et al., High Power and High External Efficiency m-Plane InGaN Light Emitting Diodes, Japanese Journal of Applied Physics, vol. 46, No. 7, Feb. 9, 2007, pp. L126-L128.

Schoedl et al., Facet Degradation of GaN Heterostructure Laser Diodes, Journal of Applied Physics, vol. 97, No. 12, 2005, pp. 123102-1-123102-8.

Shchekin et al., High Performance Thin-Film Flip-Chip InGaN—GaN Light-Emitting Diodes, Applied Physics Letters, vol. 89, Aug. 16, 2006, pp. 071109-1-071109-3.

Shen et al., Auger Recombination in InGaN Measured by Photoluminescence, Applied Physics Letters, vol. 91, Oct. 1, 2007, pp. 141101-1-141101-3.

Sink, Cleaved-Facet Group-III Nitride Lasers, University of California, Santa Barbara, Ph.D. Dissertation, Dec. 2000, 251 pages.

Sizov et al., 500-nm Optical Gain Anisotropy of Semipolar (1122) InGaN Quantum Wells, Applied Physics Express, vol. 2, Jun. 19, 2009, pp. 071001-1-071001-3.

Tamboli, Photoelectrochemical Etching of Gallium Nitride for High Quality Optical Devices, Retrieved from the internet: http://adsabs.harvard.edu/abs/2009PhDT . . . 68T., 2009, 207 pages.

Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.

Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.

Uchida et al., Recent Progress in High-Power Blue-Violet Lasers, IEEE Journal of Selected Topics in Quantum Electronics, vol. 9, No. 5, 2003, pp. 1252-1259.

(56) References Cited

OTHER PUBLICATIONS

Waltereit et al., Nitride Semiconductors Free of Electrostatic Fields for Efficient White Light-Emitting Diodes, Nature, vol. 406, Aug. 24, 2000, pp. 865-868.

Wierer et al., High-Power AlGaInN Flip-Chip Light-Emitting Diodes, Applied Physics Letters, vol. 78, No. 22, 2001, pp. 3379-3381.

Wikipedia, Gallium Nitride, Gallium nitride, retrieved from http://en/wikipedia.org/wiki/Gallium_nitride, Dec. 31, 2014, 6 pages.

Wikipedia, Light-Emitting Diode, Retrieved from the internet: http://en.wikipedia.org/wiki/Light-emitting diode, Dec. 31, 2014, 44 pages.

Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.

Yang, Micromachining of Gan Using Photoelectrochemical Etching, Graduate Program in Electronic Engineering, Notre Dame, Indiana, 2005, 168 pages.

Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, 2 pages.

Extended European Search Report for European Patent Application No. 15 746 370.4, Jul. 11, 2017, 11 pages.

Zhong, et al., Demonstration of High Power Blue-Green Light Emitting Diode on Semipolar (1122) Bulk GaN Substrate, Electronics Letters, vol. 43, No. 15, 2 pages, Jul. 19, 2007.

Zhong, et al., High Power and High Efficiency Blue Light Emitting Diode on Freestanding Semipolar (1011) Bulk GaN Substrate, Applied Physics Letter, vol. 90, No. 23, pp. 233504-1-233504-3, 2007.

U.S. Appl. No. 16/586,100 Non-Final Office Action dated Jun. 8, 2020, 5 pages.

U.S. Appl. No. 16/796,183 Non-Final Office Action dated Jul. 8, 2020, 8 pages.

U.S. Appl. No. 16/796,183 Notice of Allowance dated Jul. 31, 2020, 12 pages.

U.S. Appl. No. 16/835,082 Notice of Allowance dated Jul. 31, 2020, 9 pages.

U.S. Appl. No. 16/835,082 Non-Final Office Action dated Jul. 9, 2020, 11 pages.

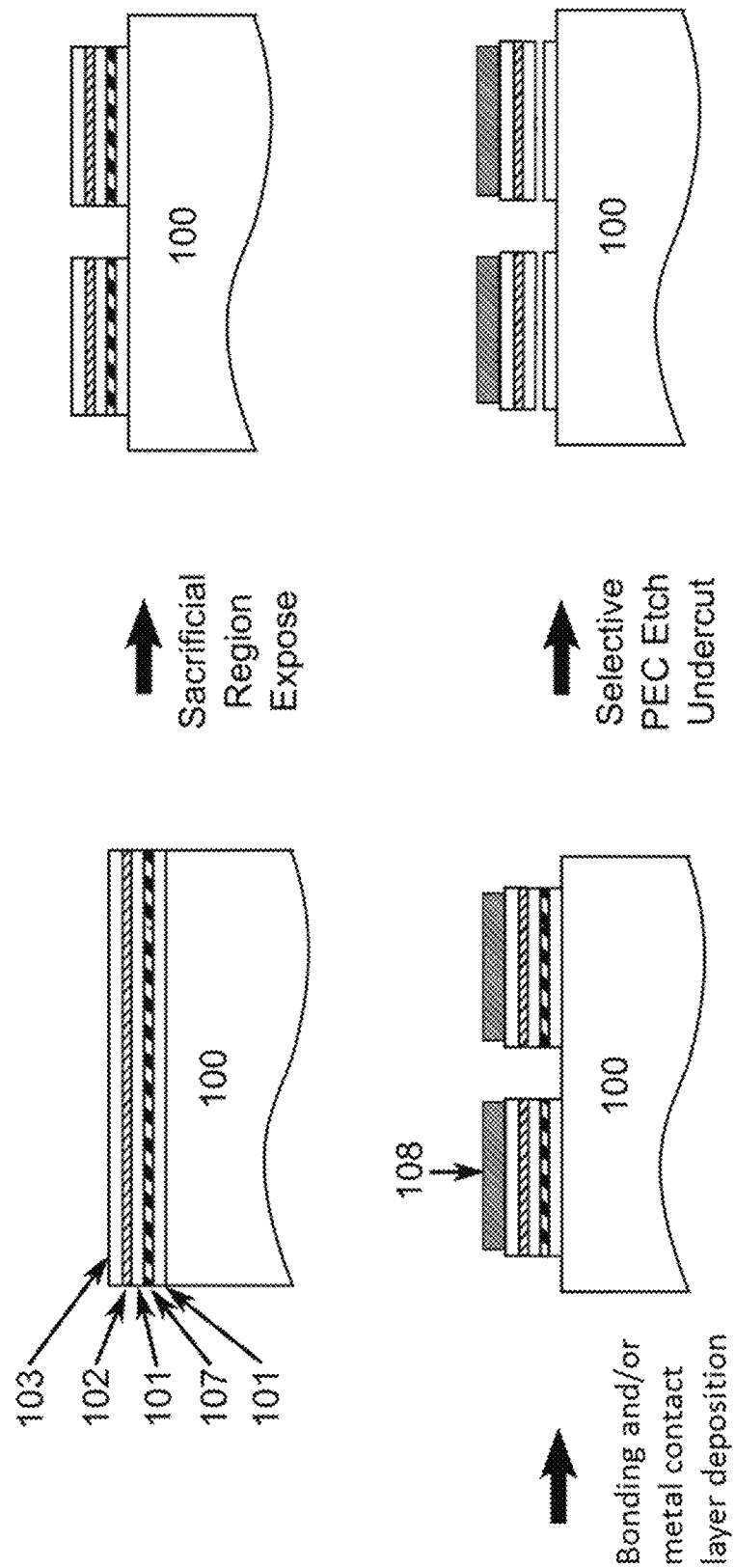

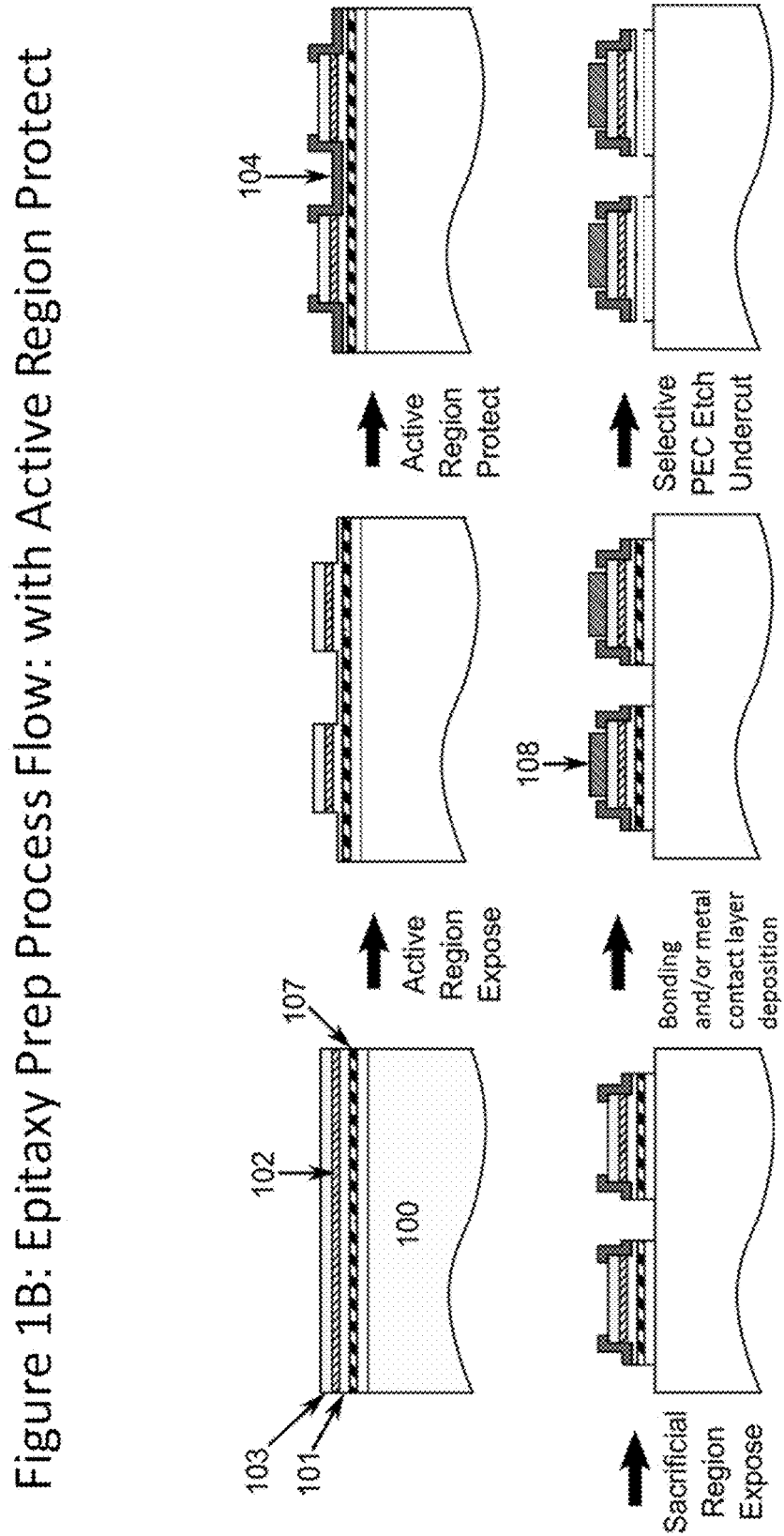

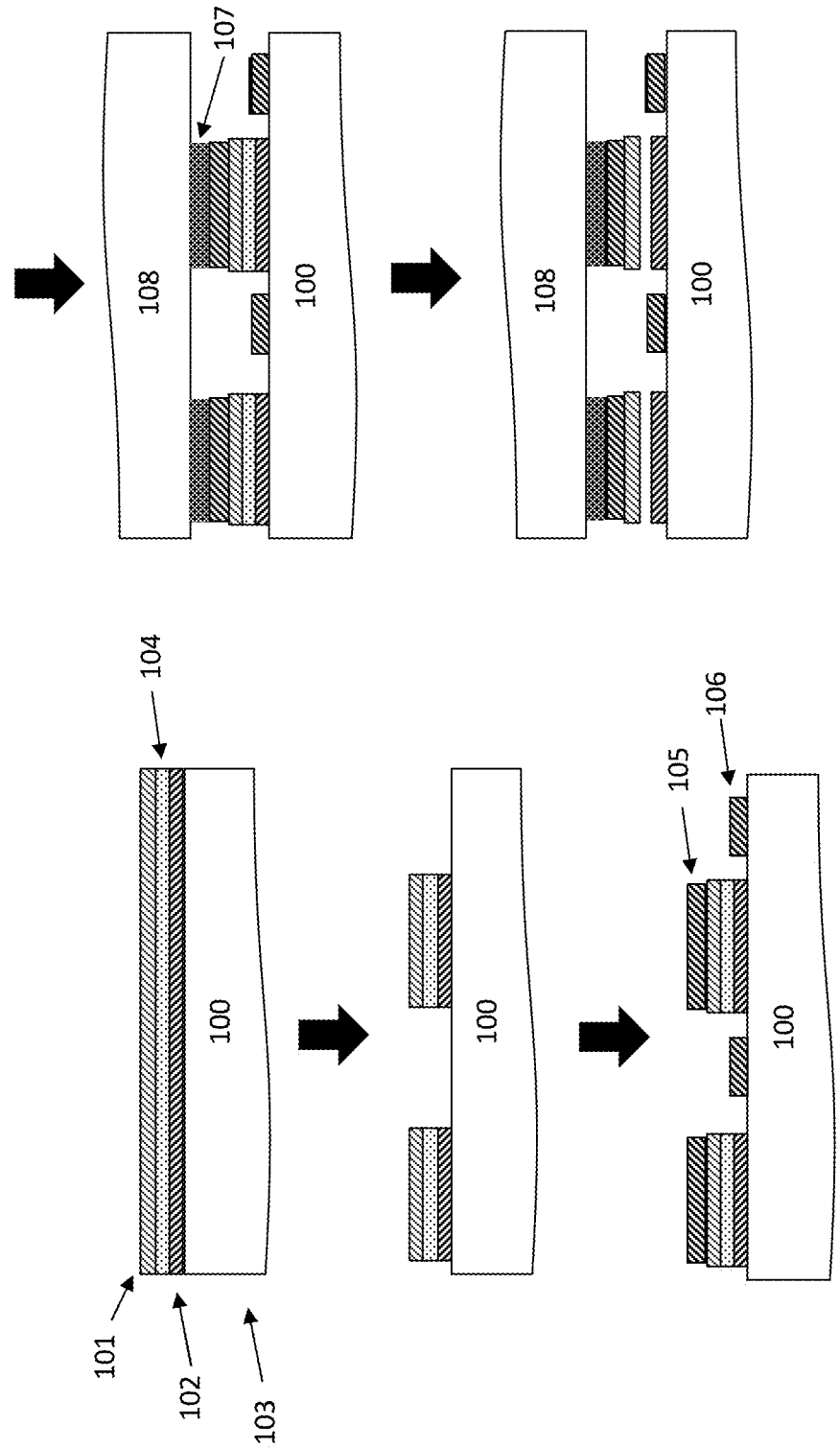
Figure 2A: Bond then etch

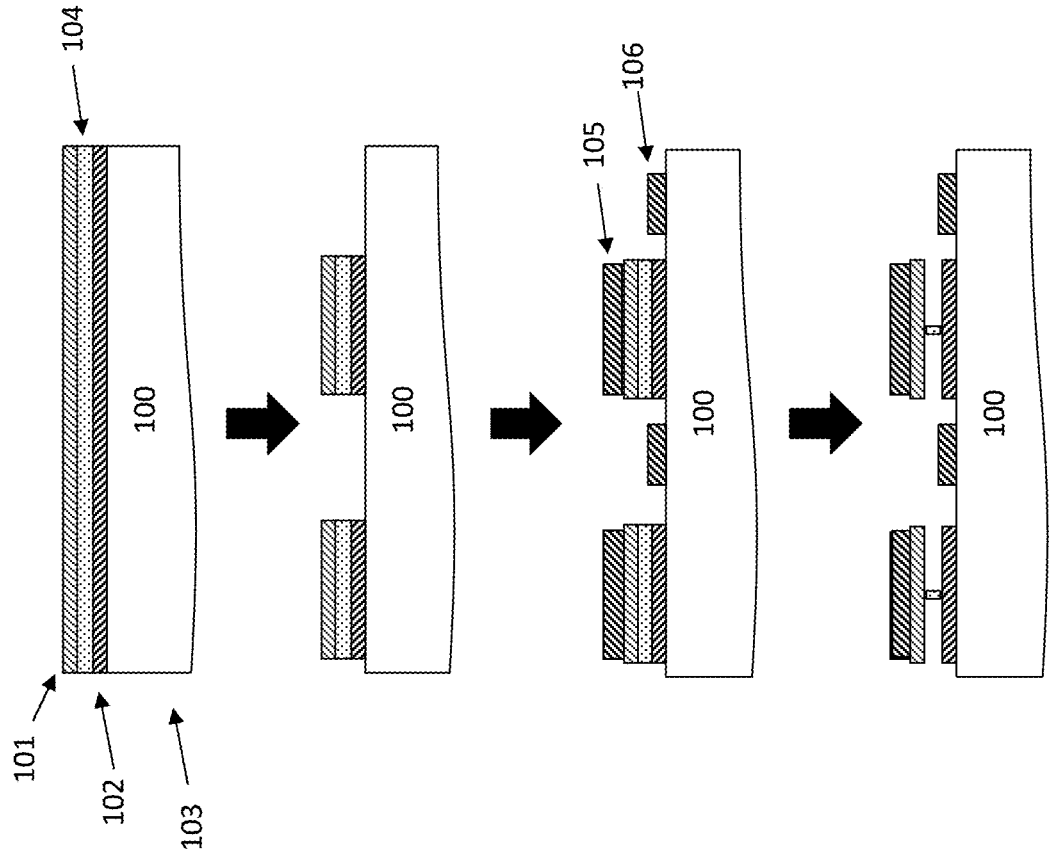
Figure 2B: Etch then bond: sacrificial layer not fully removed

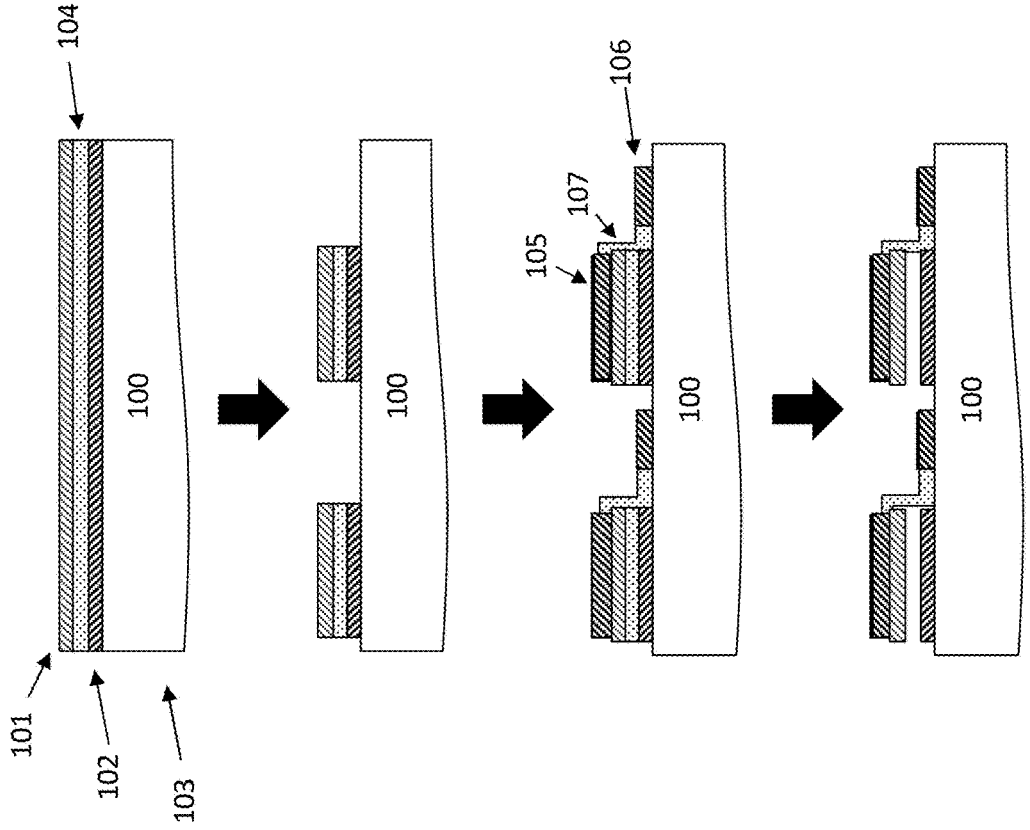
Figure 2C: Etch then bond: microfabricated anchor made from metal, ceramic, polymer, or the like.

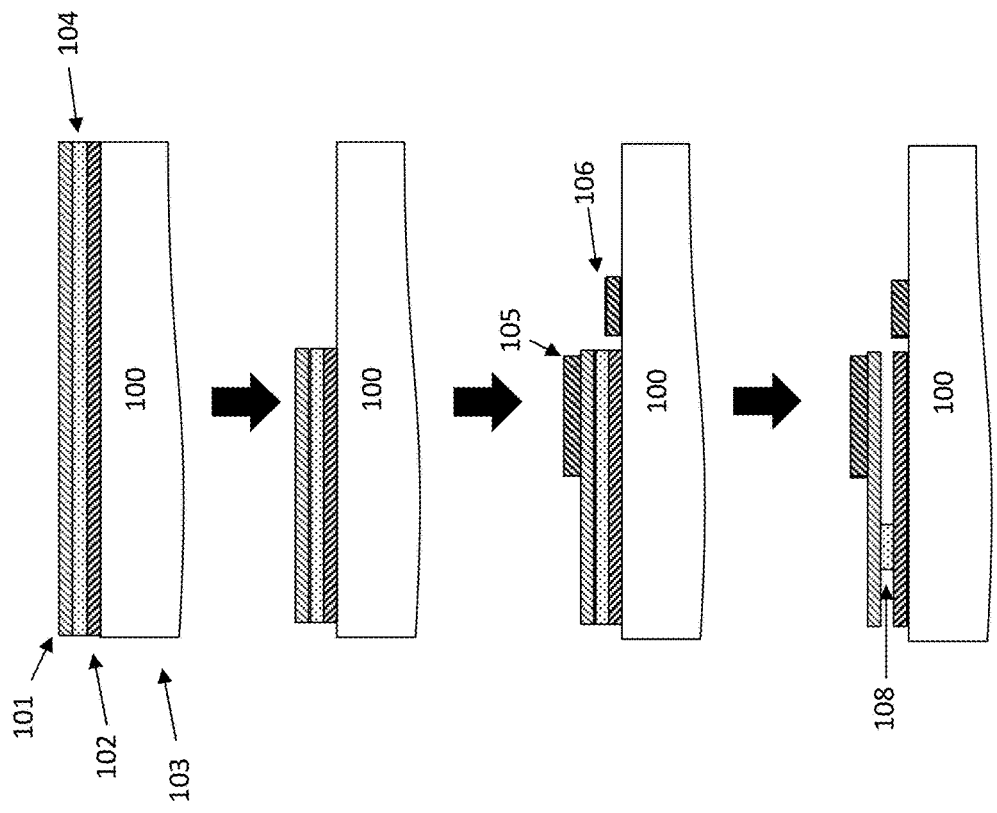
Figure 2D: Etch then bond: anchor composed of epitaxial semiconductor material

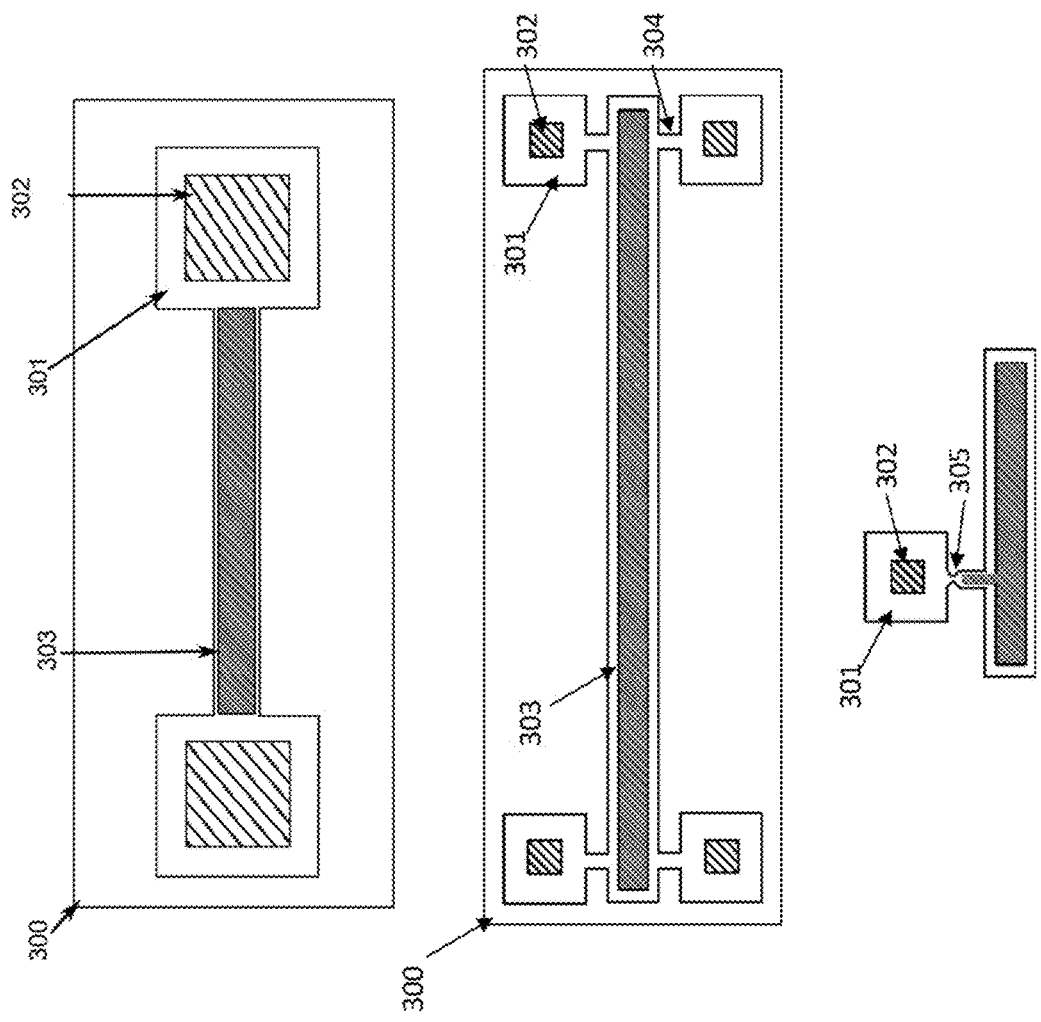
Figure 2E: Anchored PEC Undercut Top View

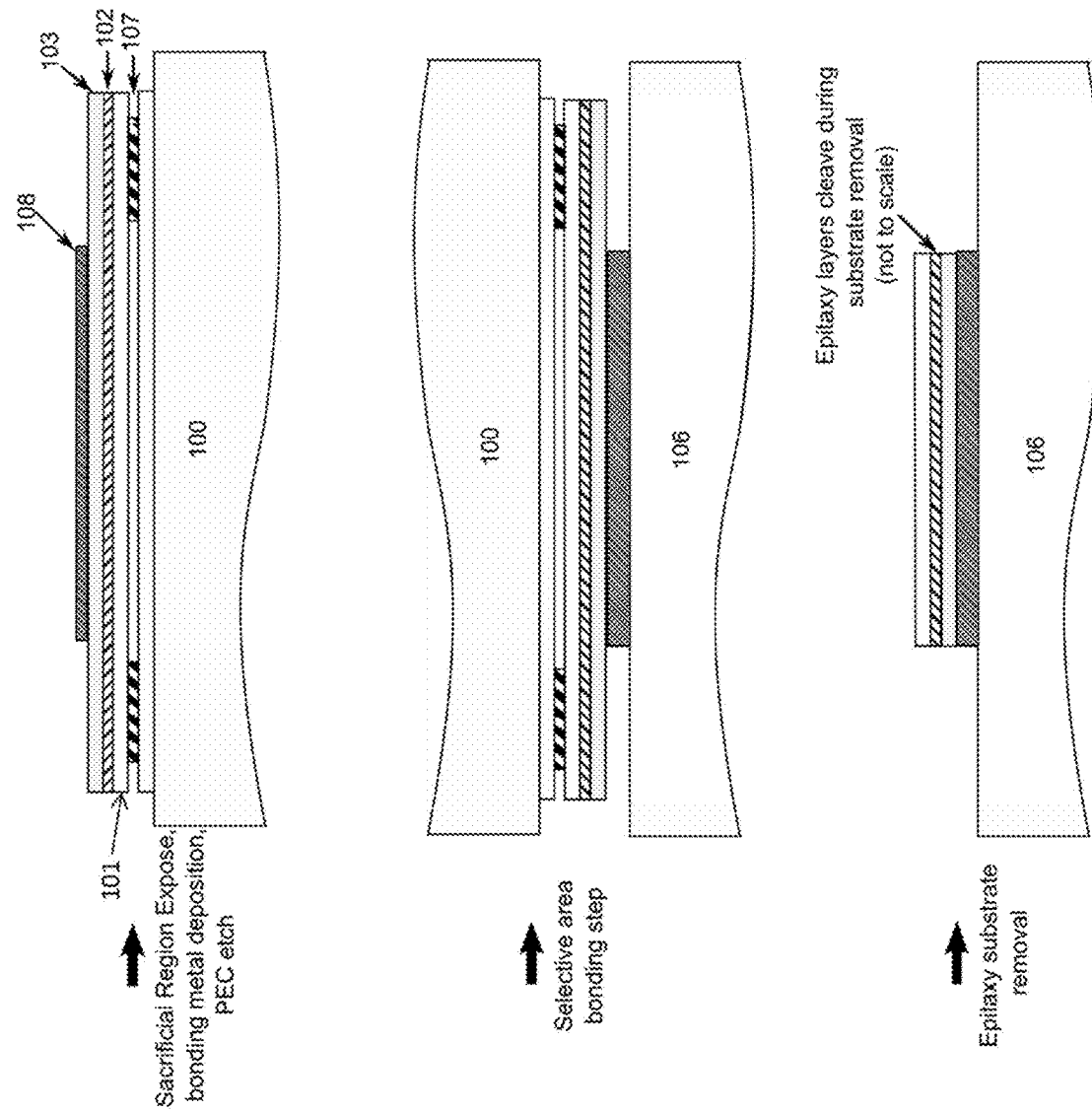

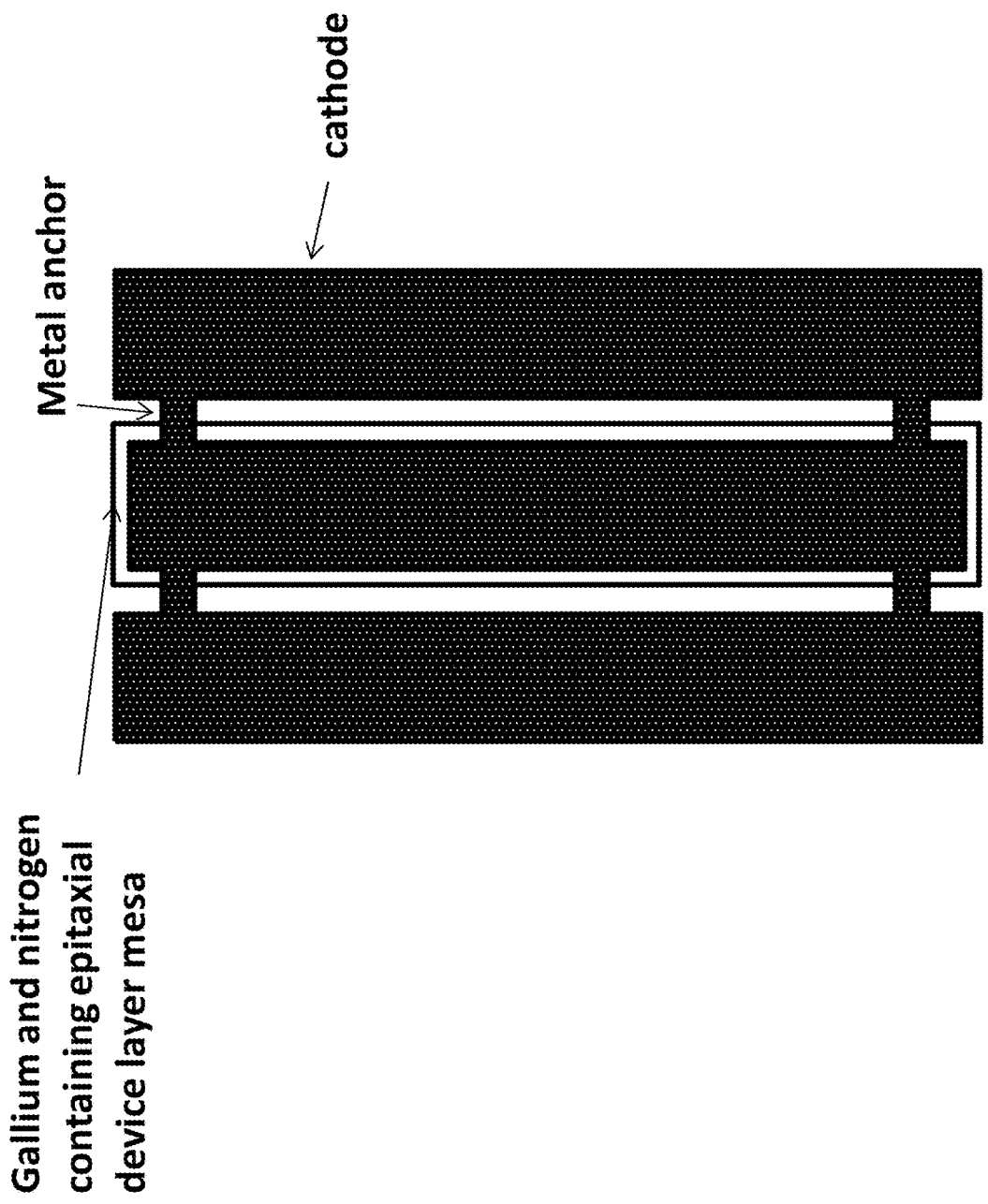
Figure 2G: plan view of transferrable mesa with metal anchors

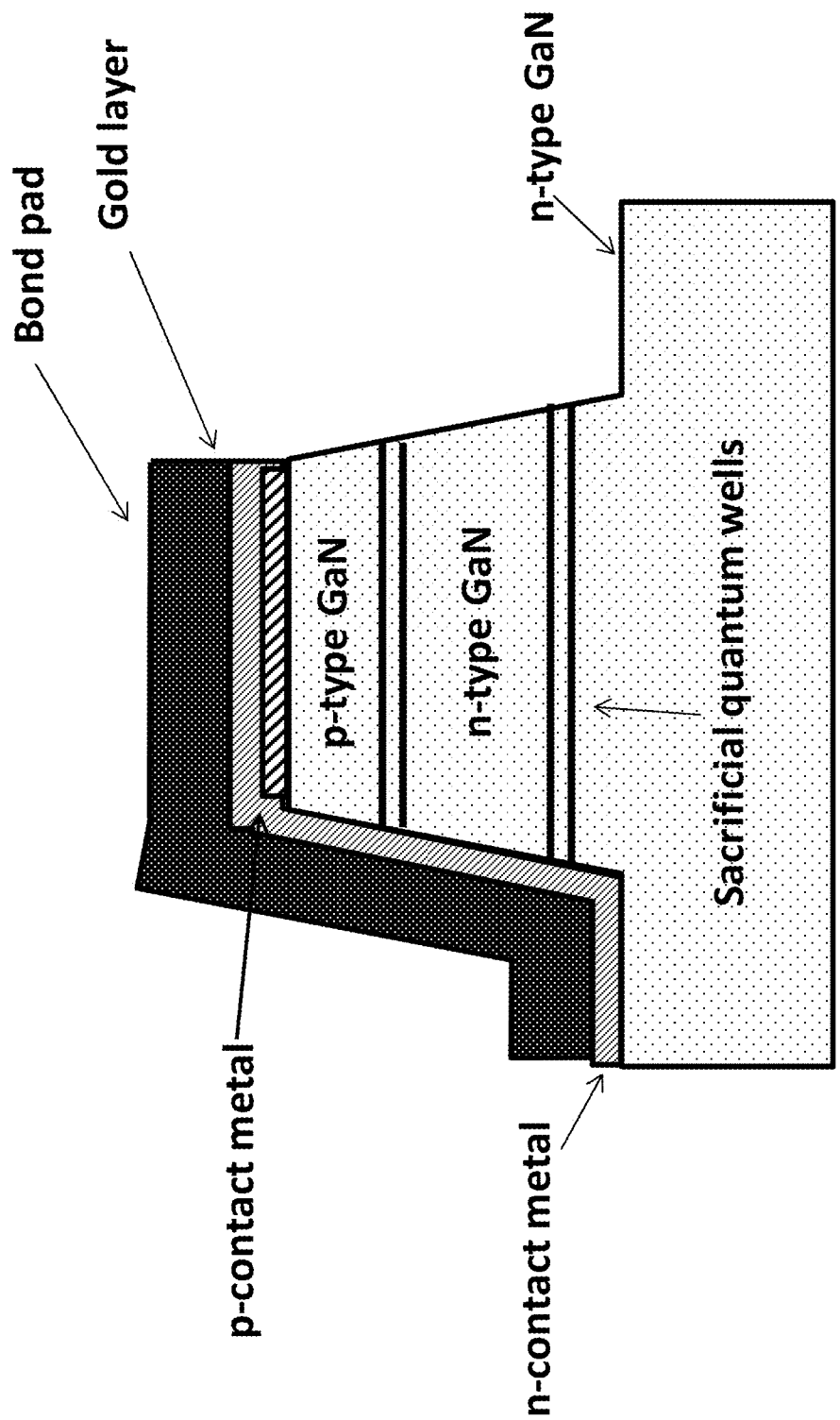
Figure 2H: cross sectional view of metal anchor

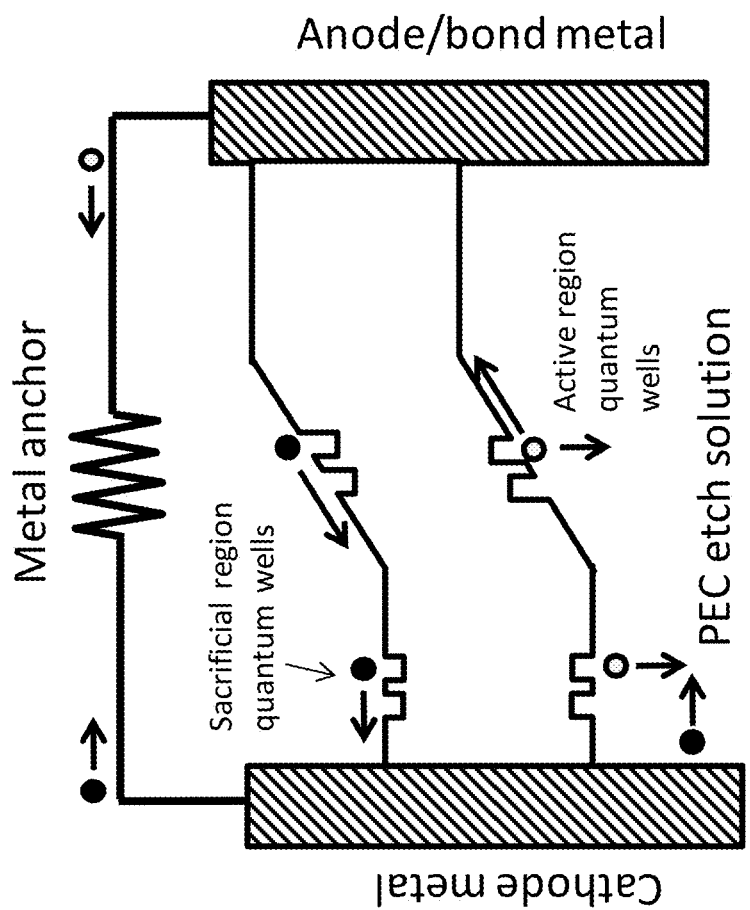
Figure 2I: Schematic of electrical circuit formed during PEC etching with metal anchors.

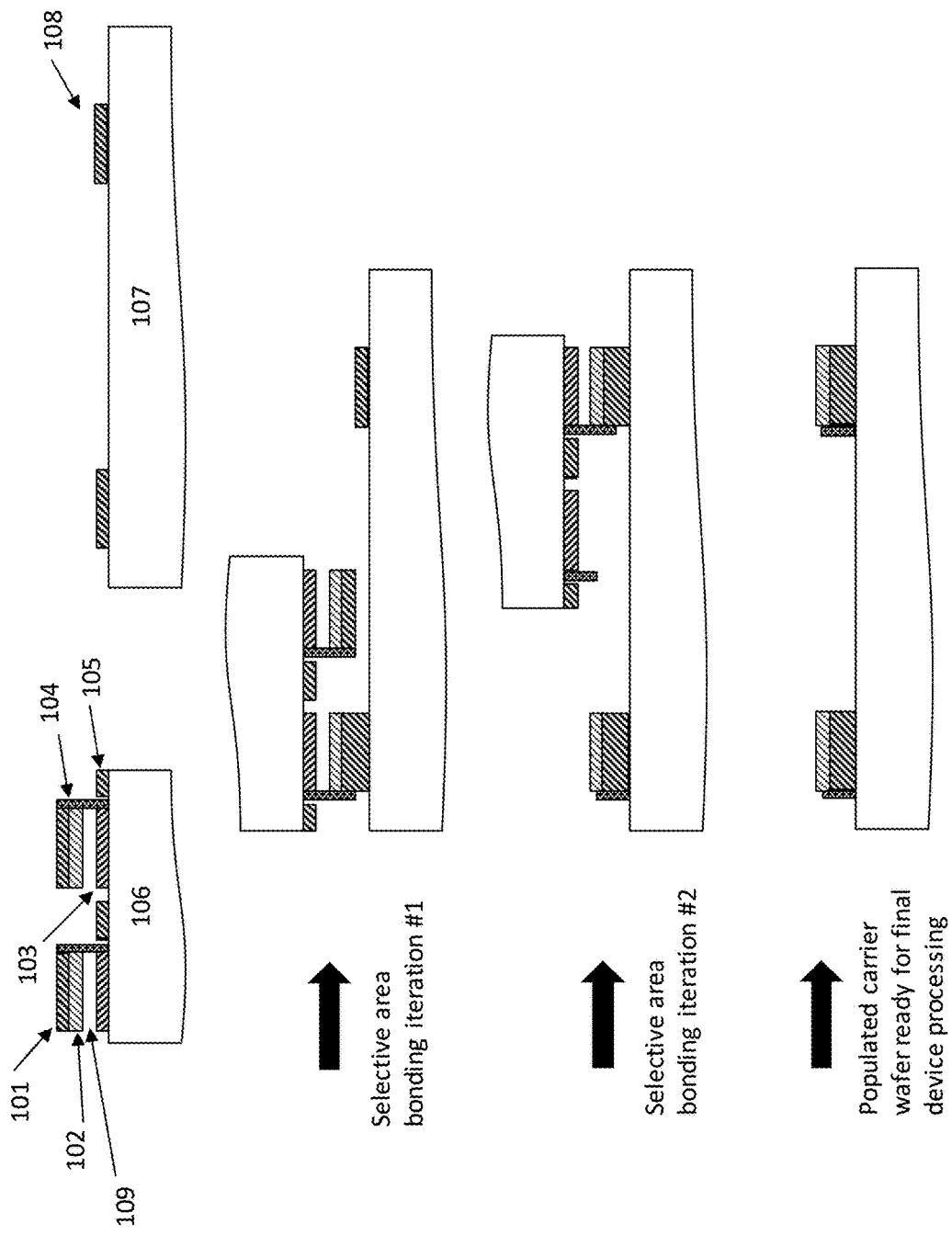
Figure 3A: Side view of die expansion with selective area bonding

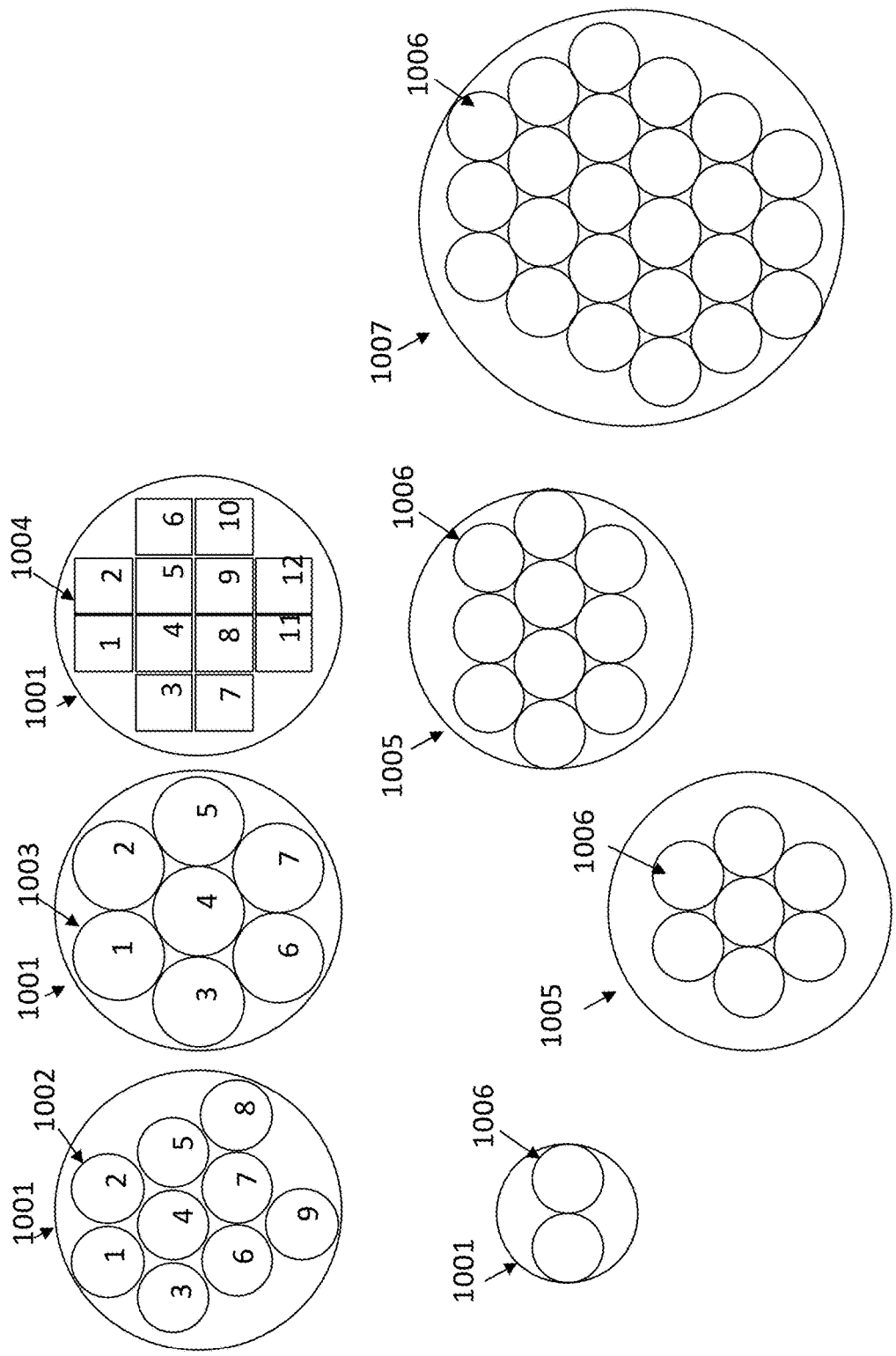
Figure 4A: Transferable regions for various substrate sizes on 100, 200 and 300 mm carrier wafers

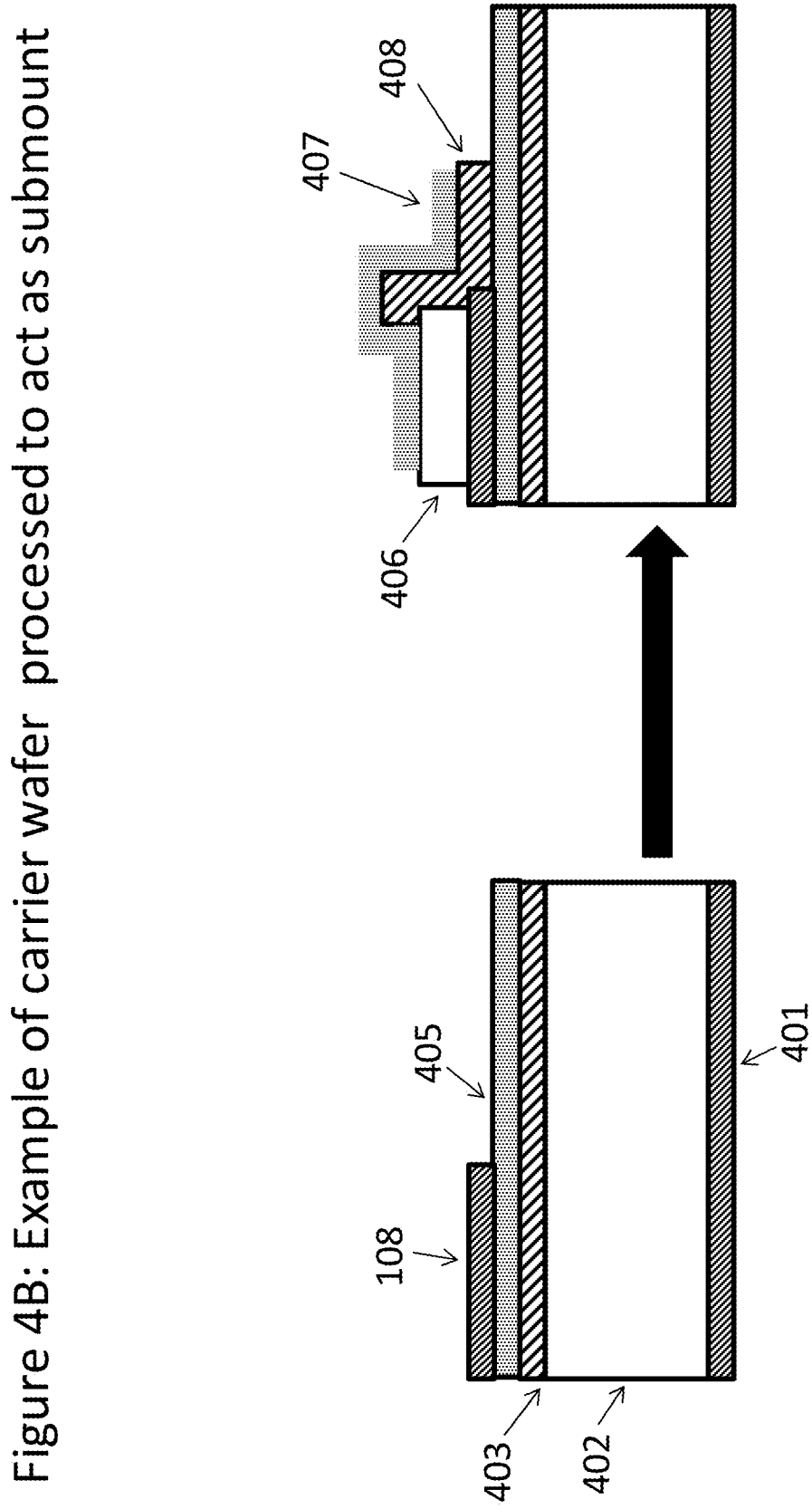
Figure 4B: Example of carrier wafer processed to act as submount

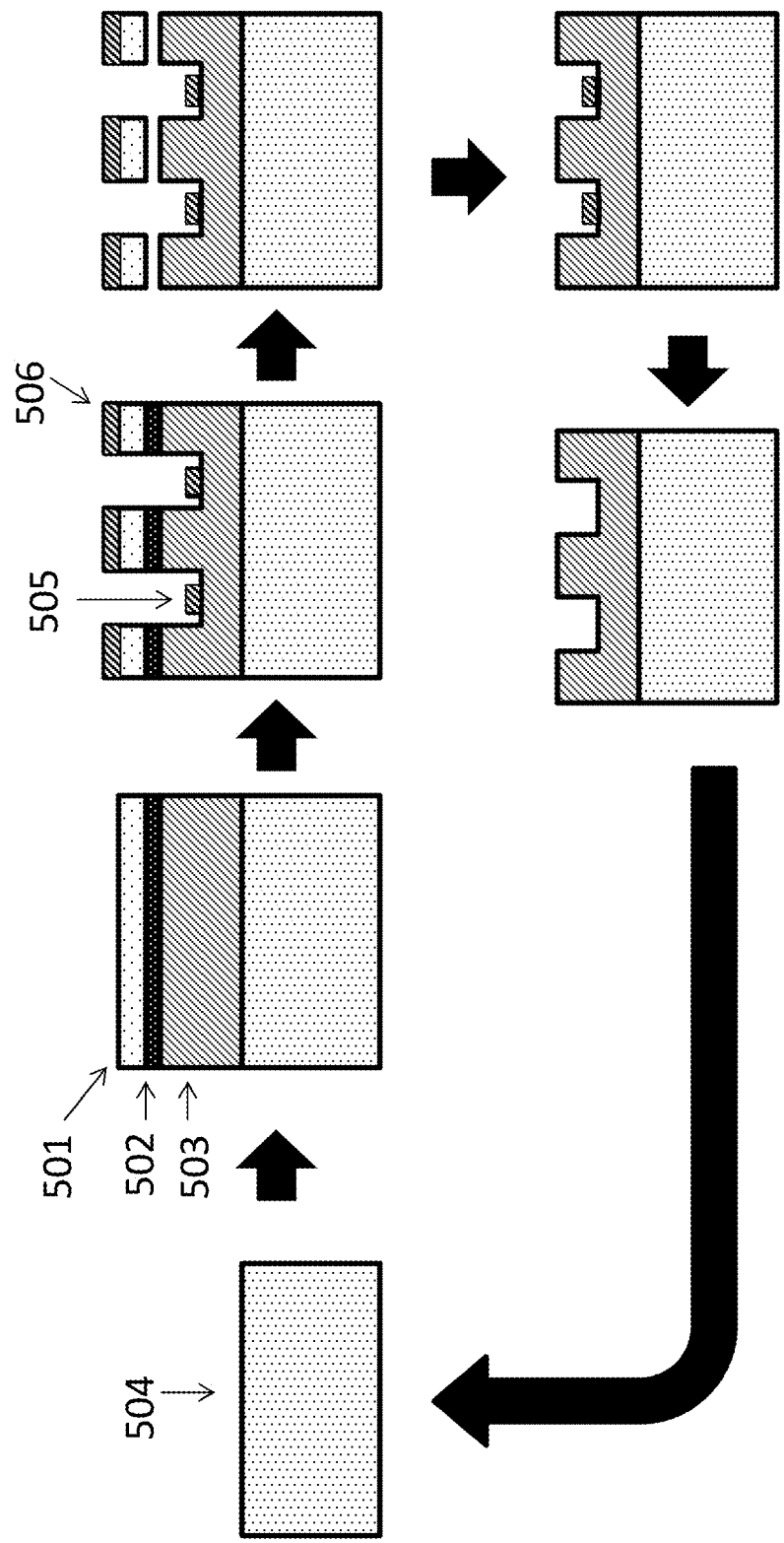
Figure 5. Example process flow of substrate reuse

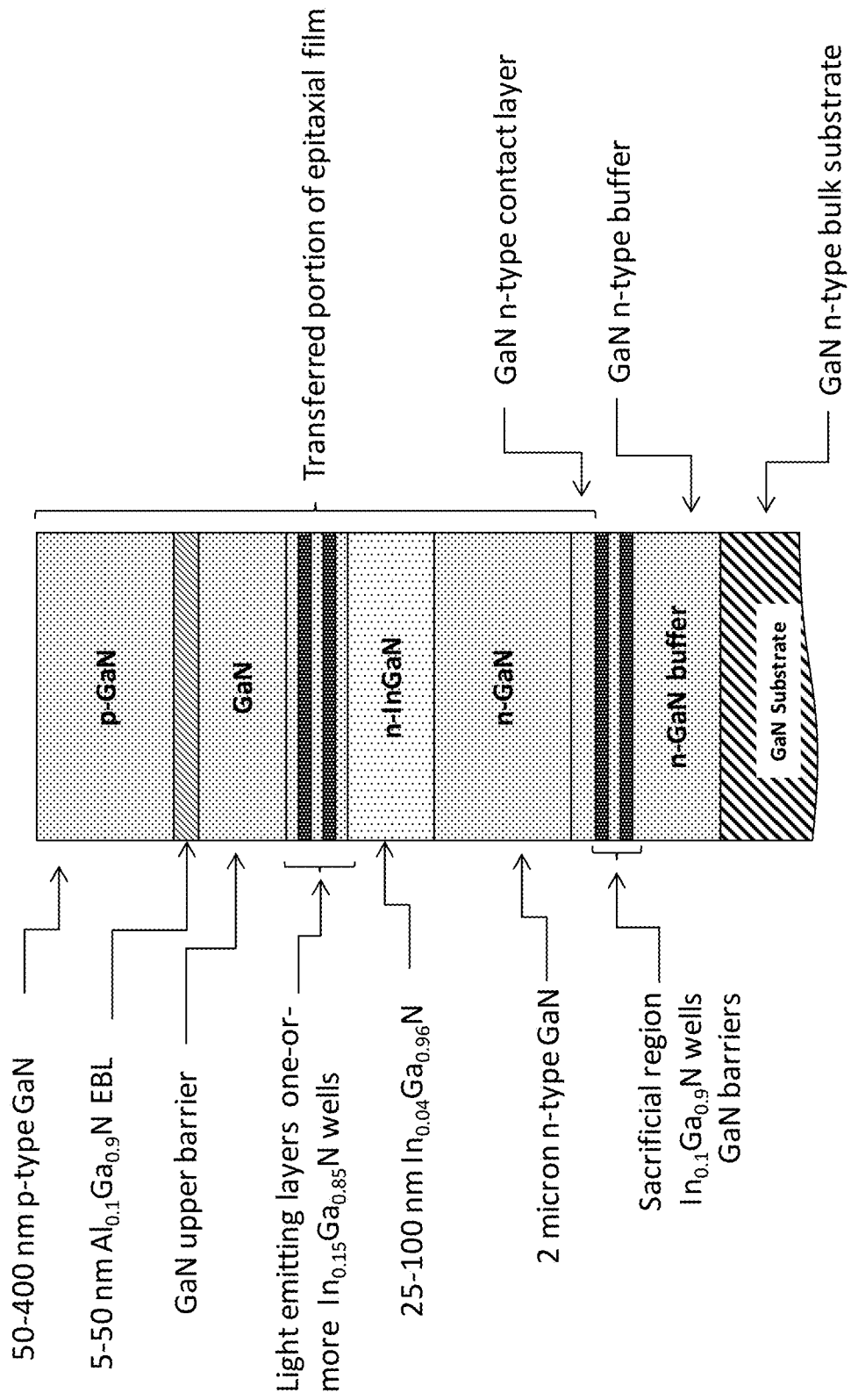
Figure 6A: schematic of epitaxial structure of LED

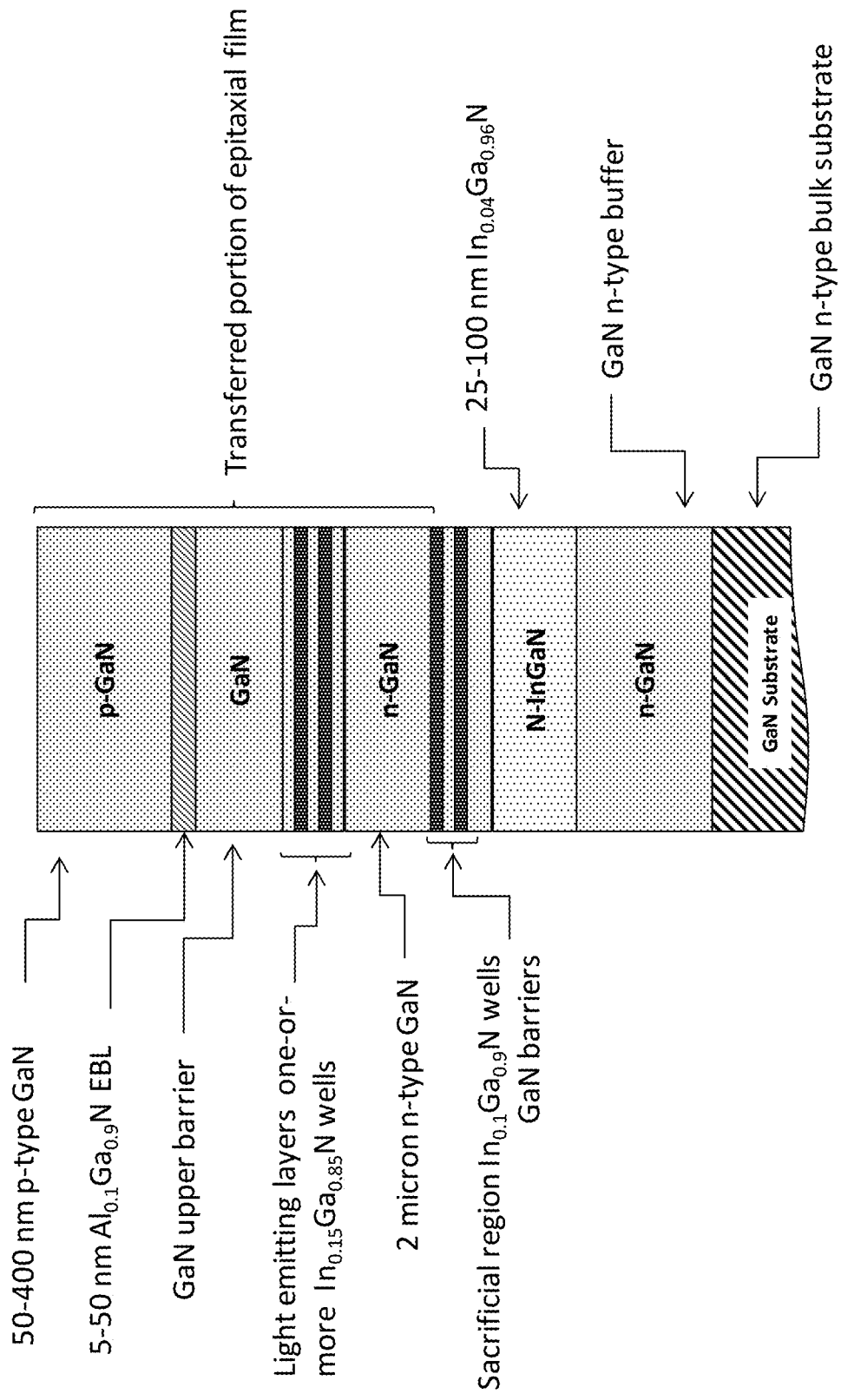
Figure 6B: schematic of epitaxial structure of LED

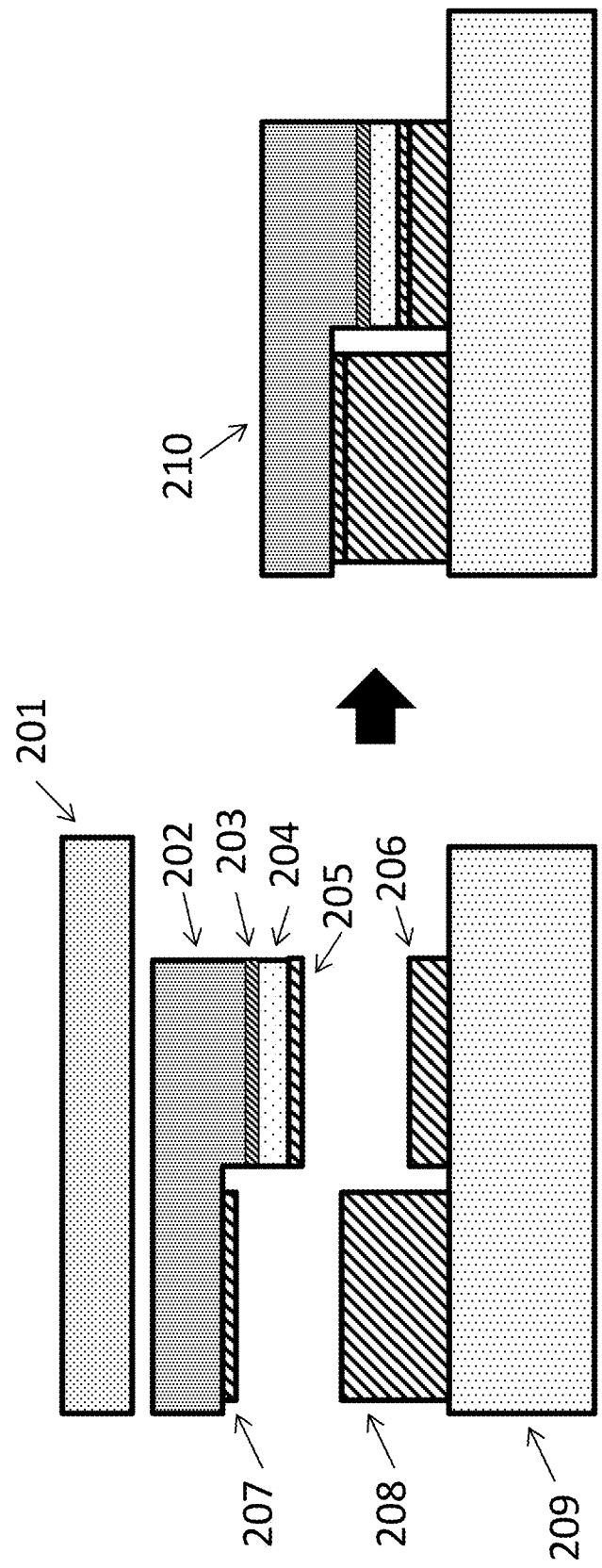
Figure 6C: bonding of LED wafer

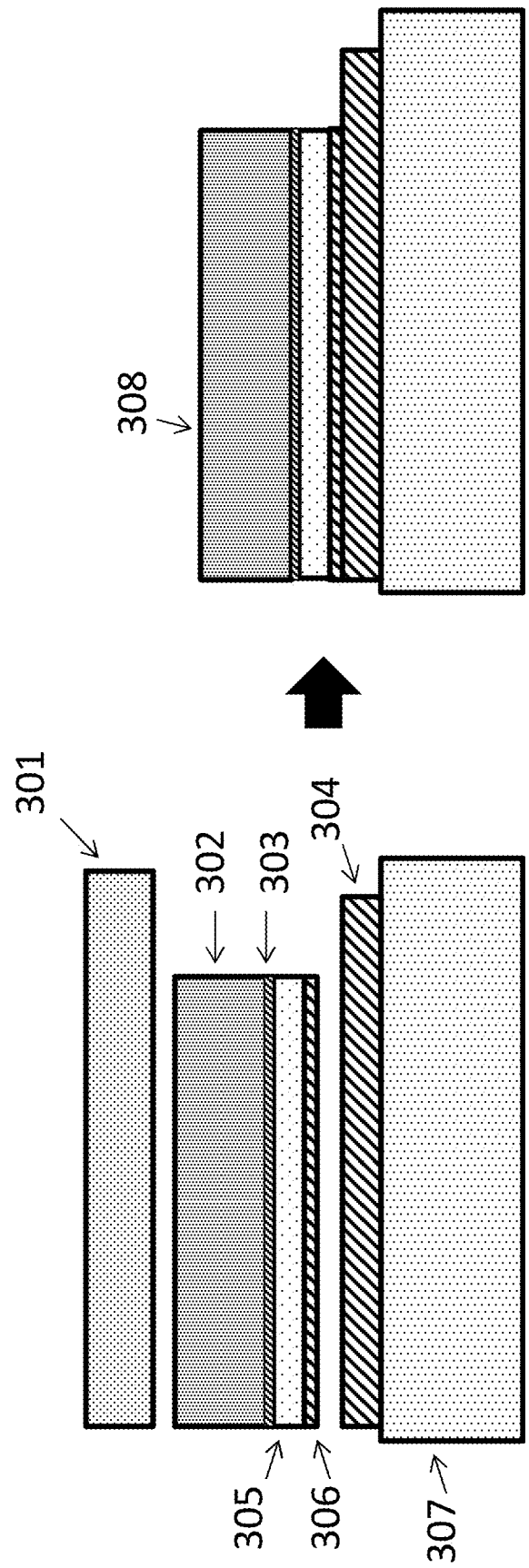
Figure 6D: bonding of LED wafer

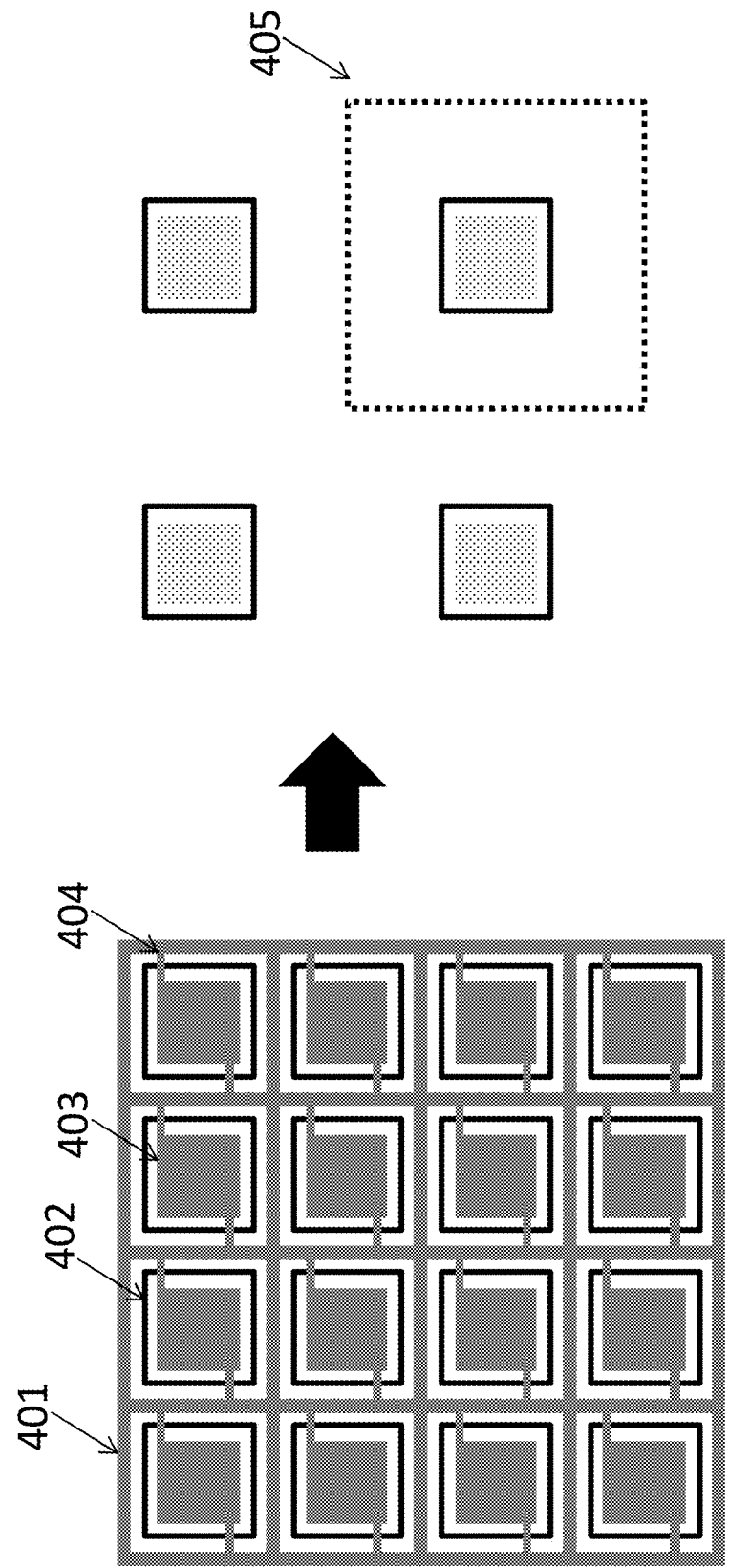
Figure 6E: die expansion of LEDs

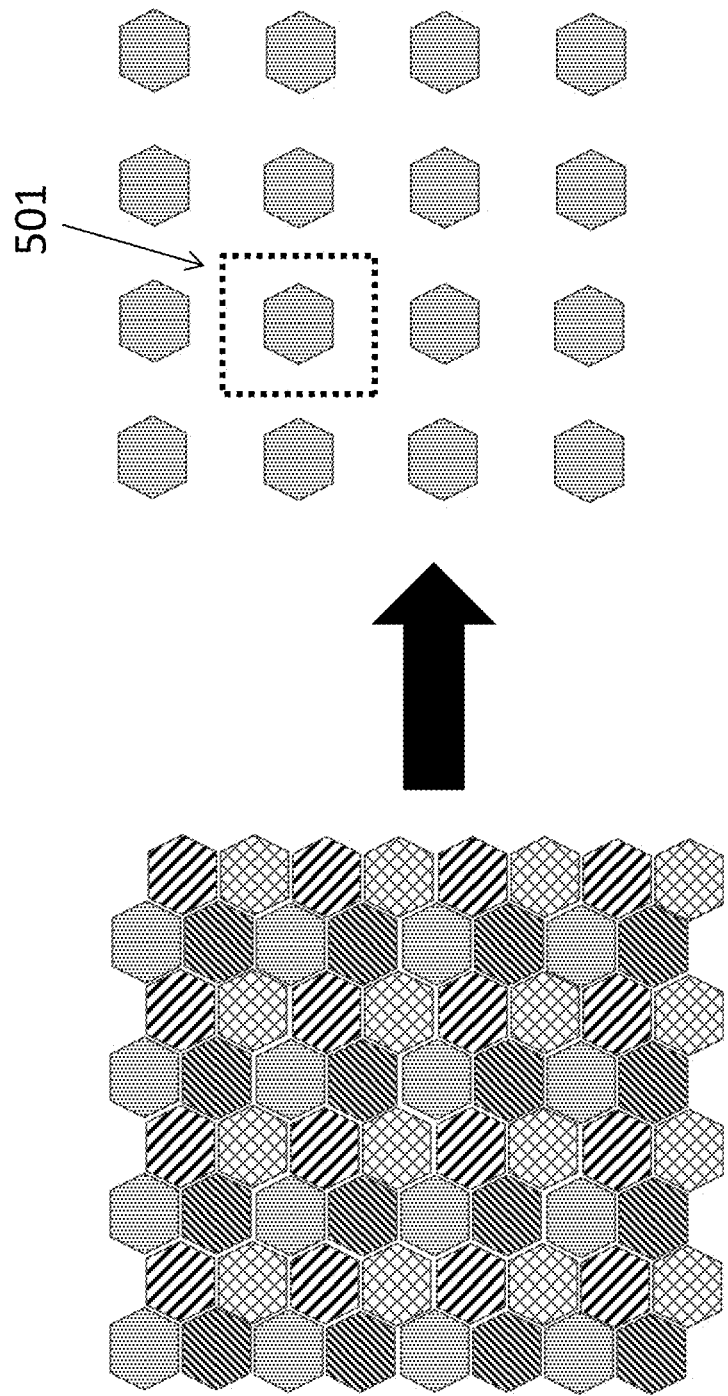
Figure 6F: die expansion of LEDs with non-rectangular shape

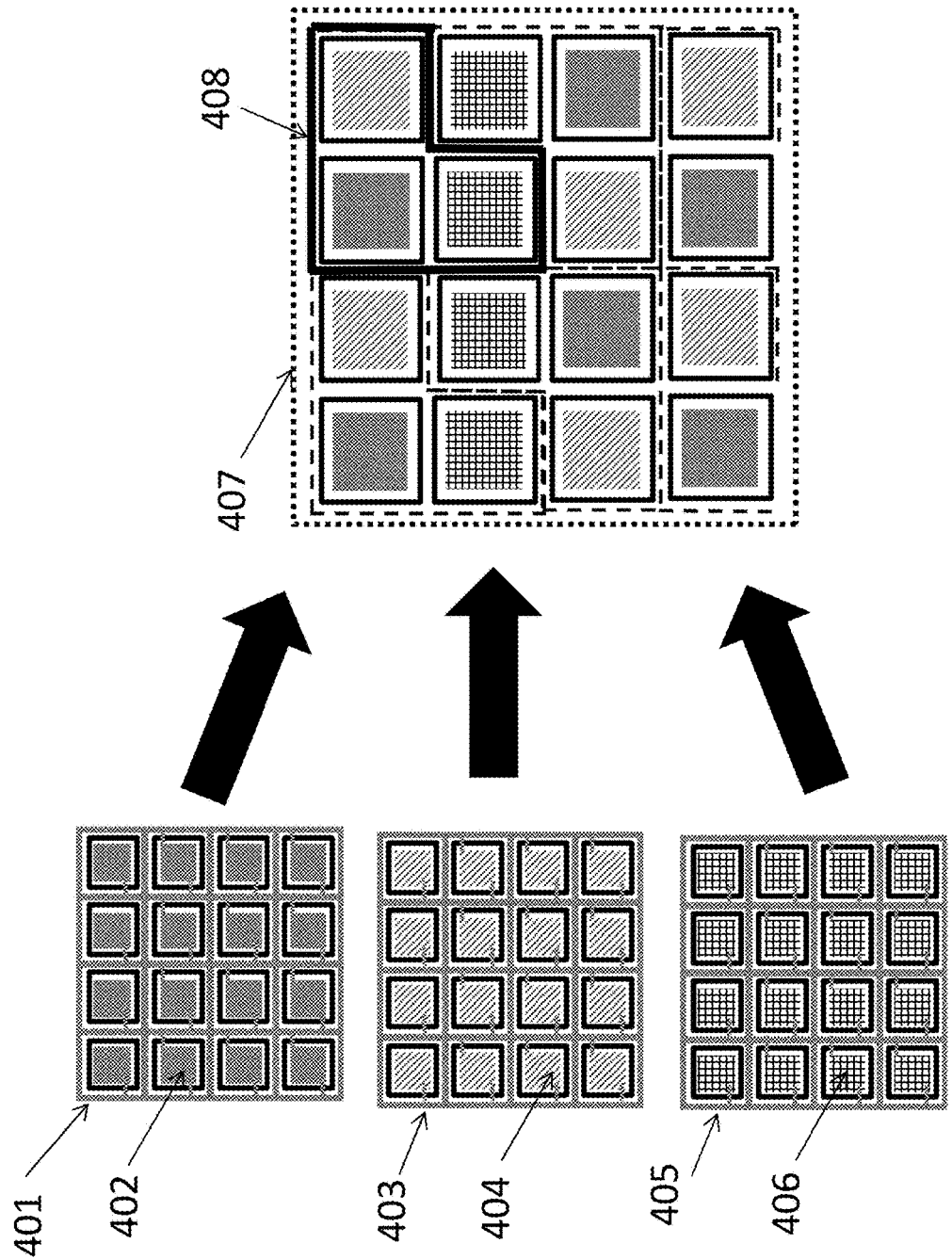

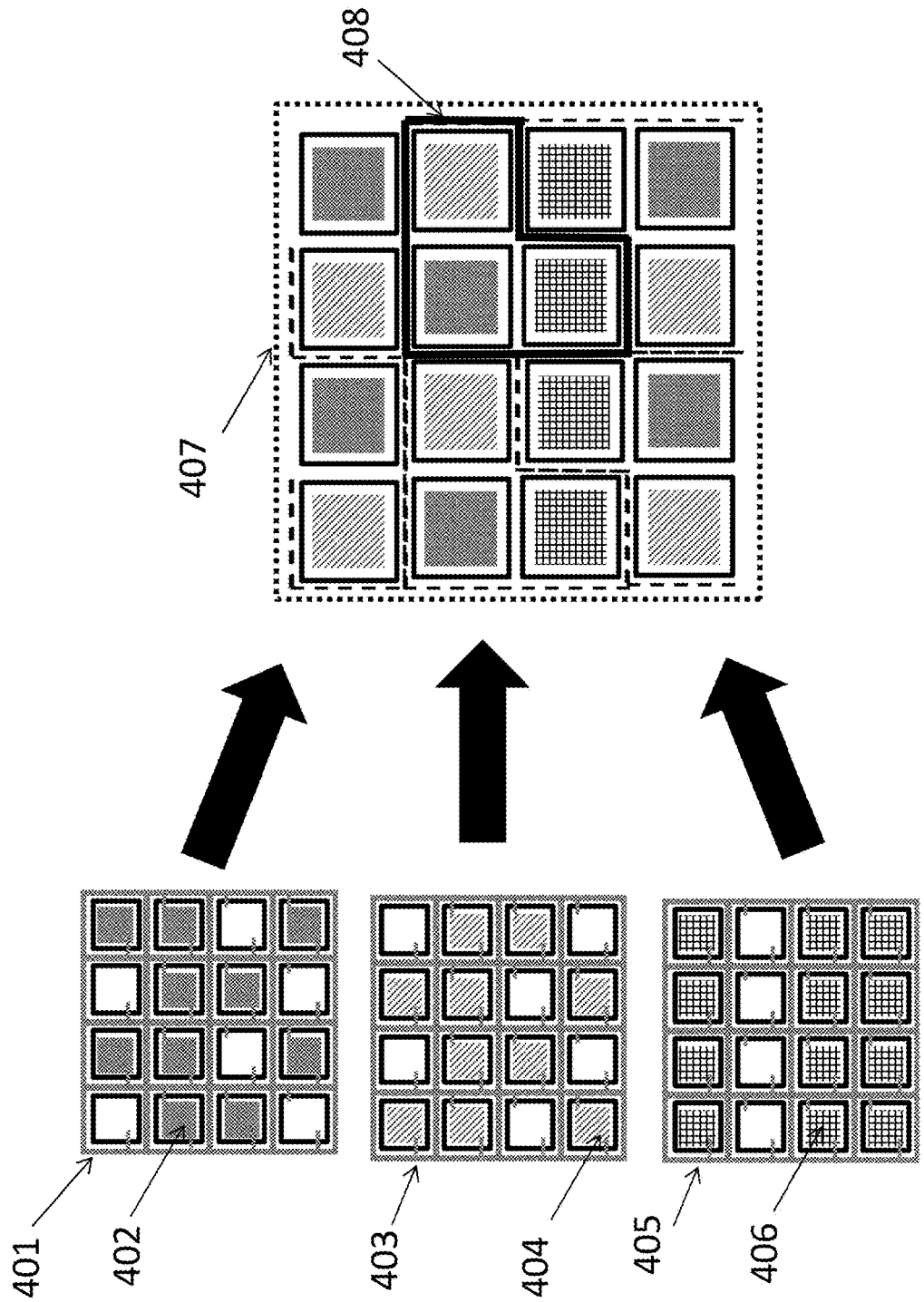

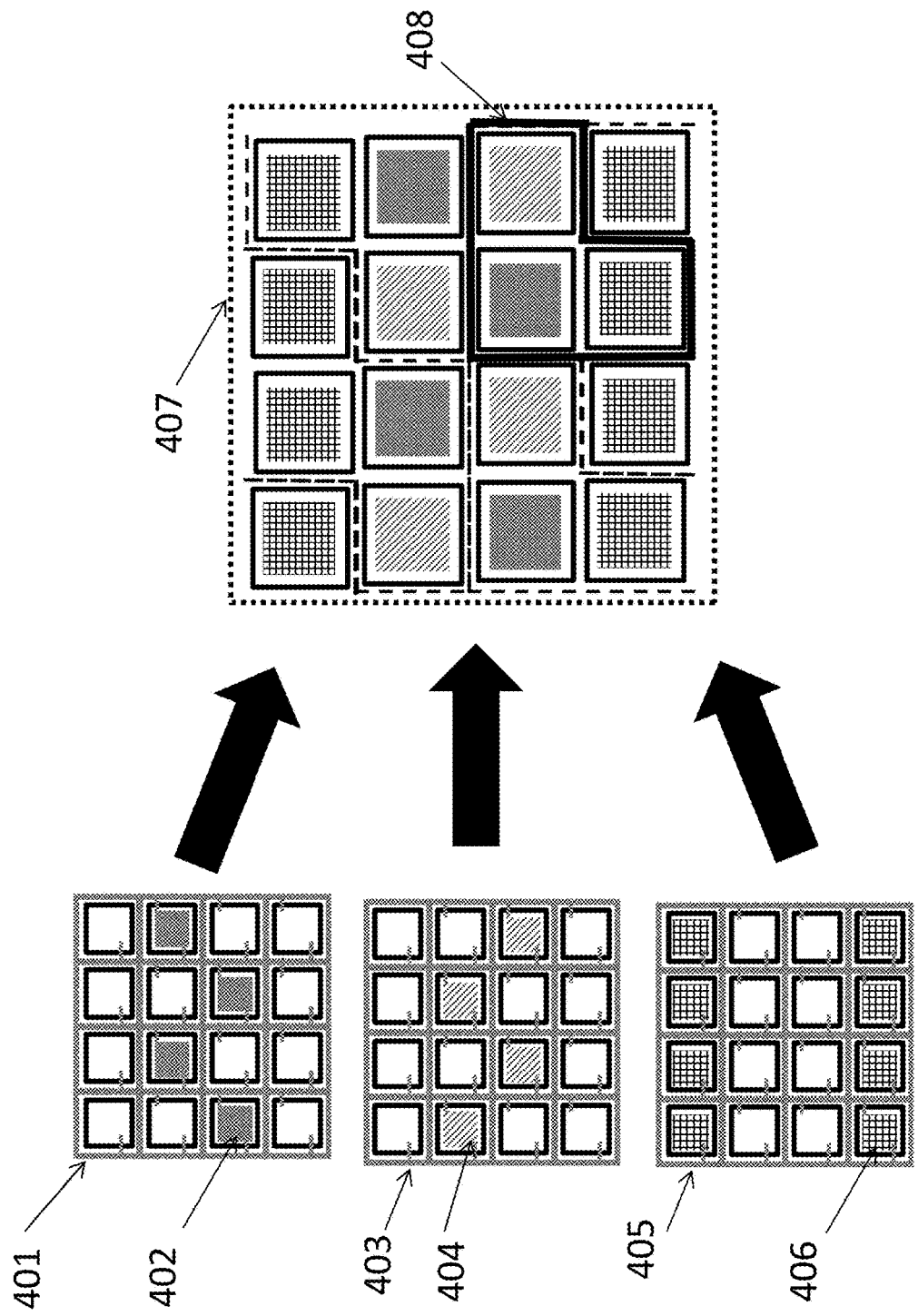

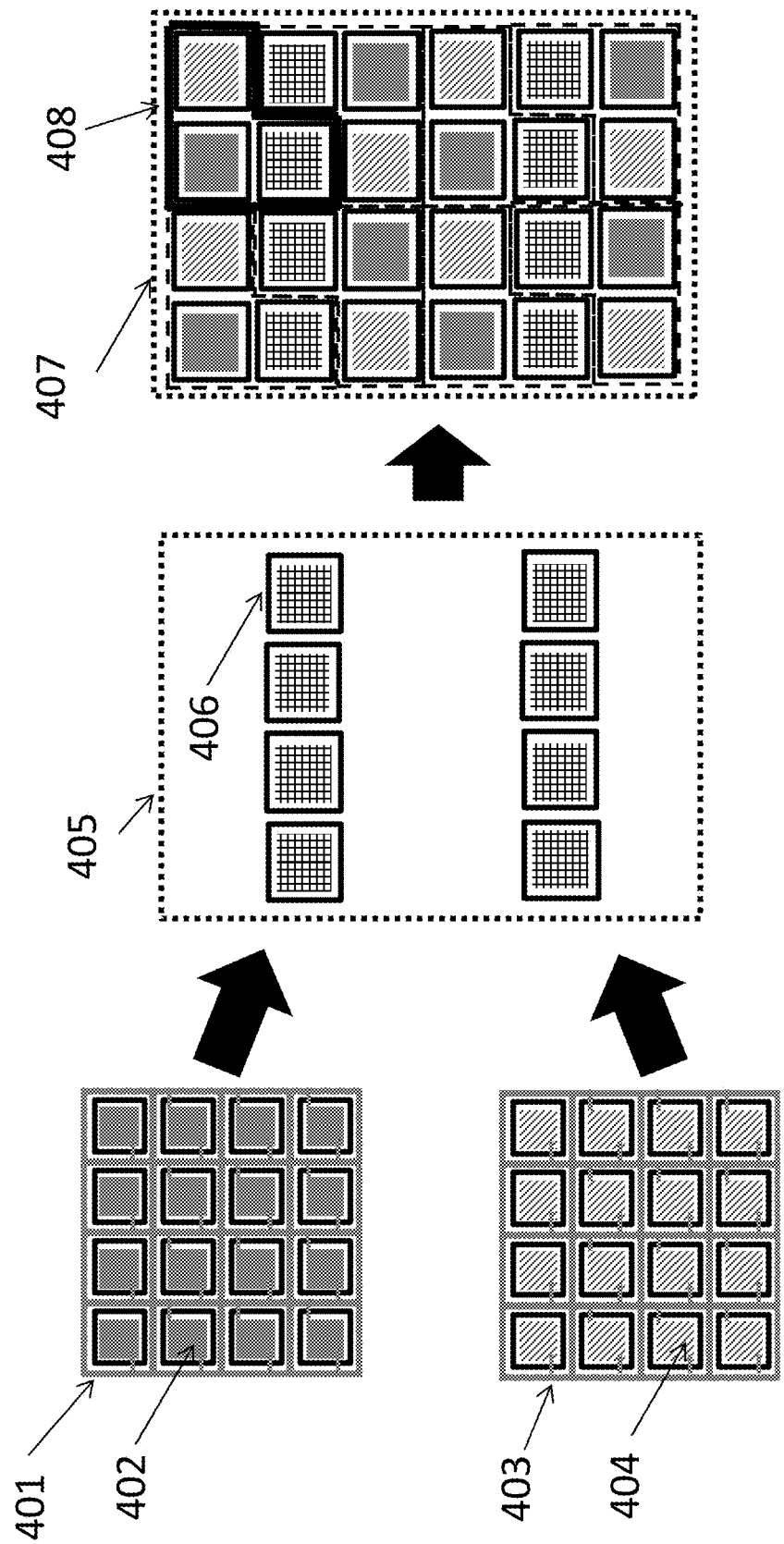
Figure 6J: die expansion of LEDs

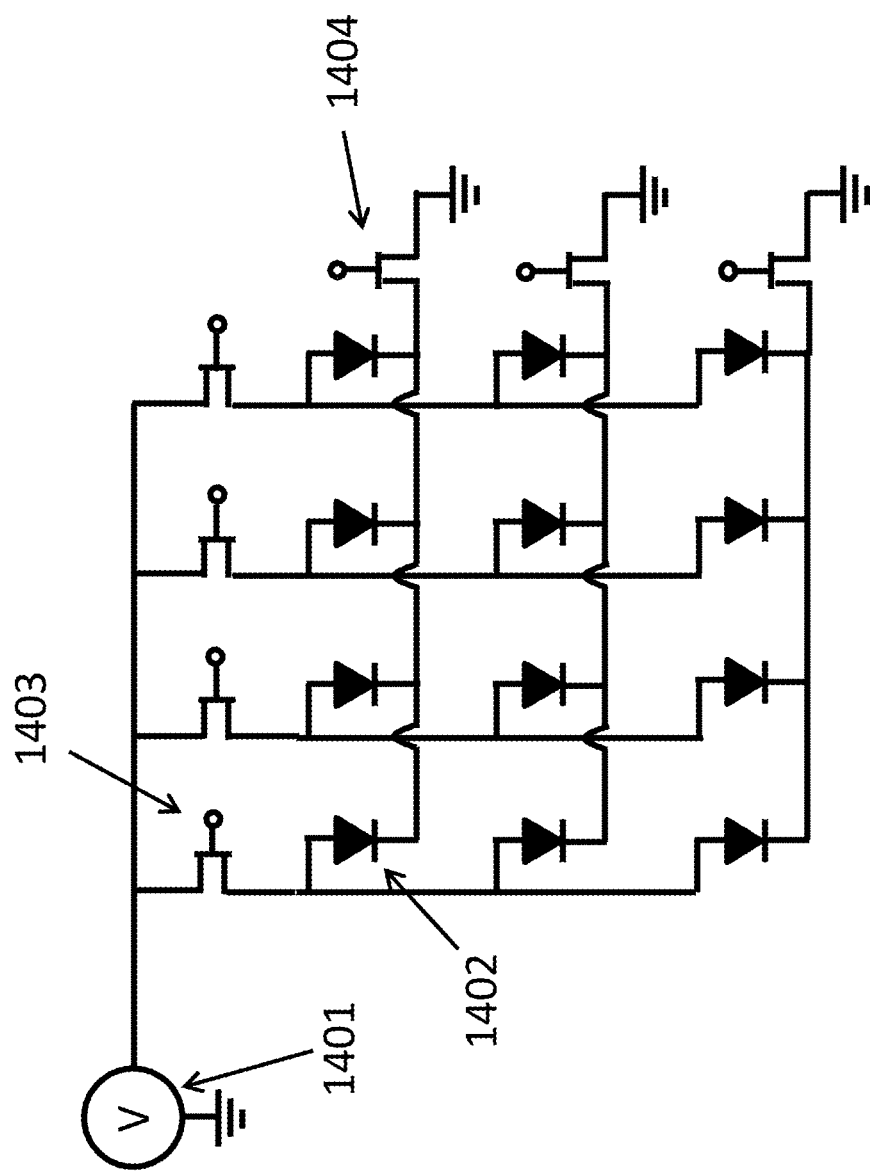
Figure 6K: Example of multiplexing in a transferred micro LED display array

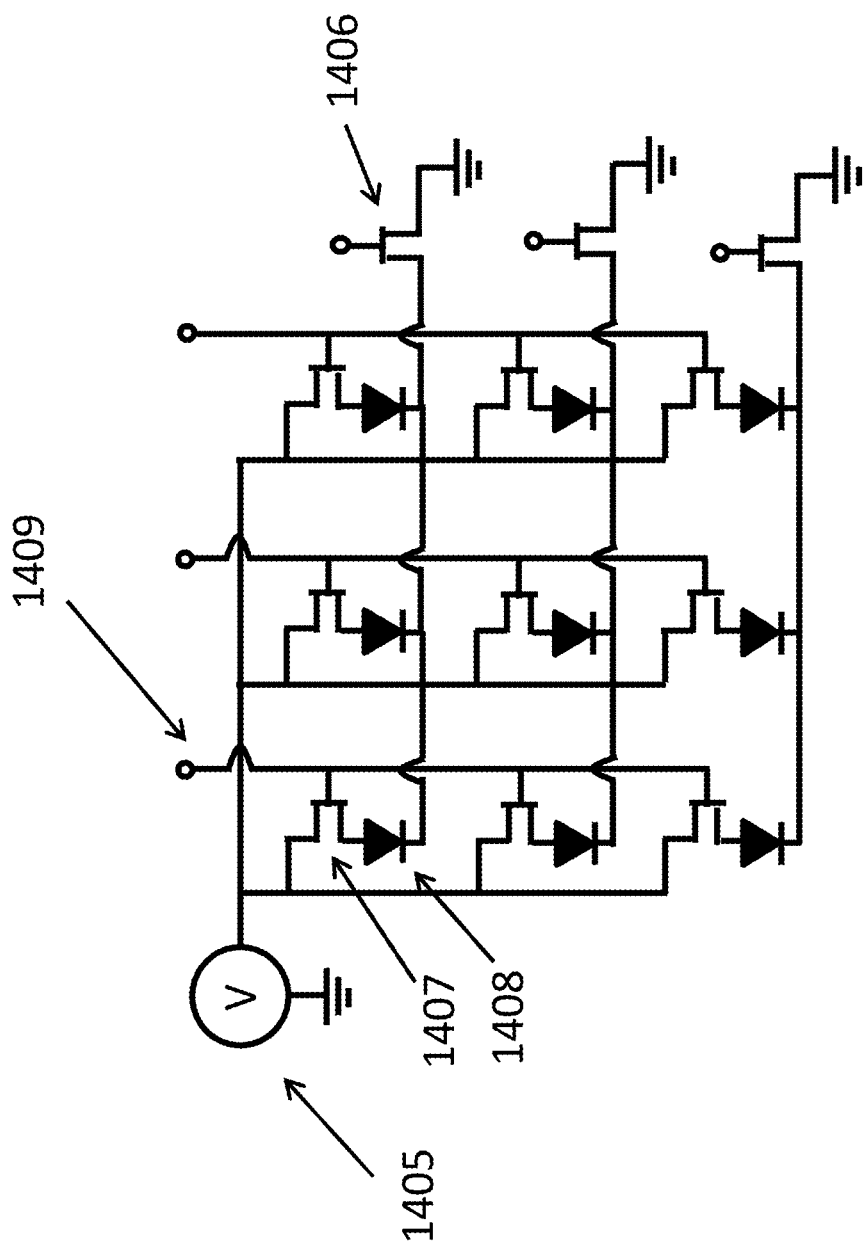
Figure 6L: Example of multiplexing in a transferred micro LED display array

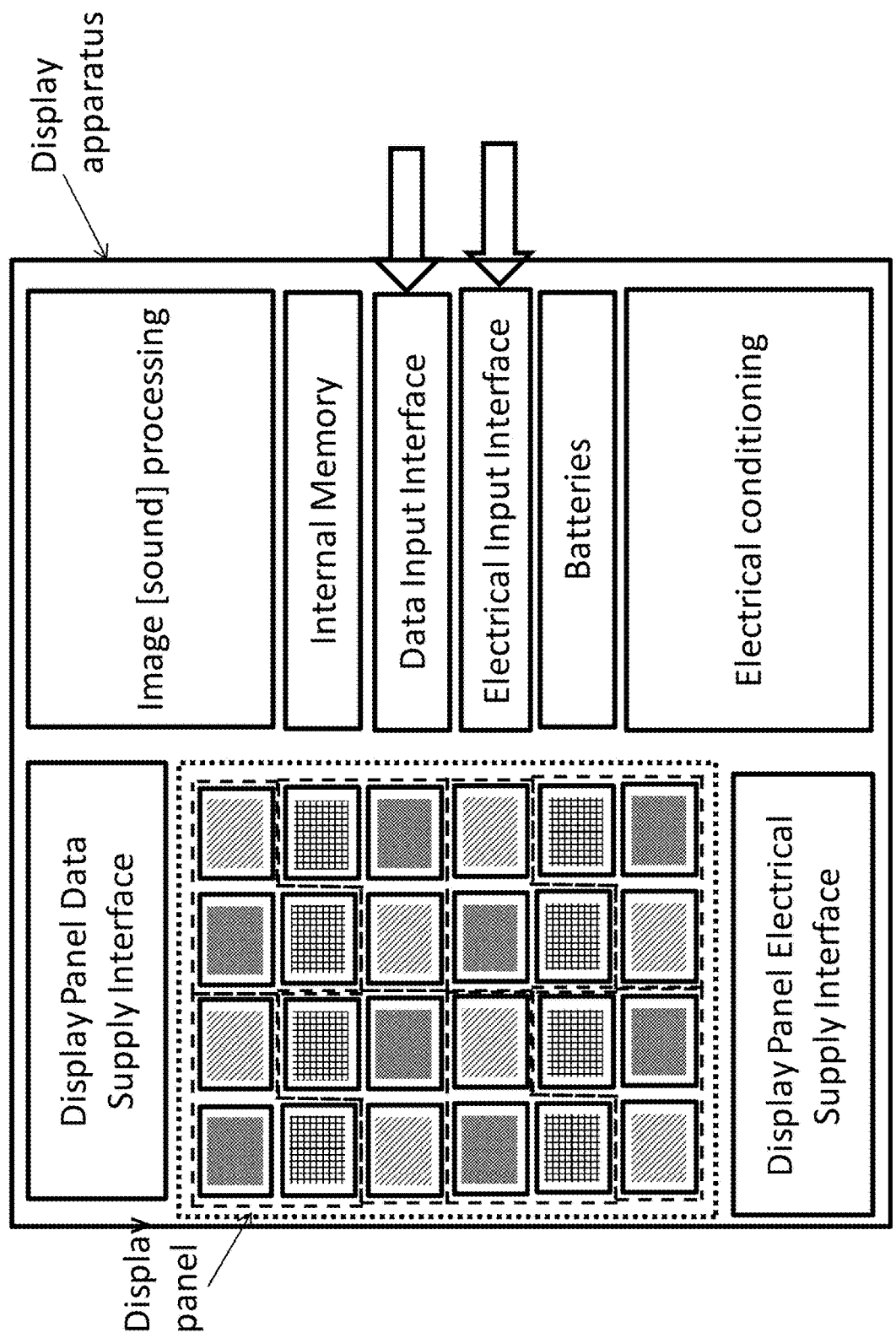
Figure 6M: Display apparatus

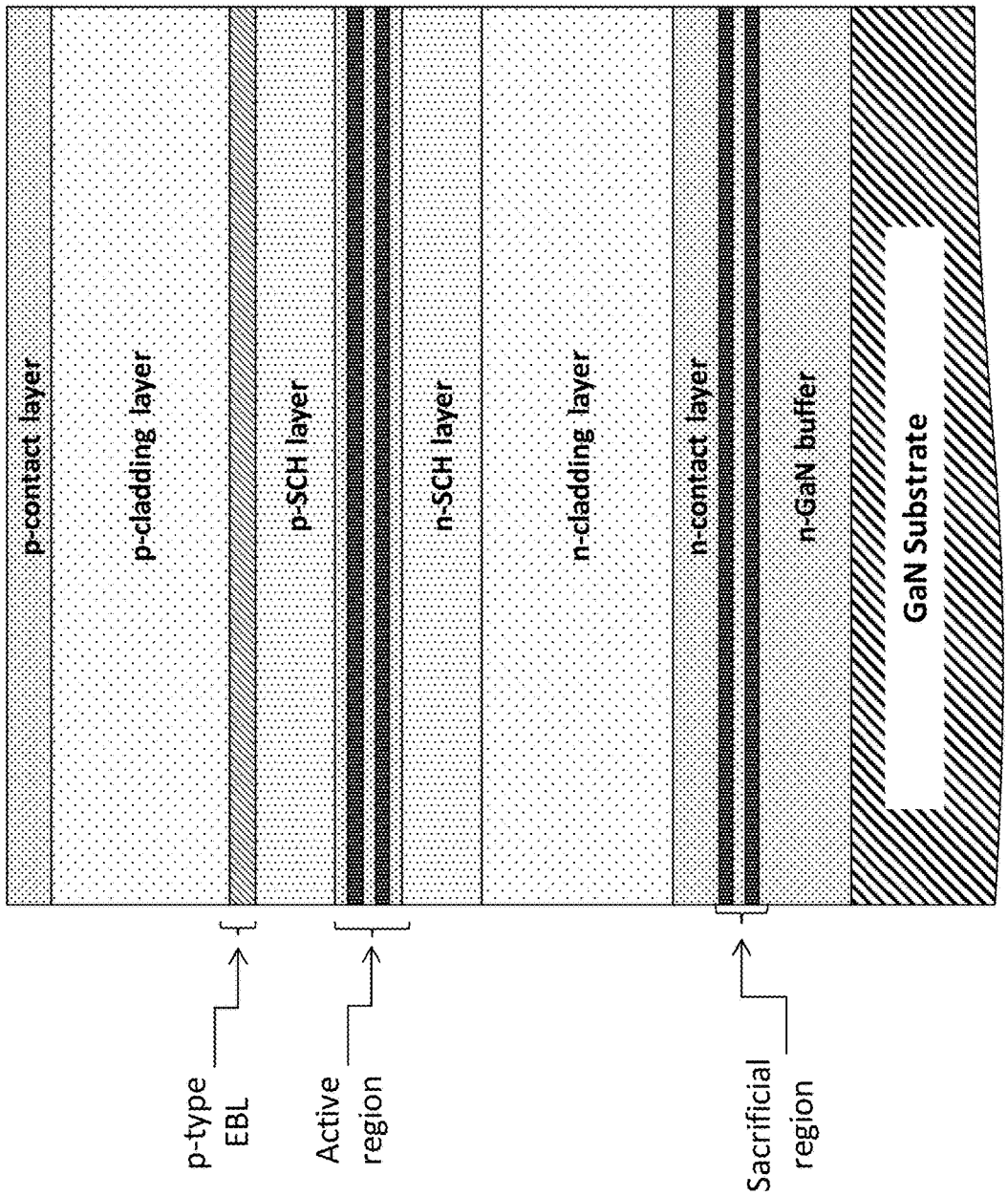
Figure 7A: Example of LD epitaxial structure

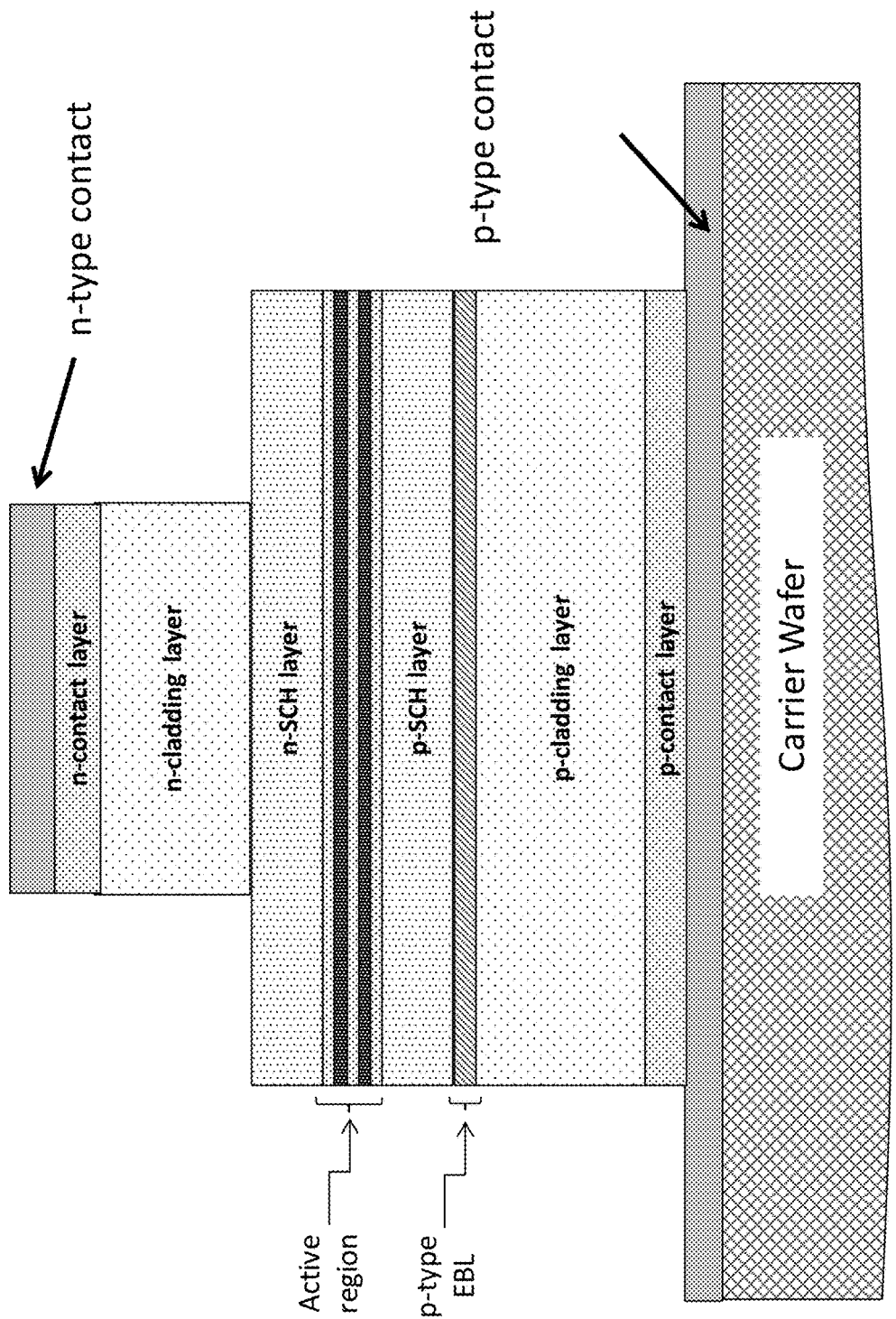
Figure 7B: Example of LD device structure formed on carrier wafer from epitaxial structure in Figure 7A

Figure 7C: Die Expanded Laser Diode
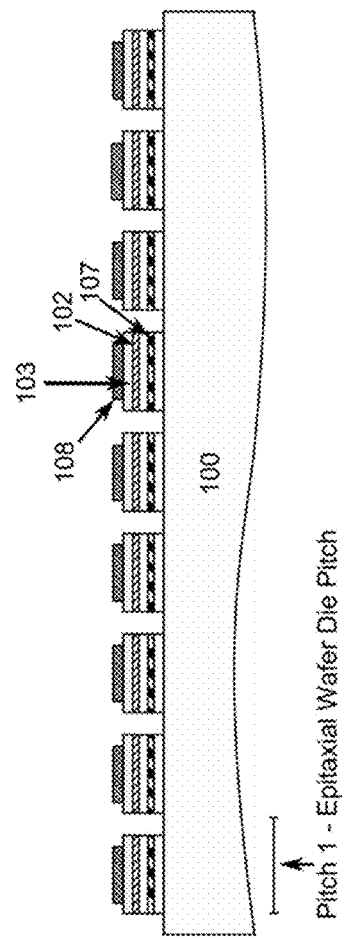
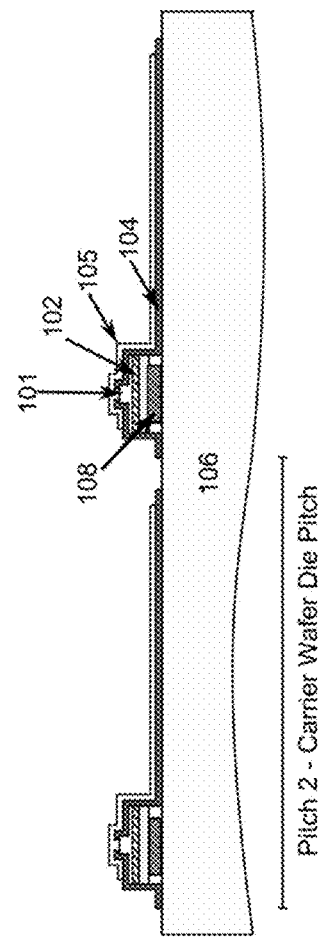

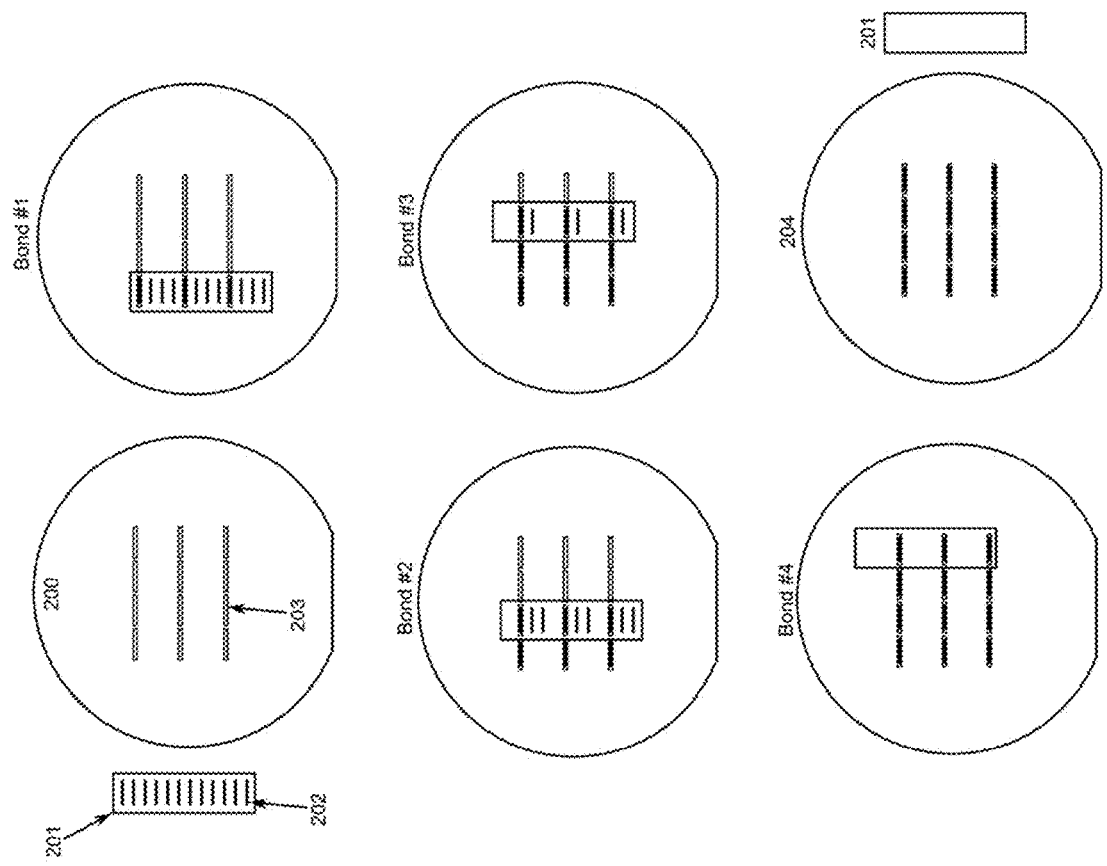
Figure 7D: Top view of die expansion for LD devices

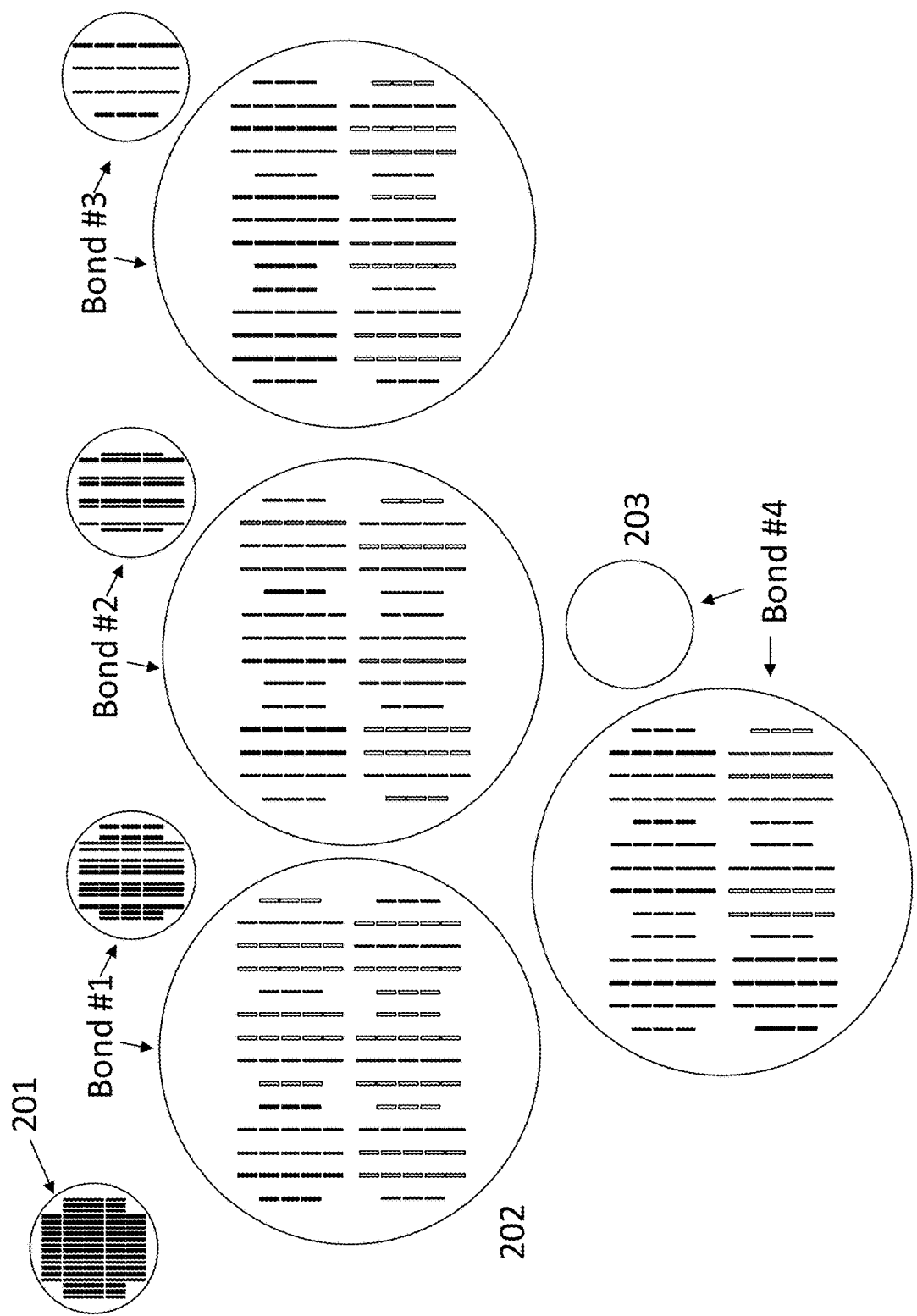
Figure 7E: Top view of die expansion for LD devices

Figure 8A: Material properties of GaN, SiC, and Si at 300K

| Properties* | GaN | Si | SiC |
|---|---|---|---|
| $E_g$ (eV) | 3.4 | 1.12 | 3.2 |
| $E_{br}$ (MV/cm) | 3.3 | 0.3 | 3.5 |
| $V_s$ (x $10^7$ cm/s) | 2.5 | 1.0 | 2.0 |
| $\mu$ (cm$^2$/Vs) | 990 - 2000 | 1500 | 650 |

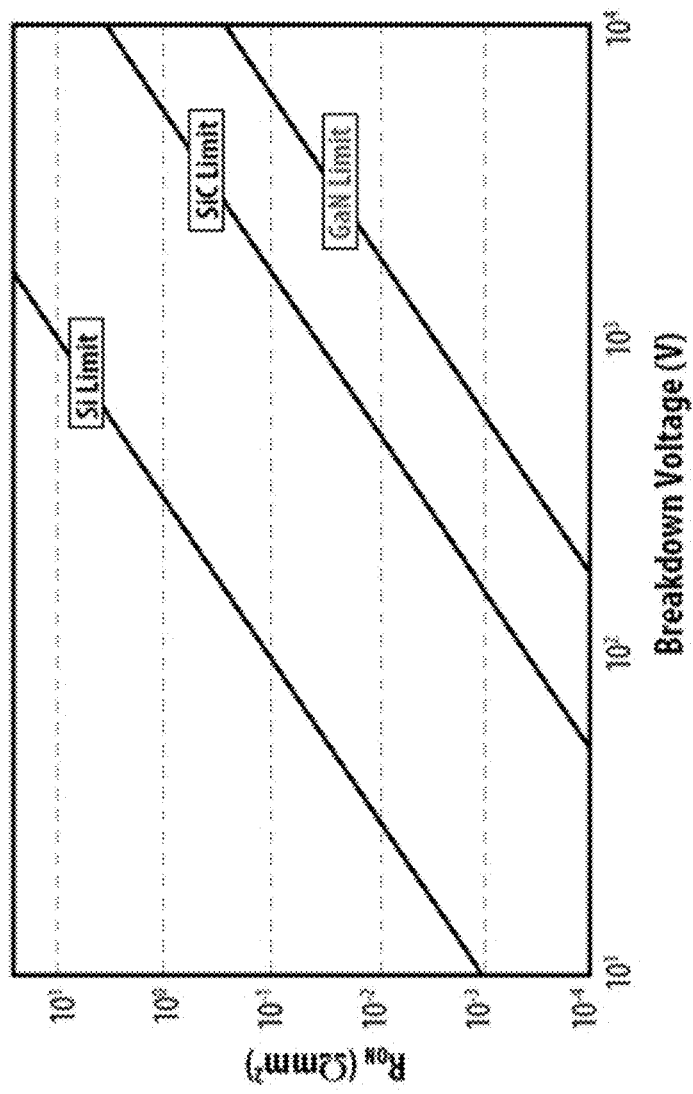
Figure 8B: Theoretical on-resistance vs blocking voltage for GaN, SiC, and Si

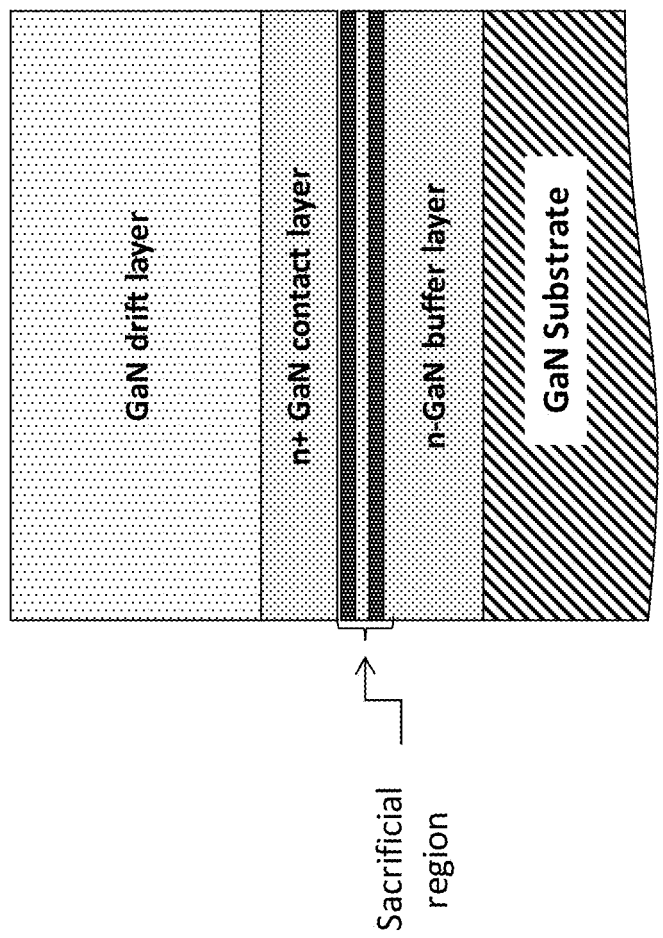
Figure. 9A: Example of an epitaxial stack

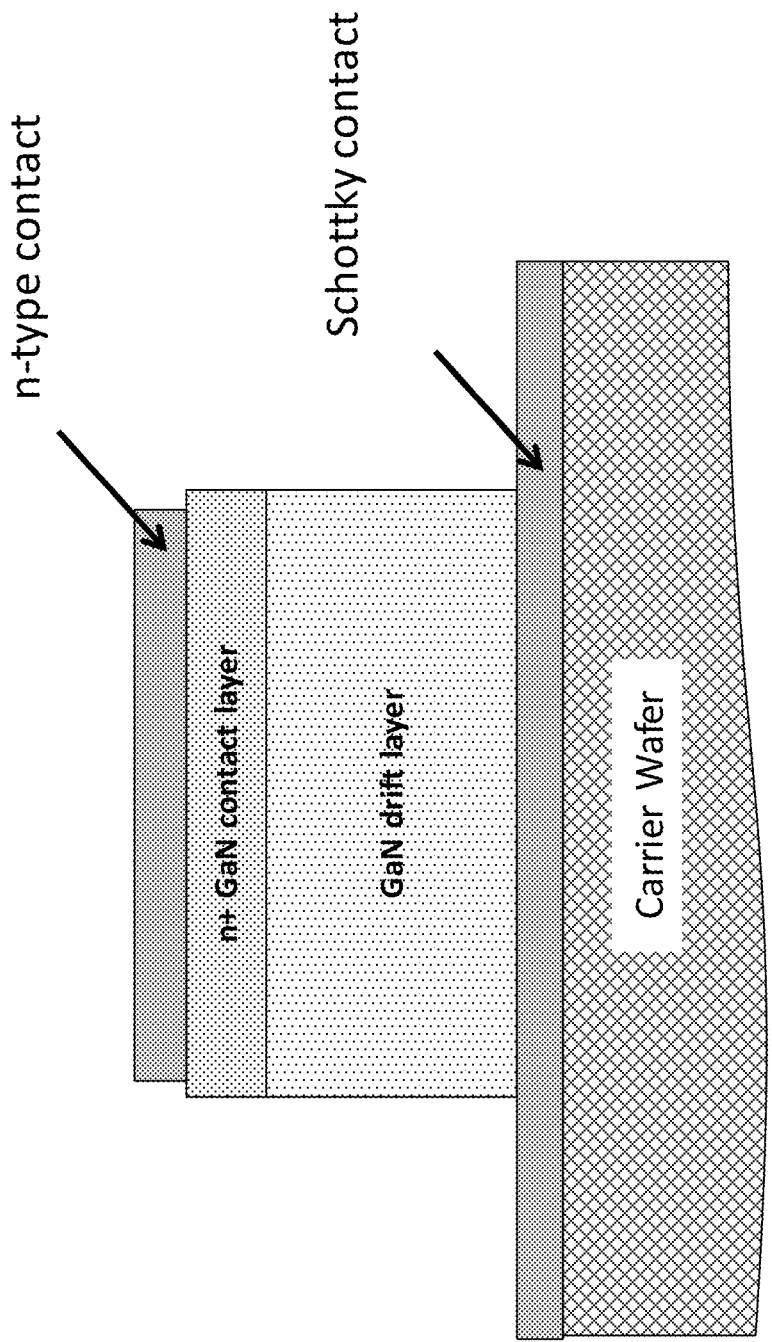
Figure. 9B: Vertical Schottky barrier diode device

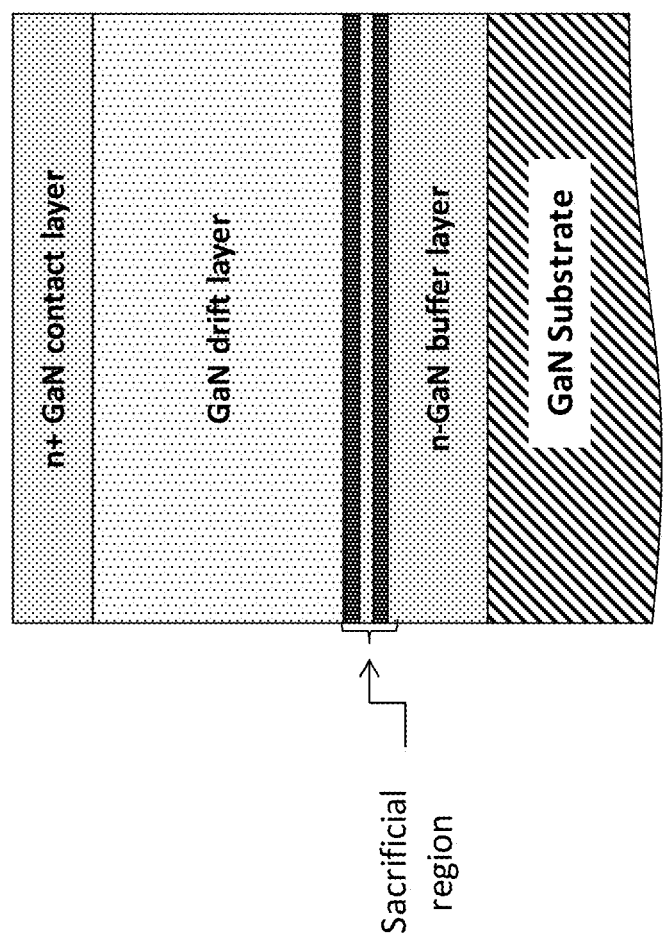
Figure. 9C: Example of an epitaxial stack

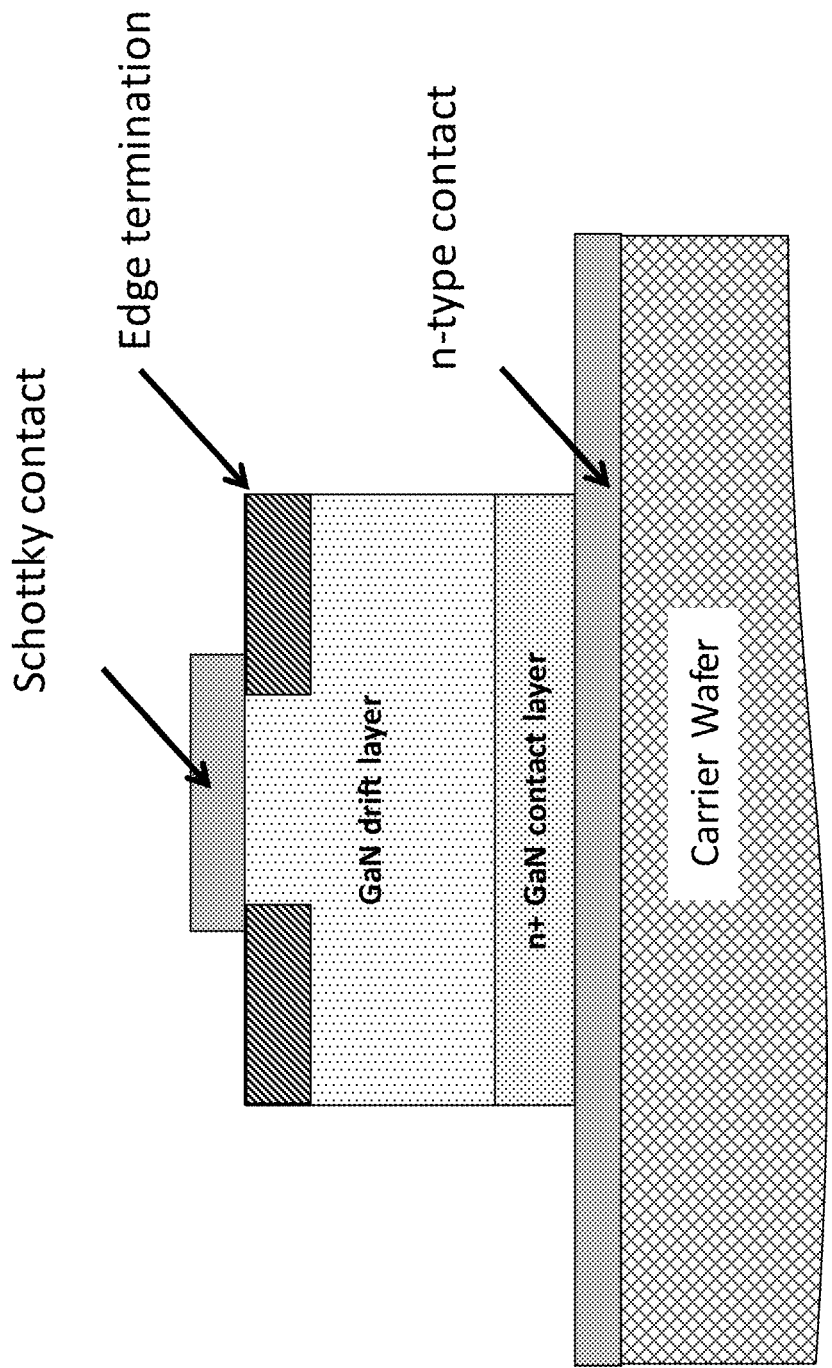
Figure. 9D: Vertical Schottky barrier diode device

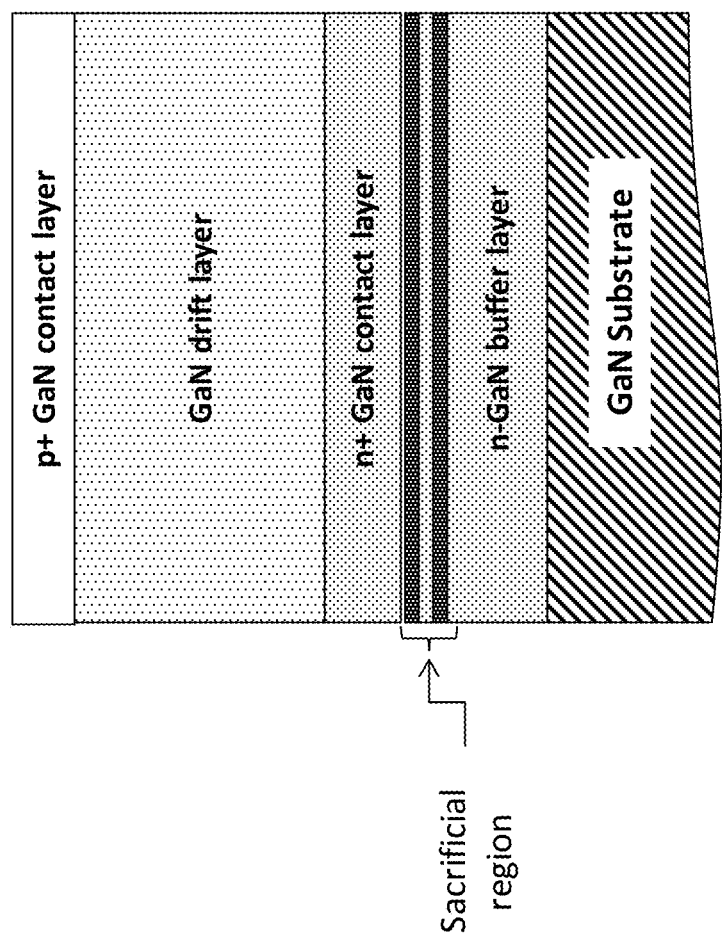
Figure. 10A: Example of epitaxial stack

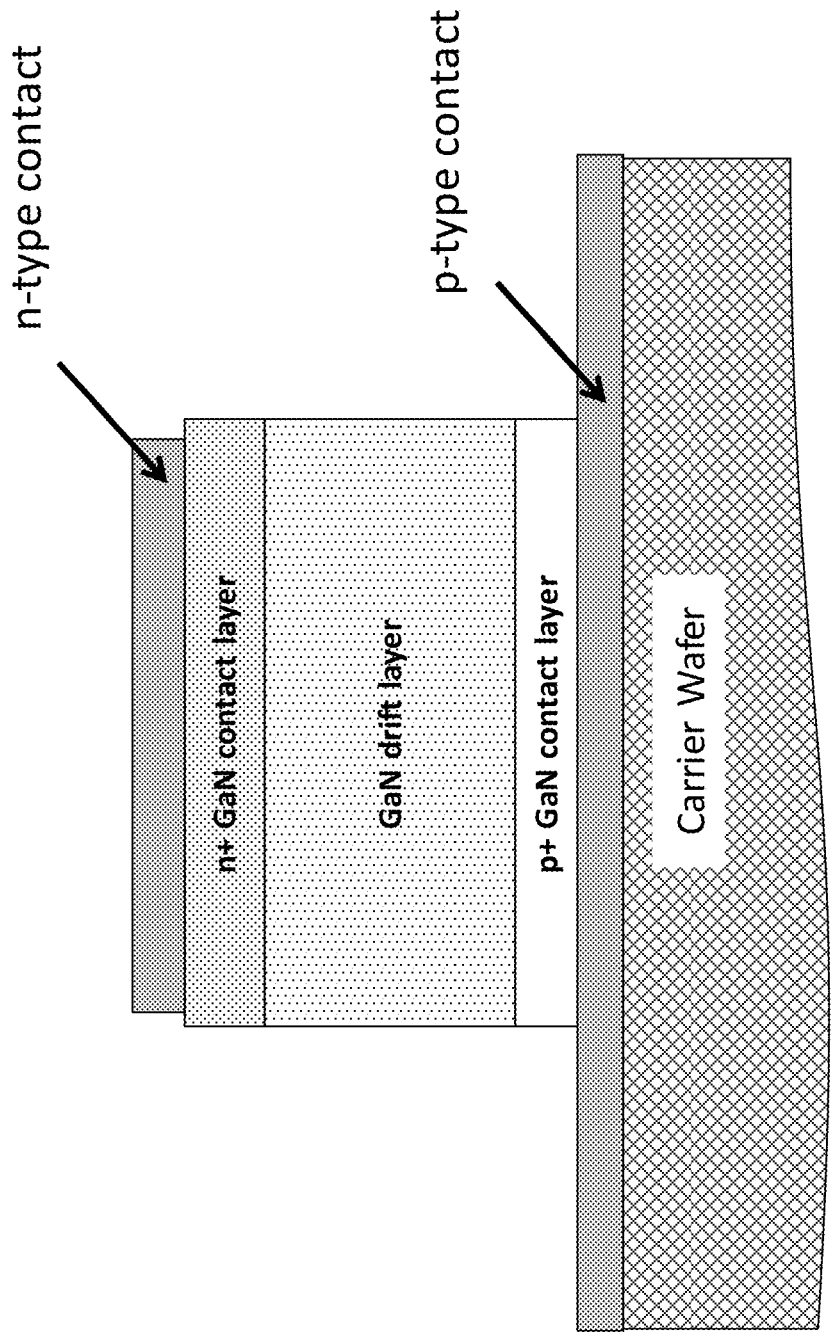
Figure. 10B: Vertical pn diode device

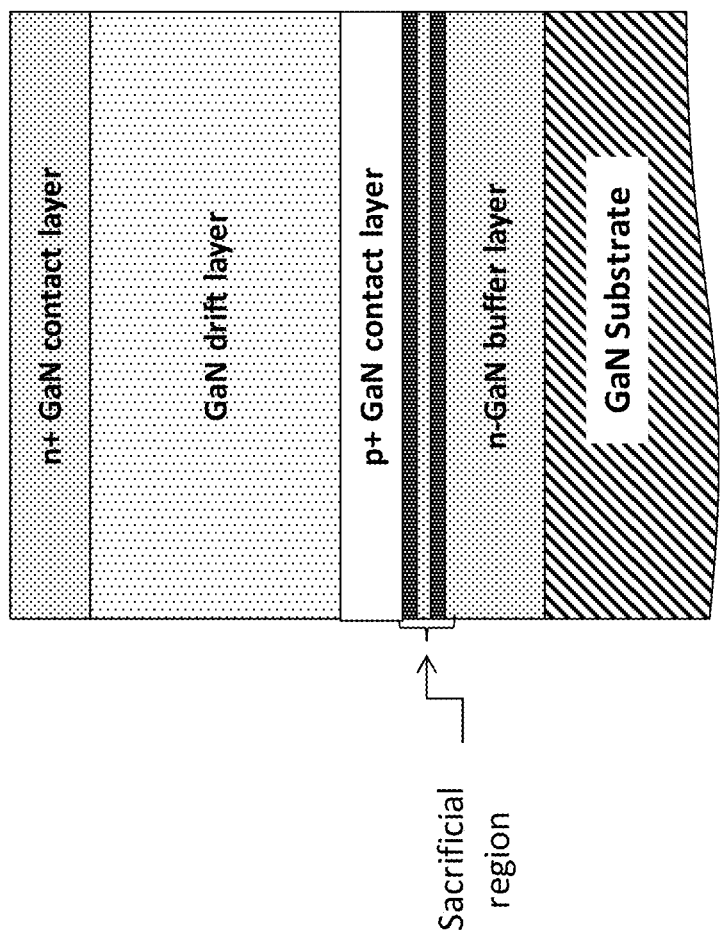
Figure. 10C: Example of epitaxial stack

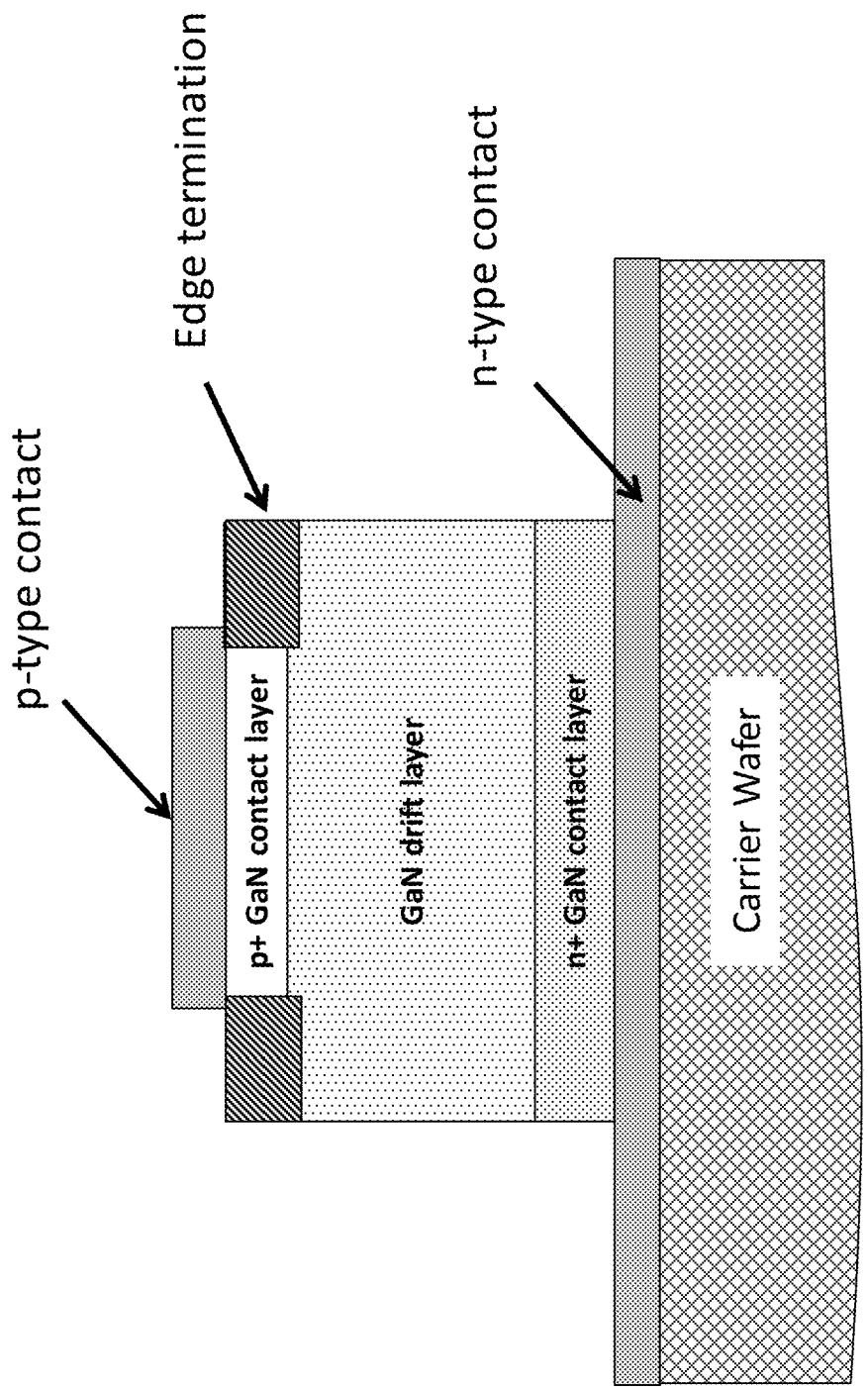
Figure. 10D: Vertical pn diode device

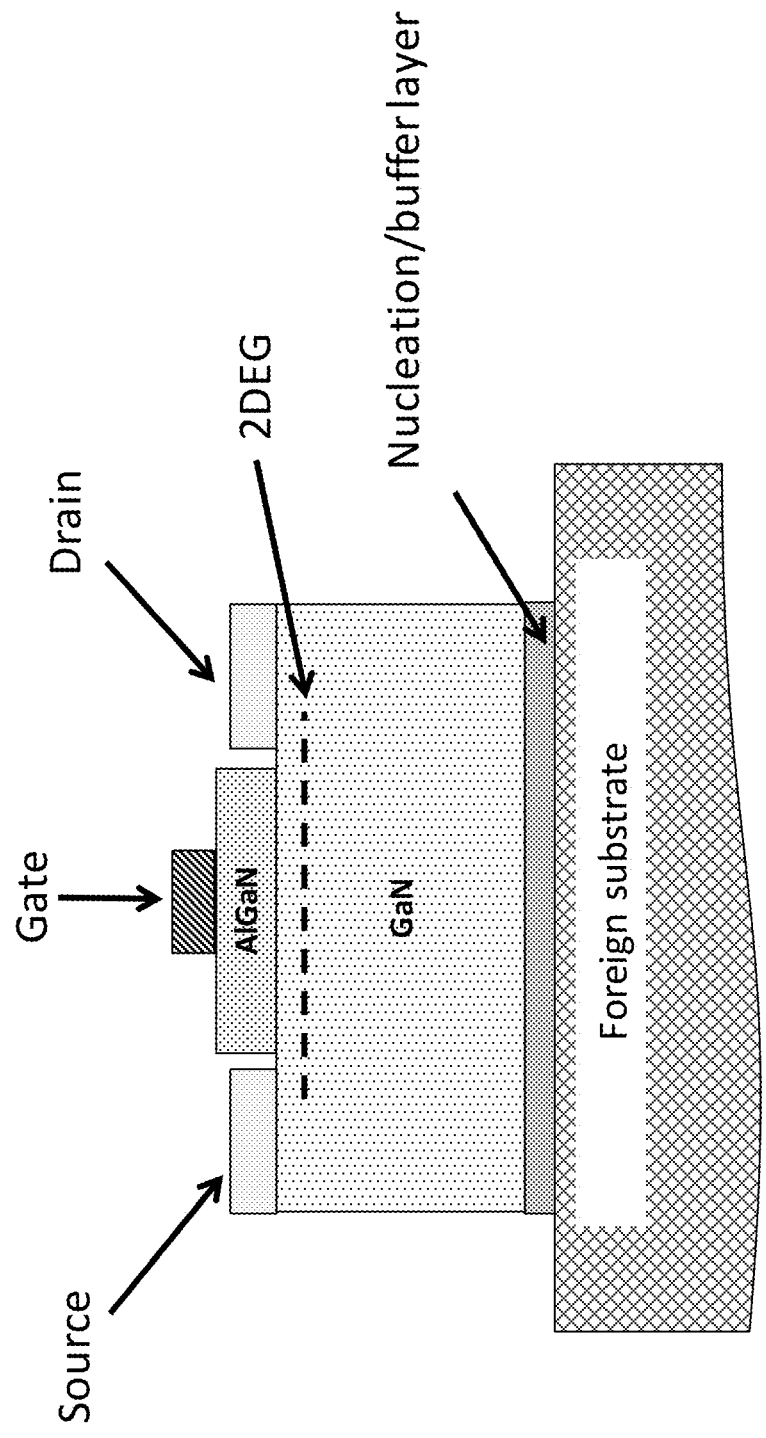
Figure. 11A: Example of a conventional HEMT device

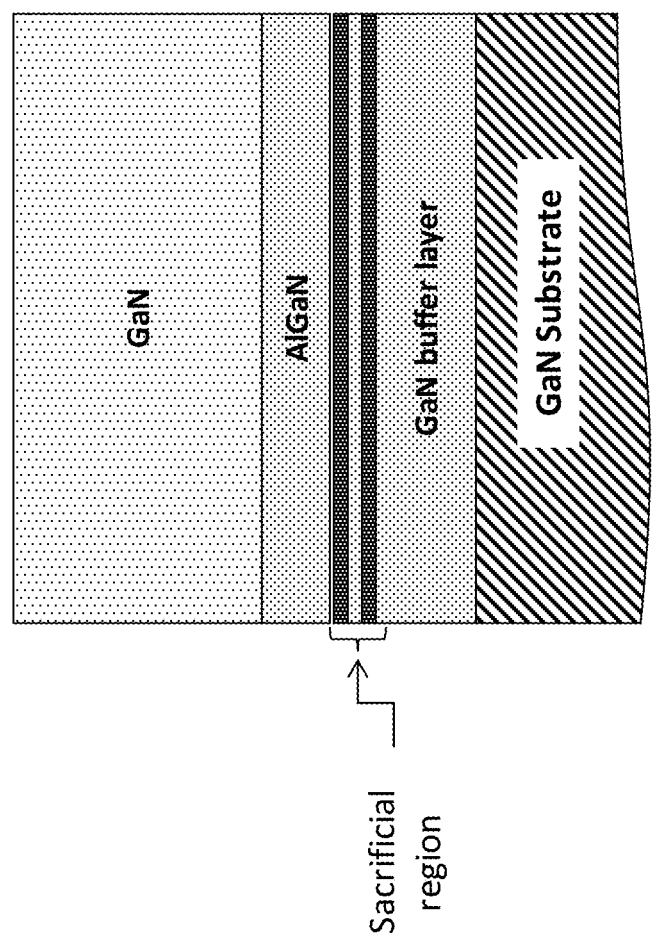
Figure. 11B: Example of epitaxial stack

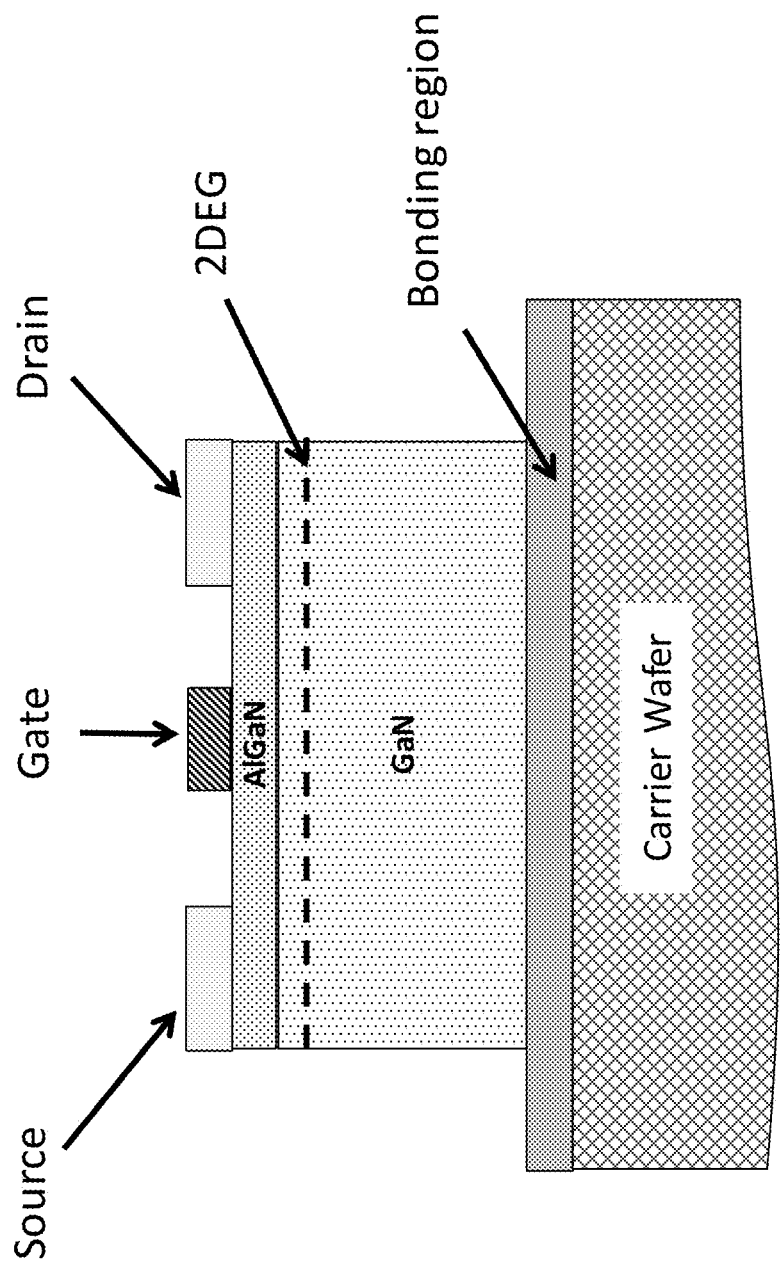
Figure. 11C: Example of a HEMT/HFET device

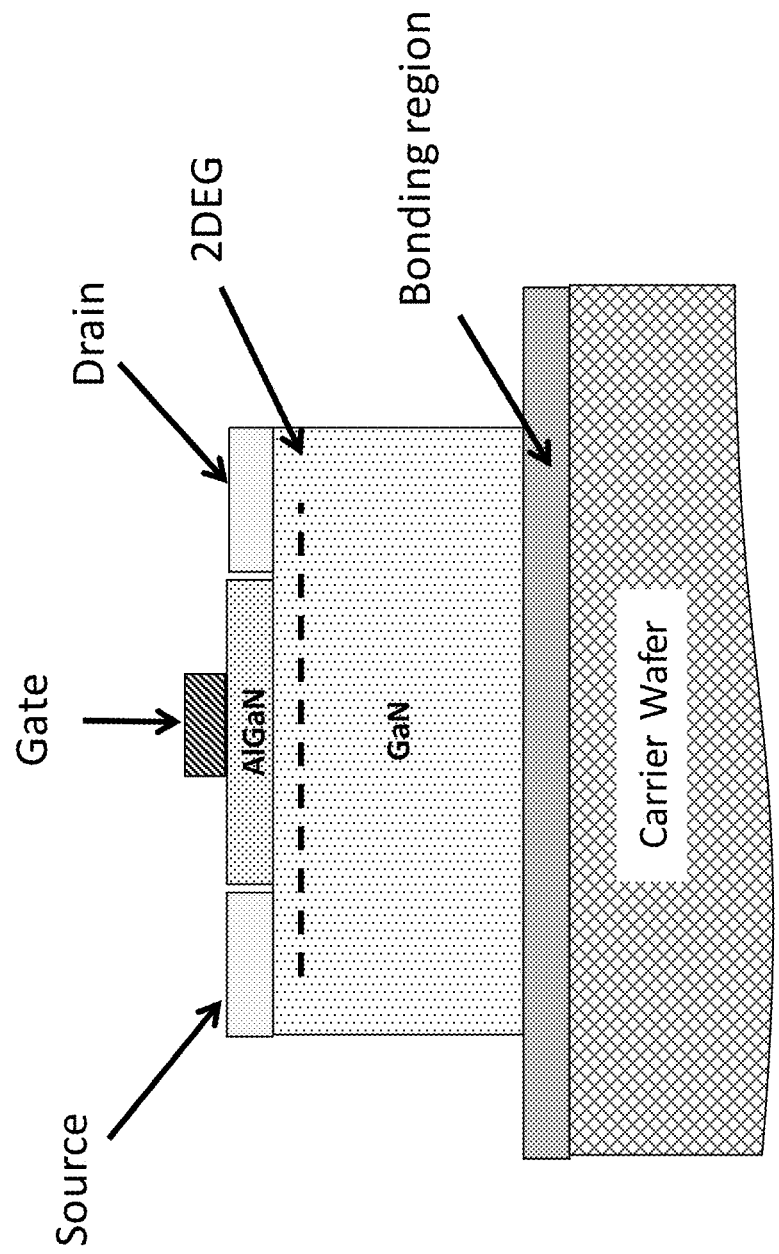
Figure. 11D: Example of a HEMT/HFET device

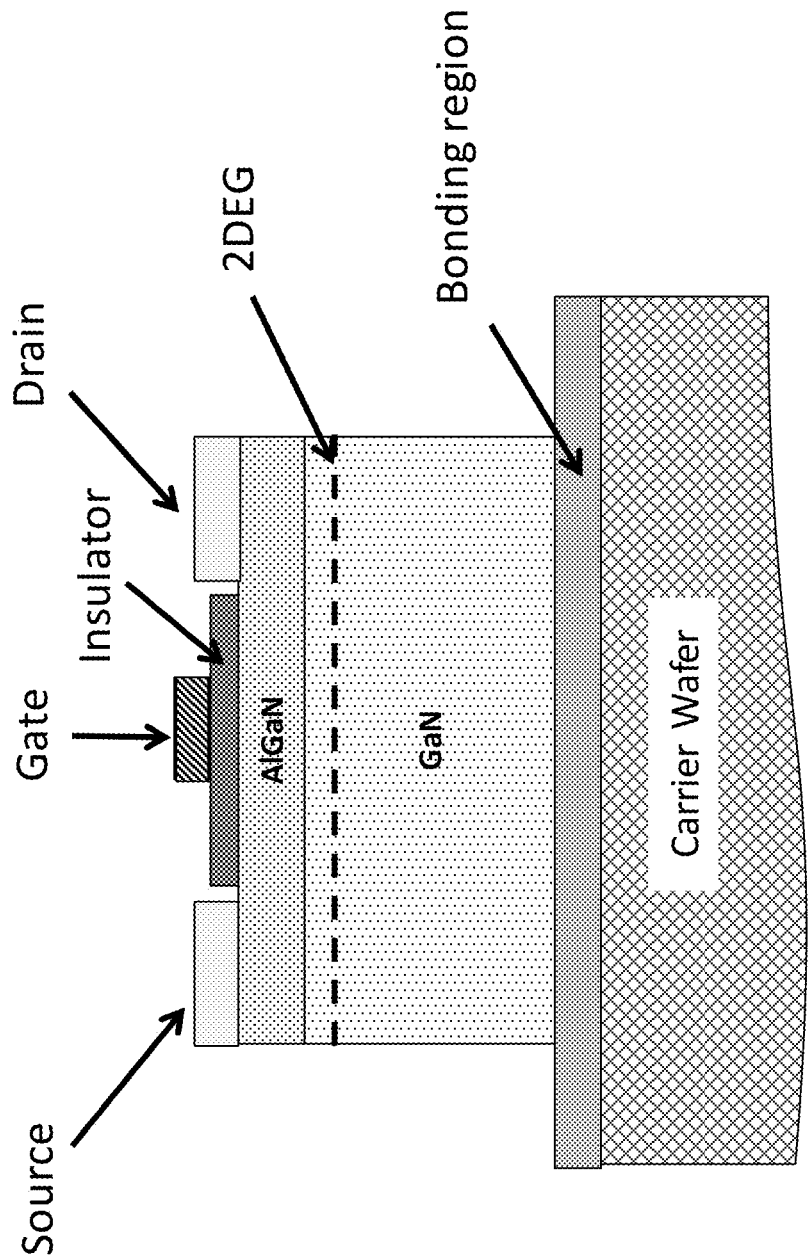
Figure. 11E: Example of an insulated gate HEMT

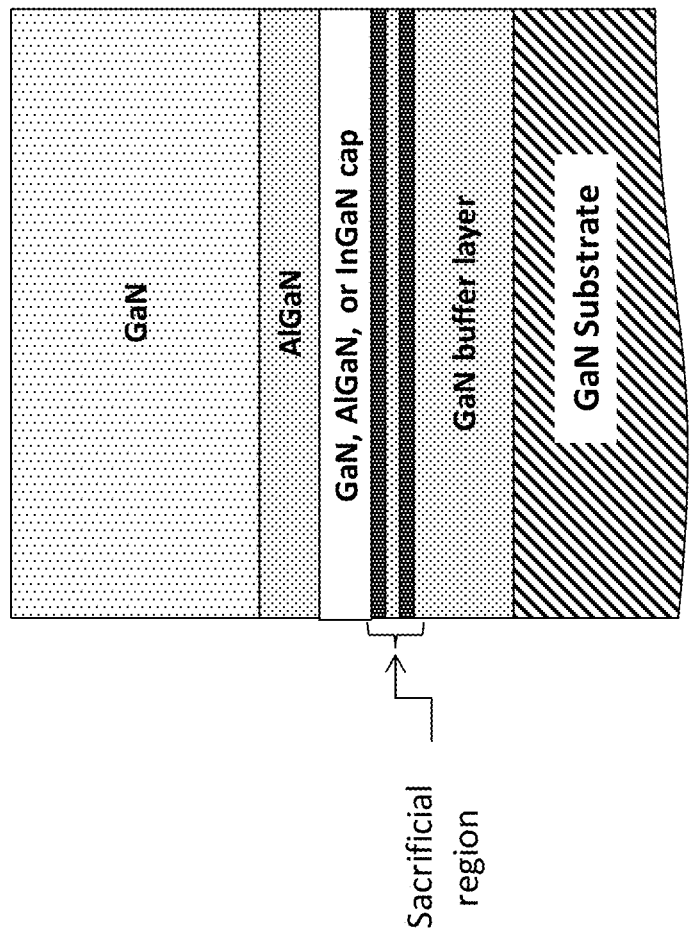
Figure. 11F: Example of epitaxial stack

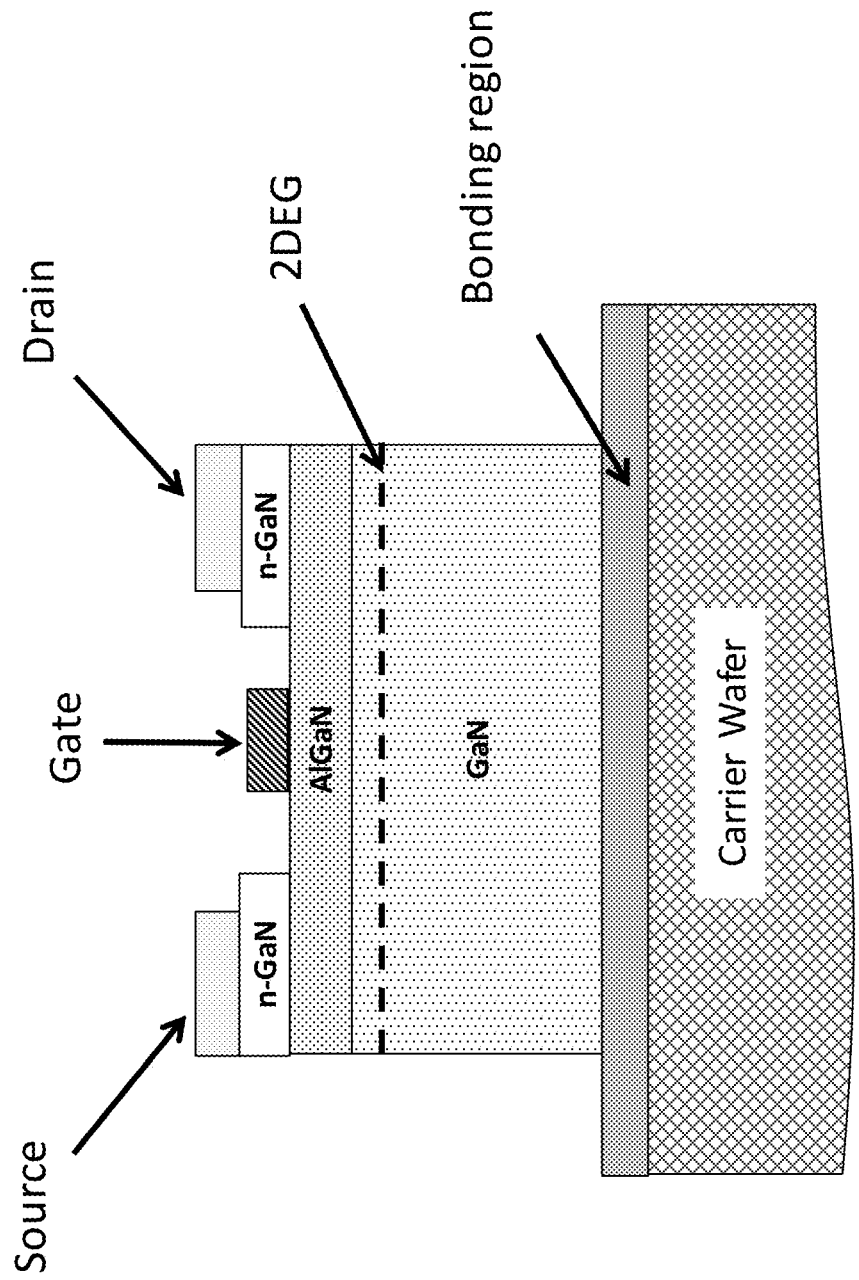
Figure. 11G: Example of a HEMT device

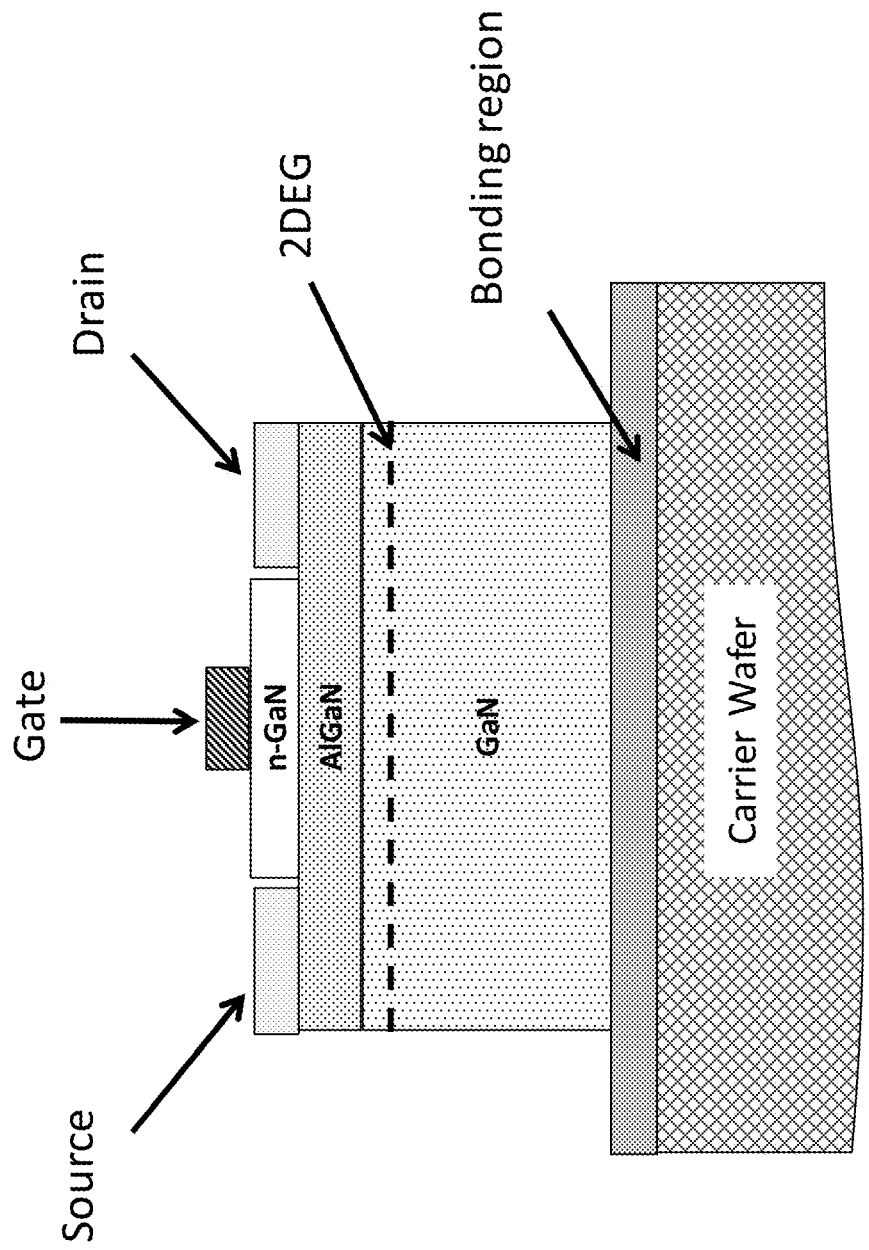
Figure. 11H: Example of a HEMT device

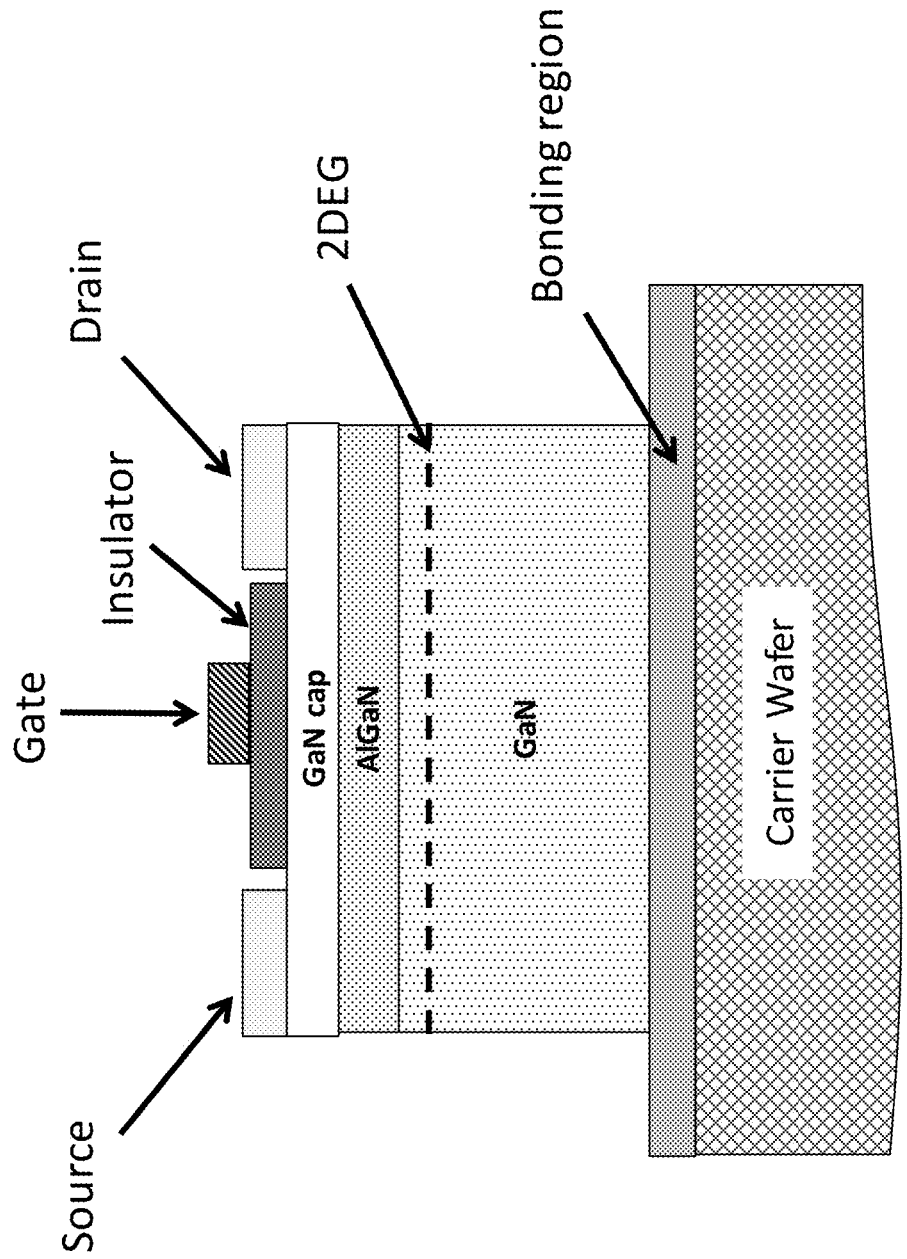
Figure. 11I: Example of a HEMT device

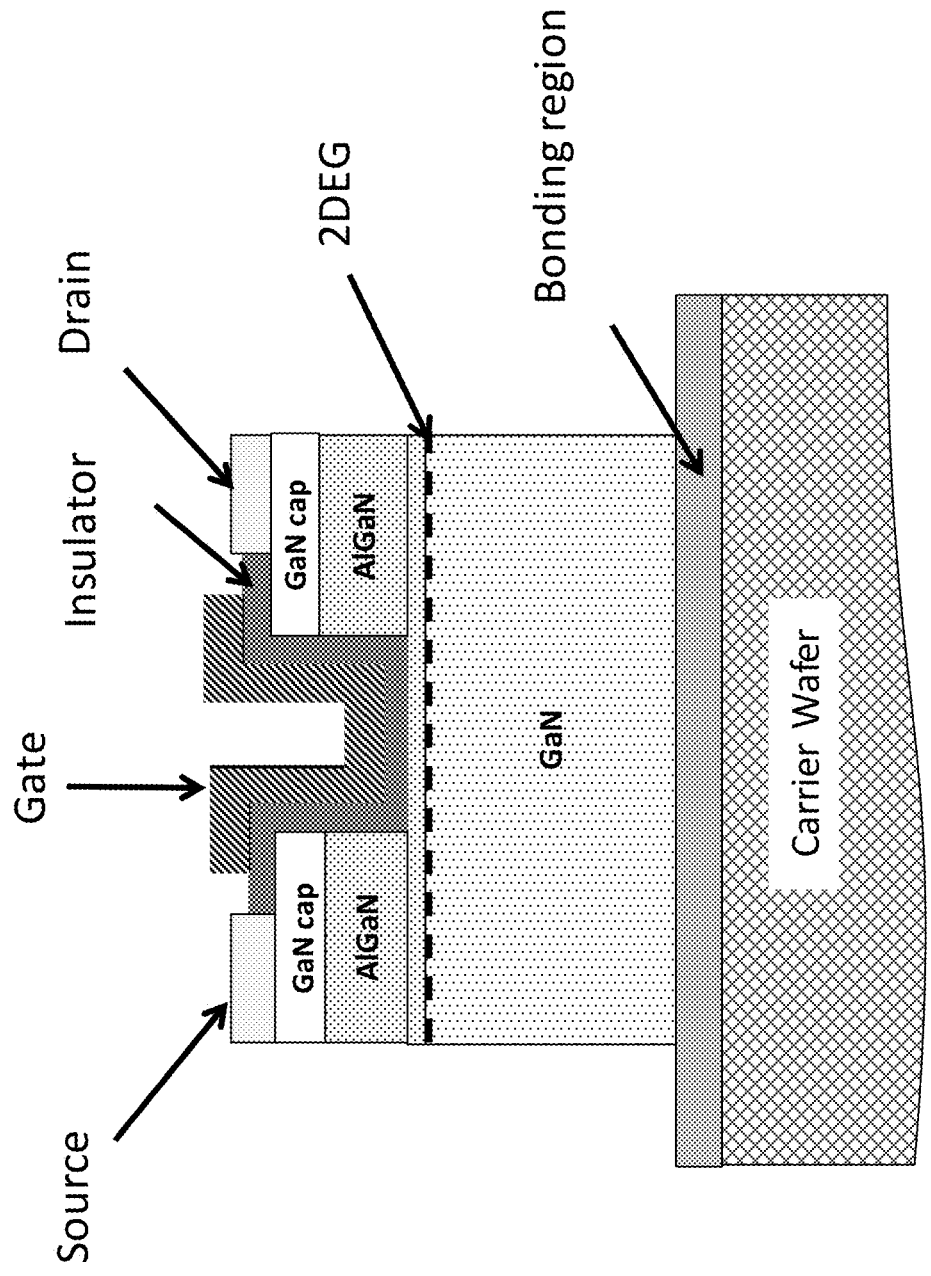
Figure. 11J: Example of a recessed gate HEMT device

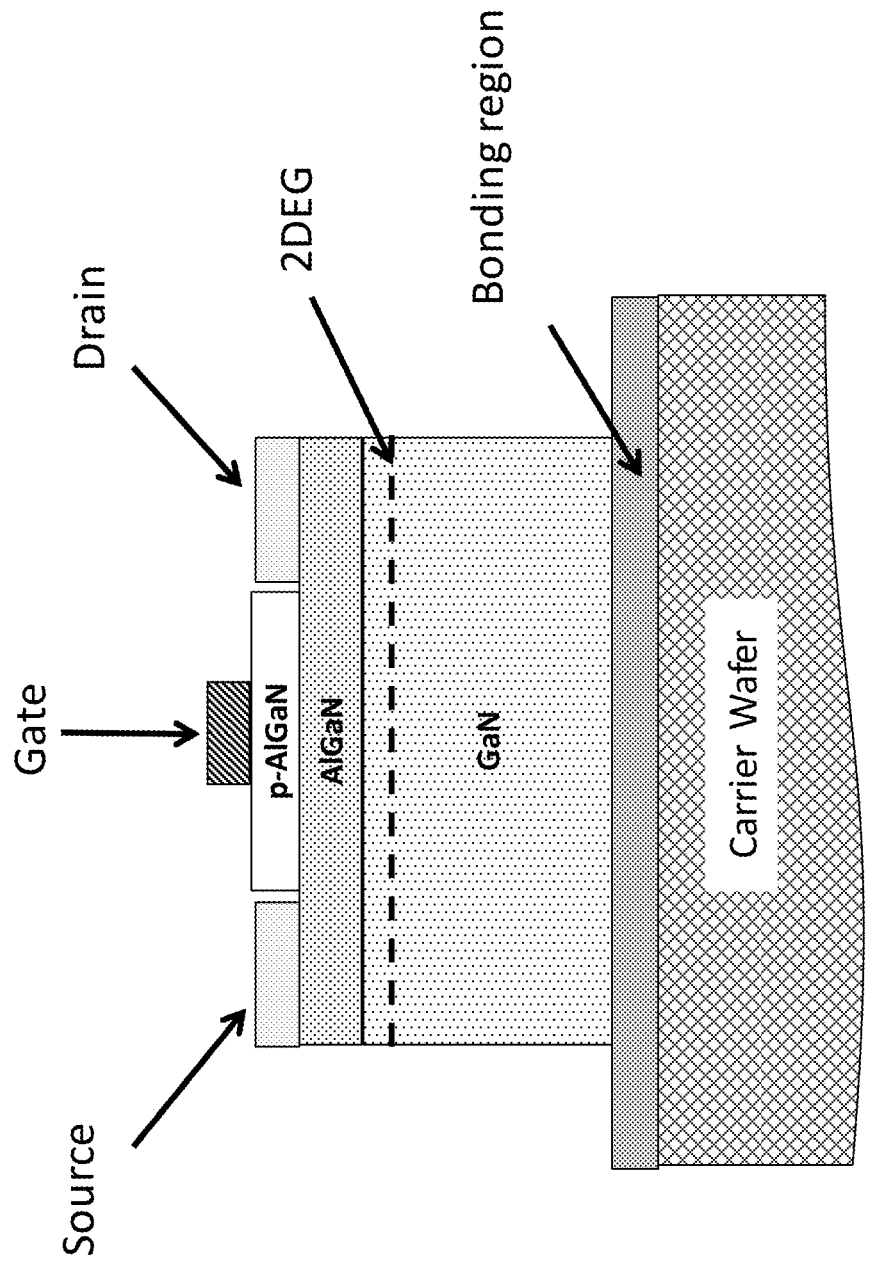
Figure. 11K: Example of a GIT device

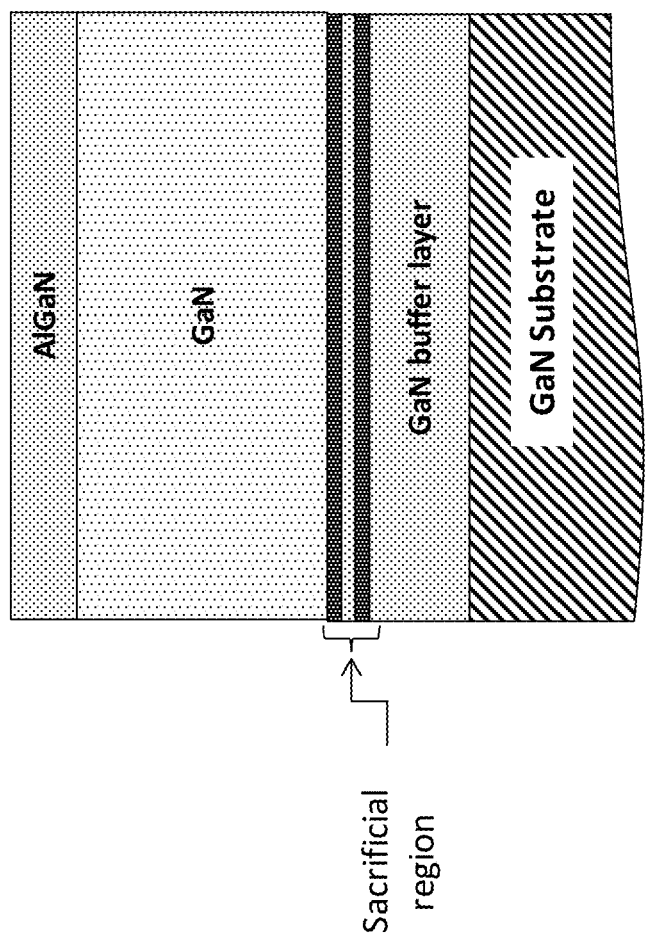
Figure. 11L: Example of epitaxial stack

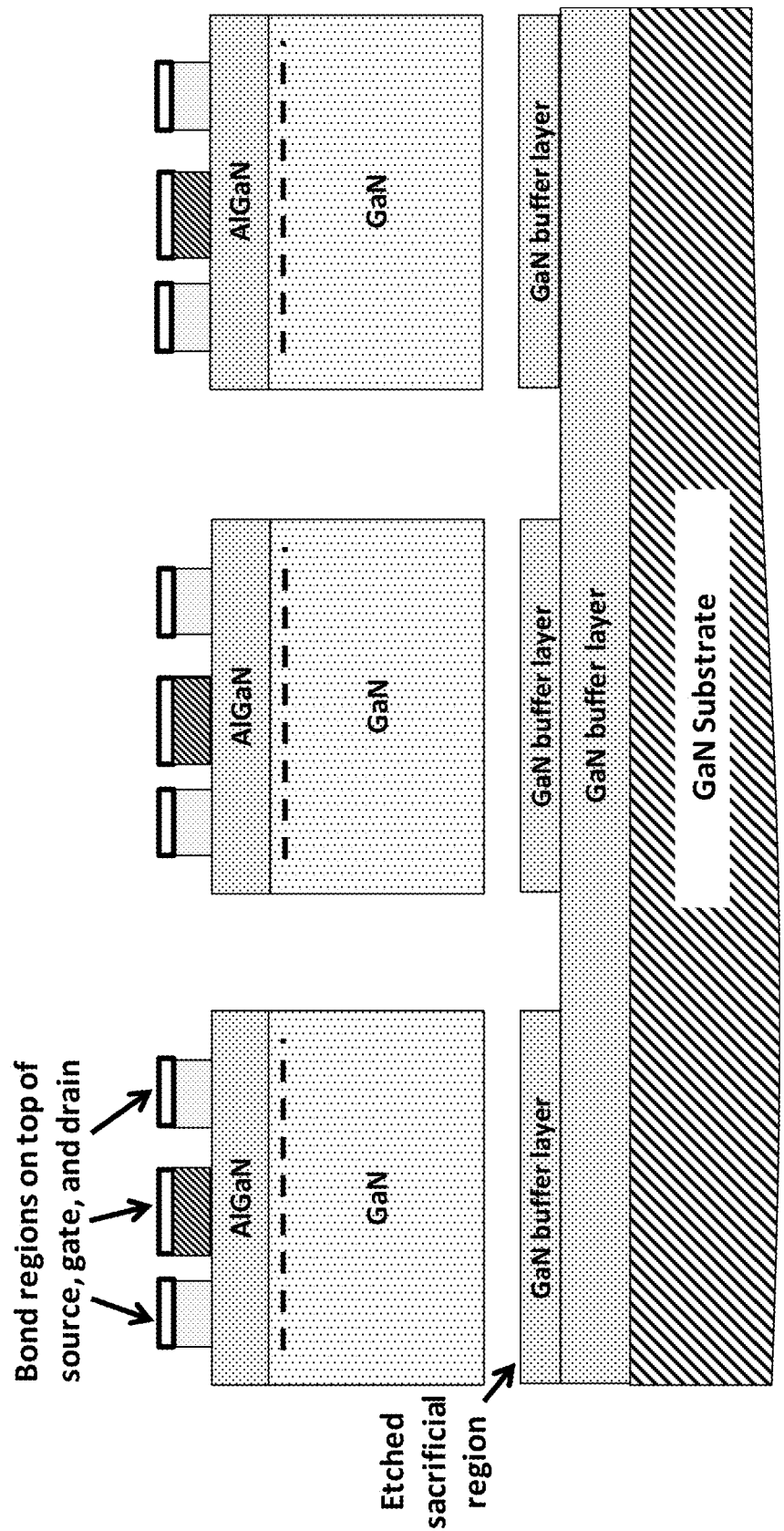
Figure. 11M: Example of HEMT devices

Figure. 11N: Example of HEMT devices selectively transferred
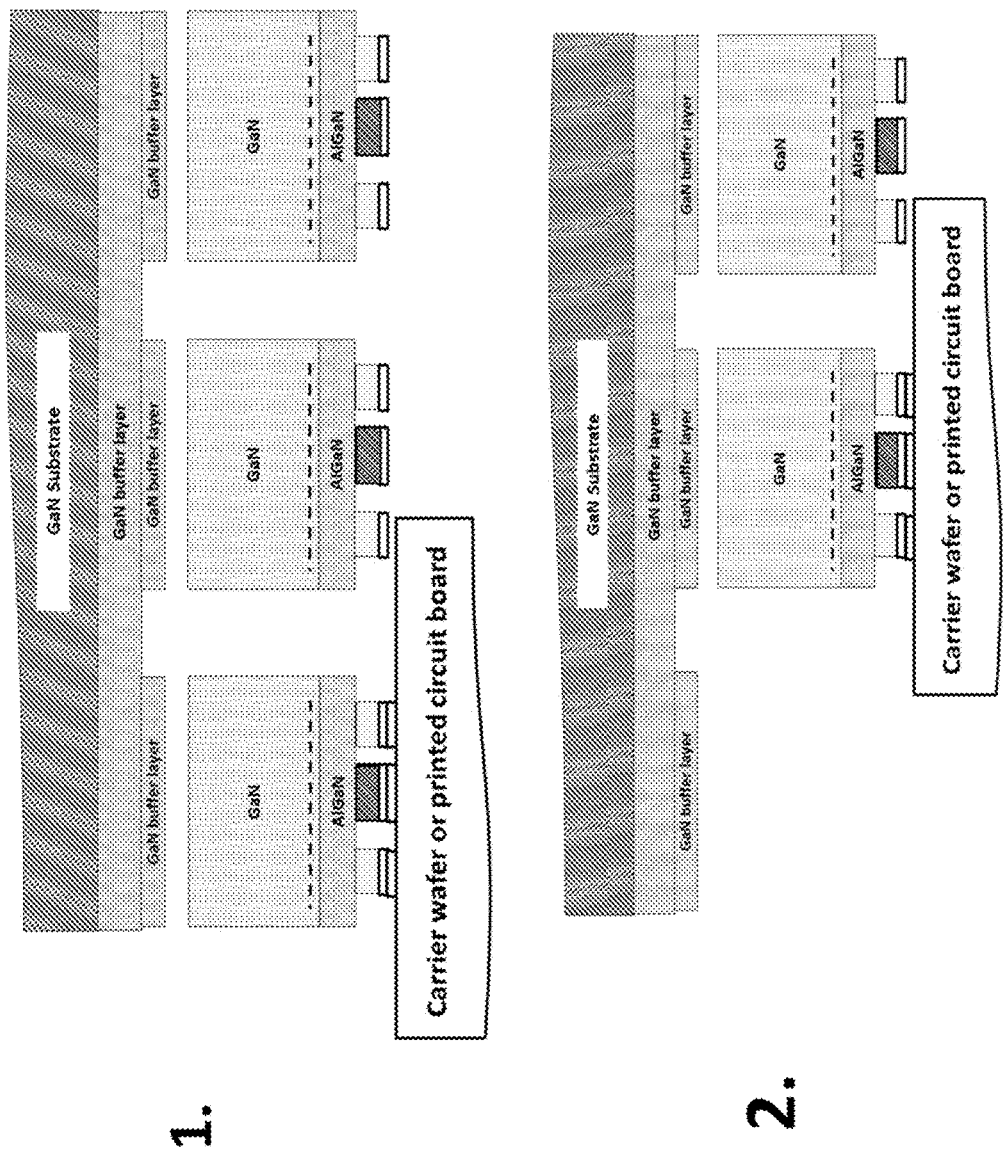

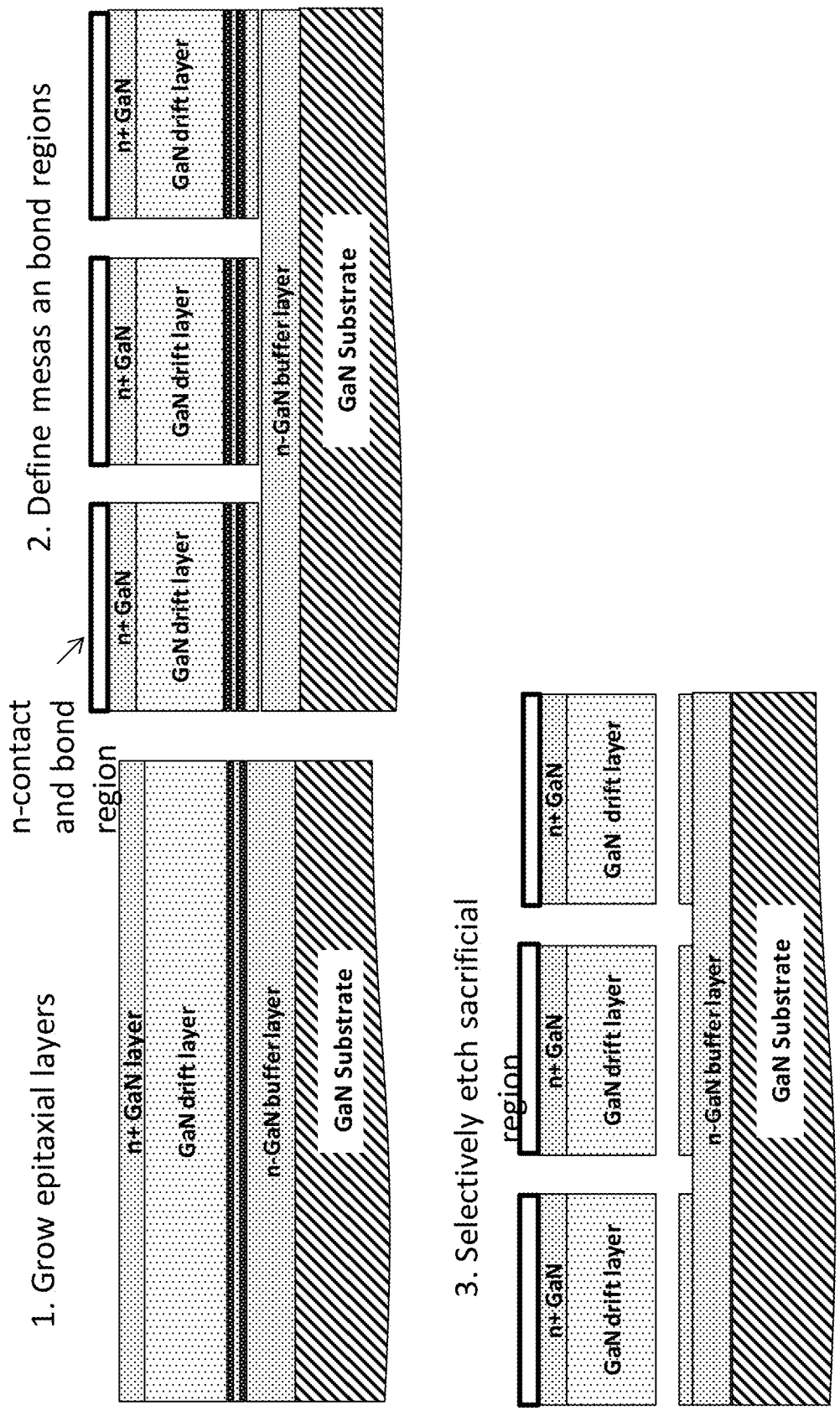

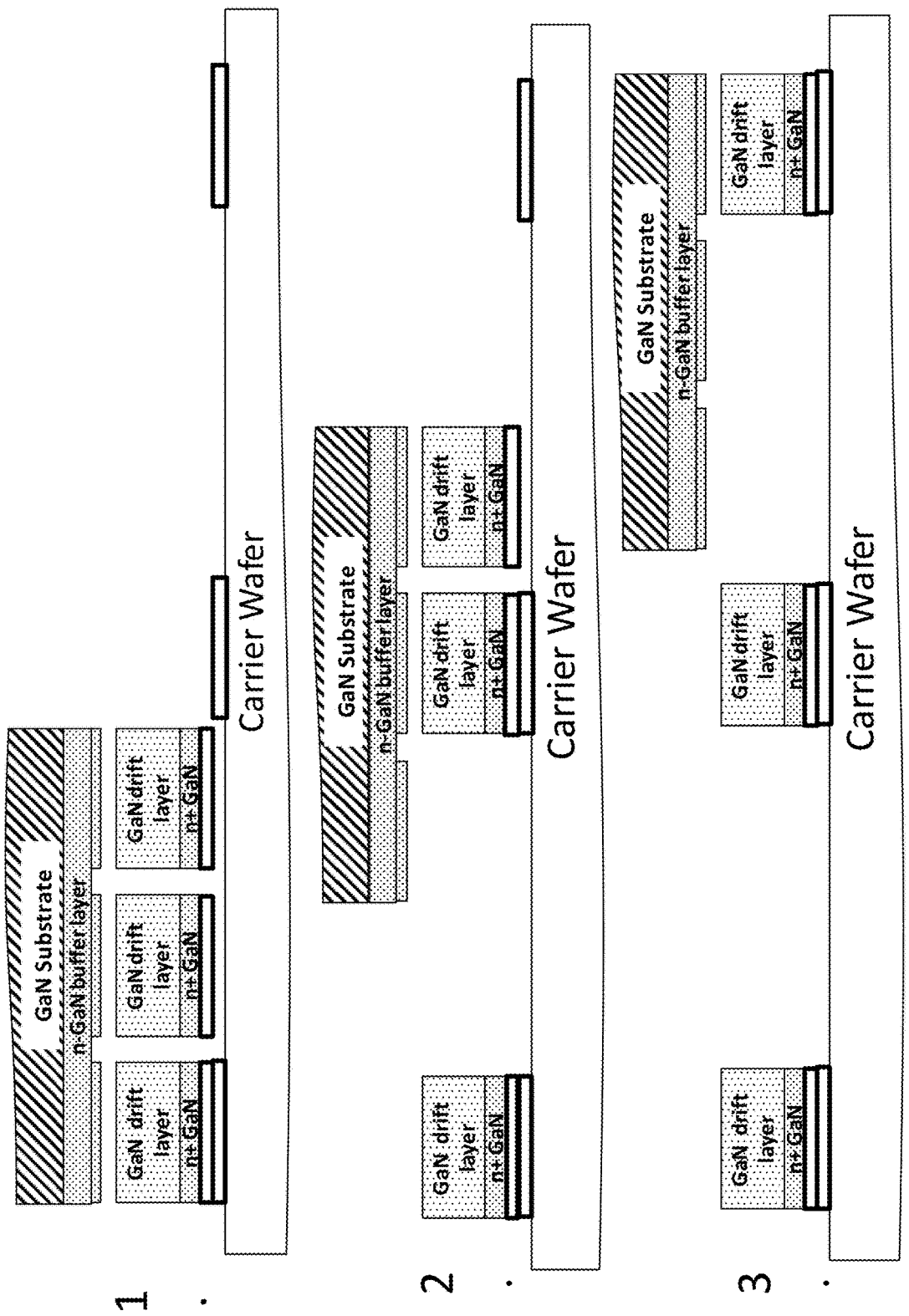
Figure. 12B: Example of selective bonding for die expansion of Schottky diode devices

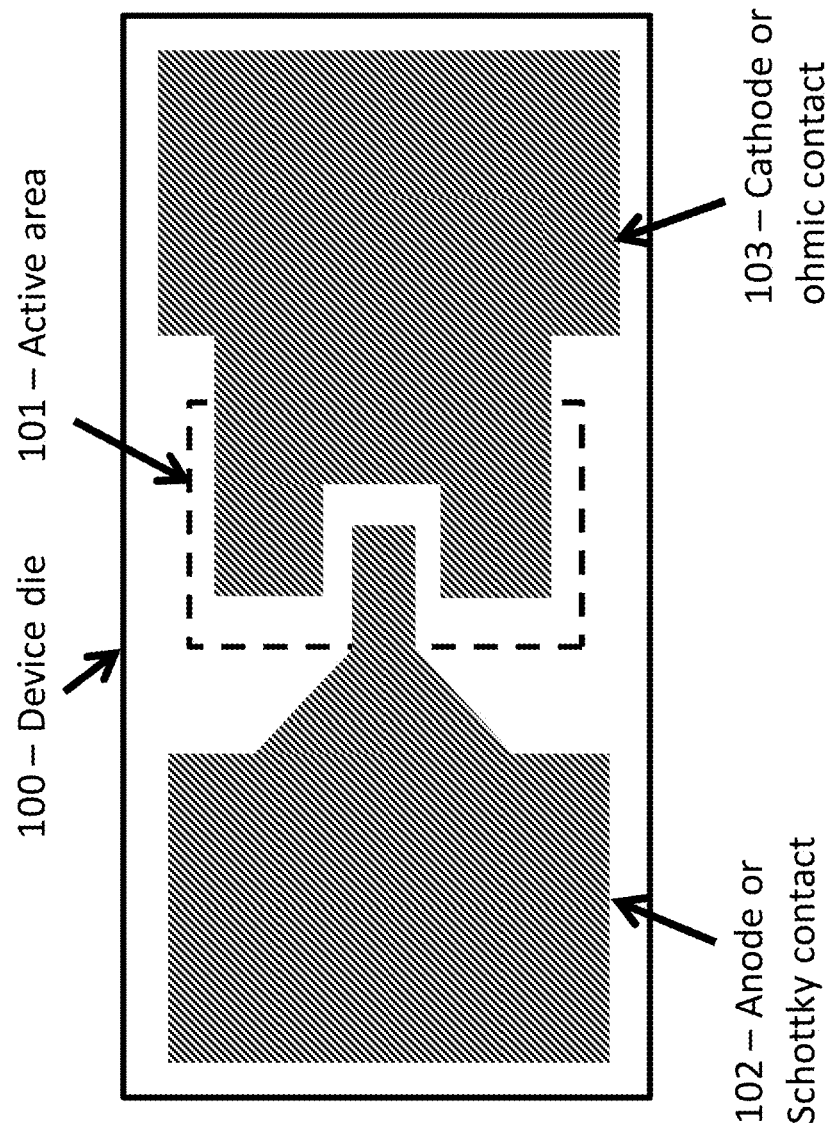
Figure. 12C: Top View of Conventional Shottky diode device

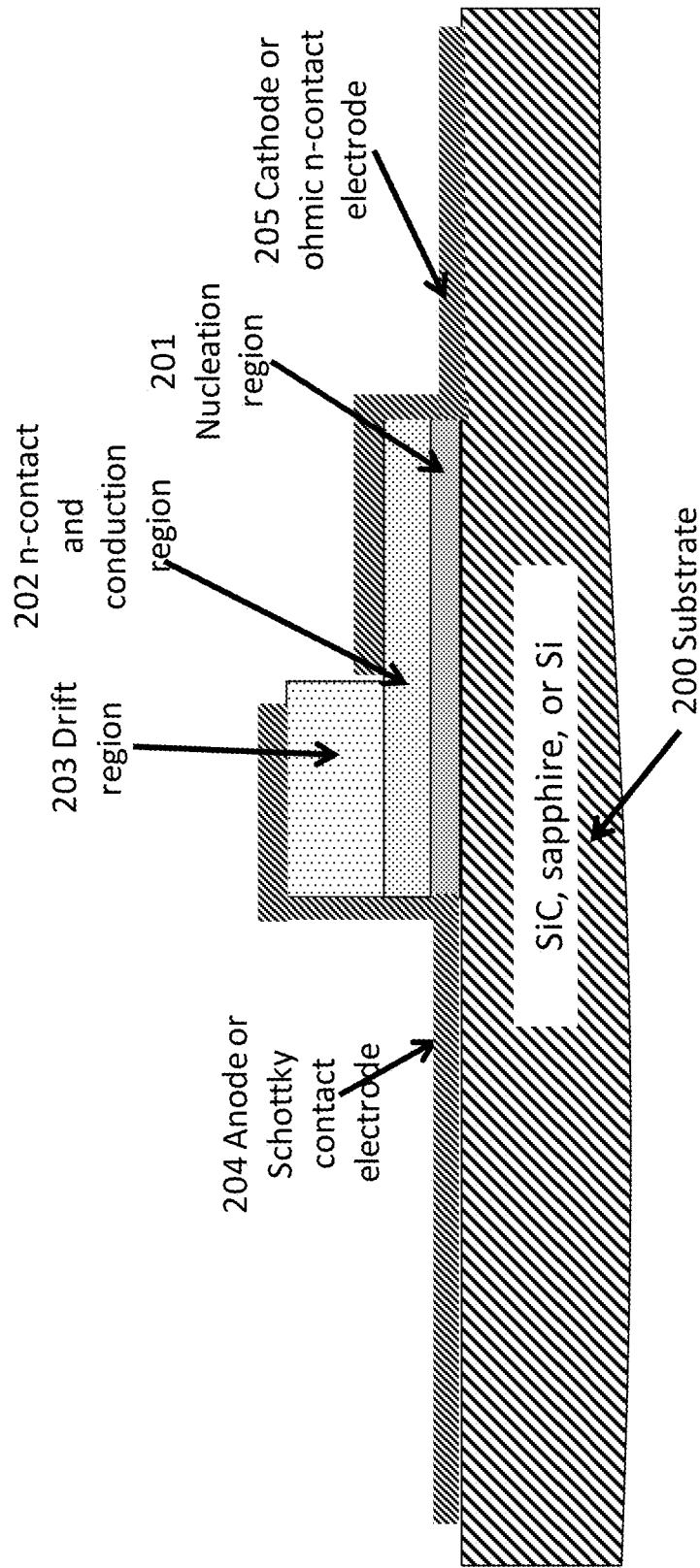
Figure. 12D: Cross-sectional view of conventional Schottky diode

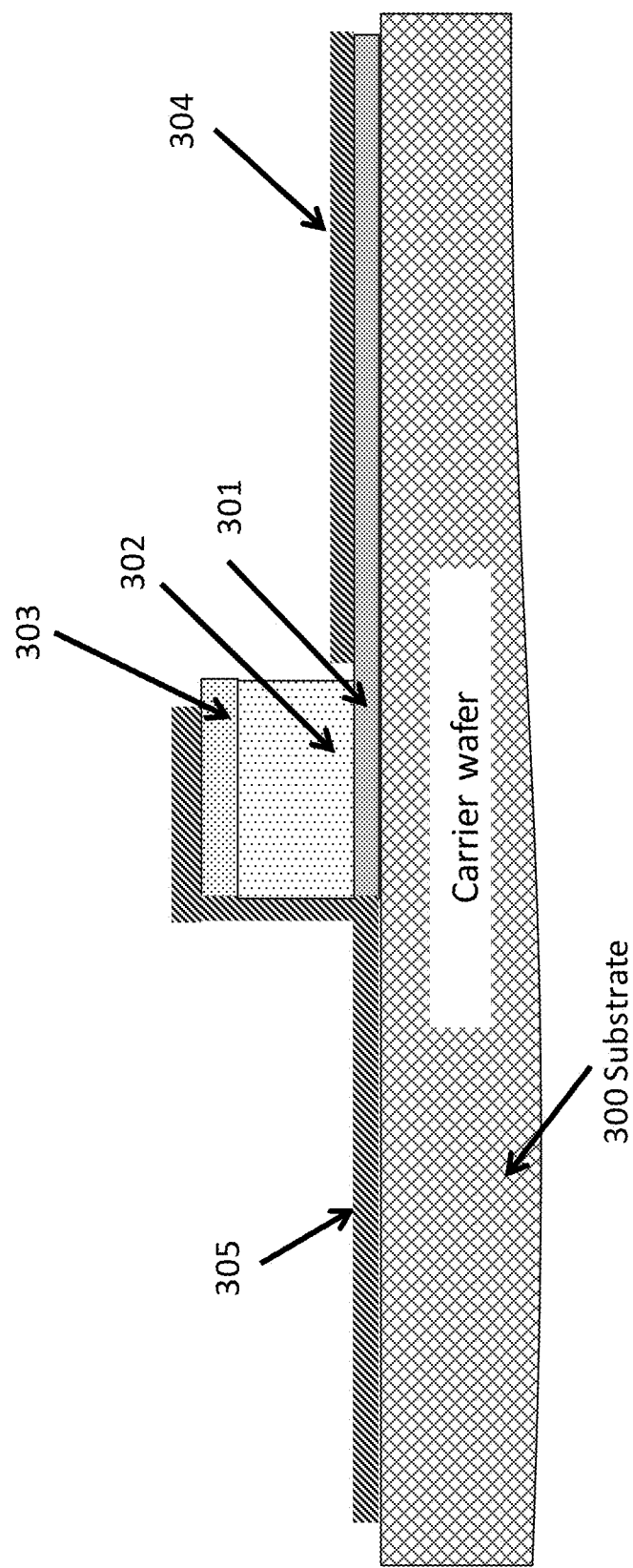
Figure. 12E: Cross-sectional view of Schottky diode device

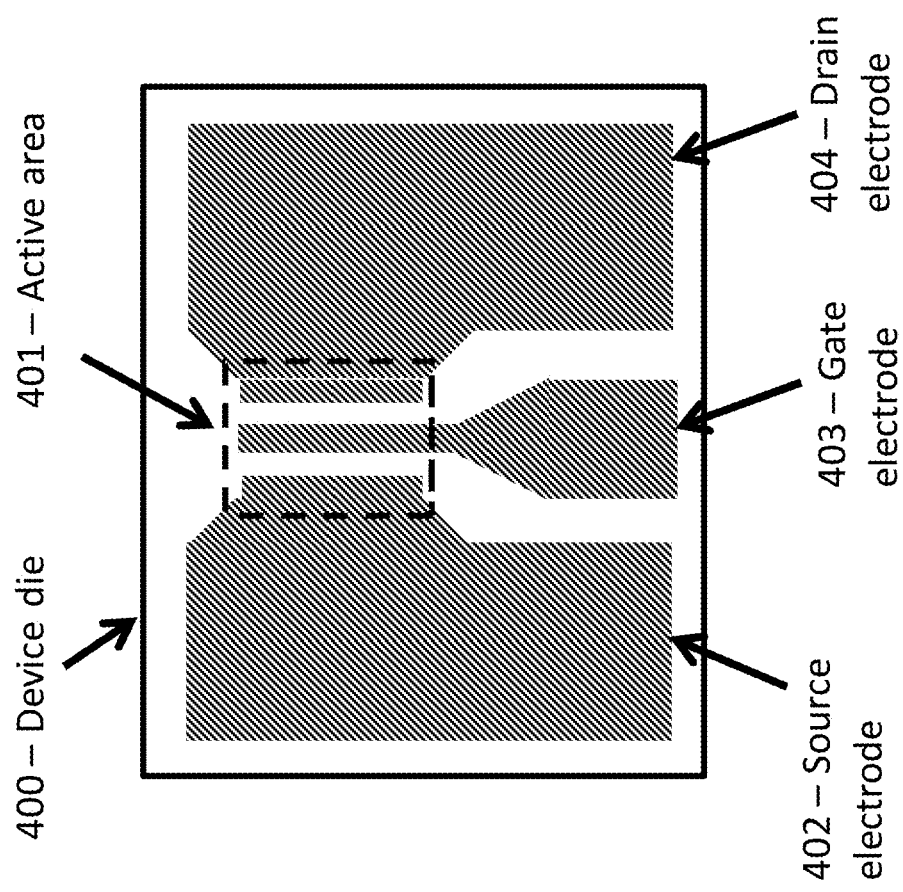
Figure. 12F: Top-view of conventional HEMT device

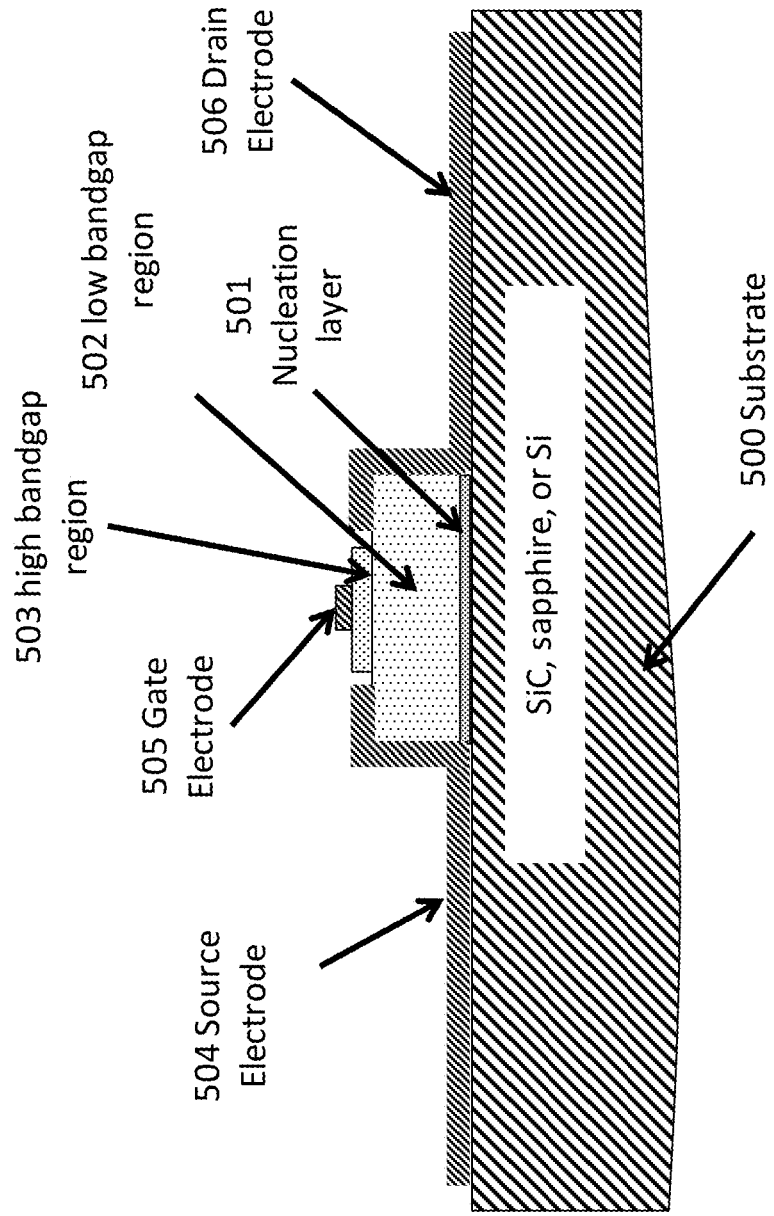
Figure. 12G: Cross-sectional view of conventional HEMT device

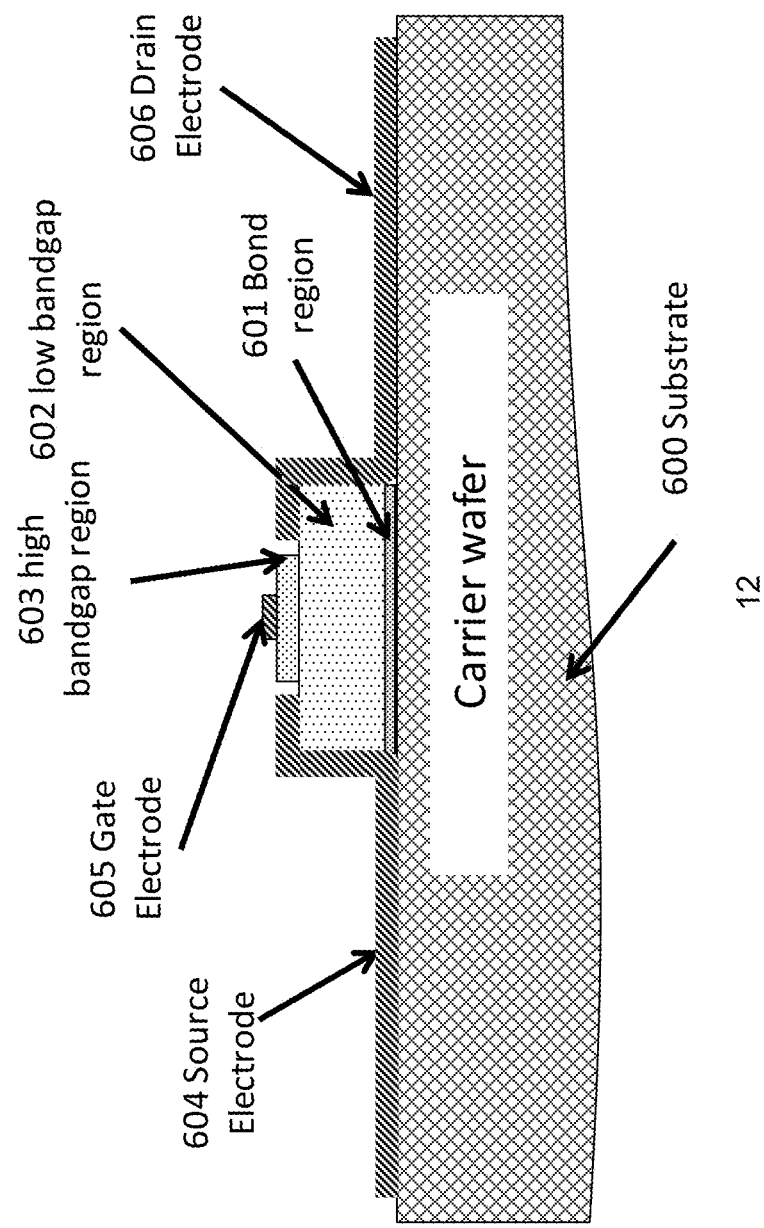
Figure. 12H: Cross-sectional view of HEMT device

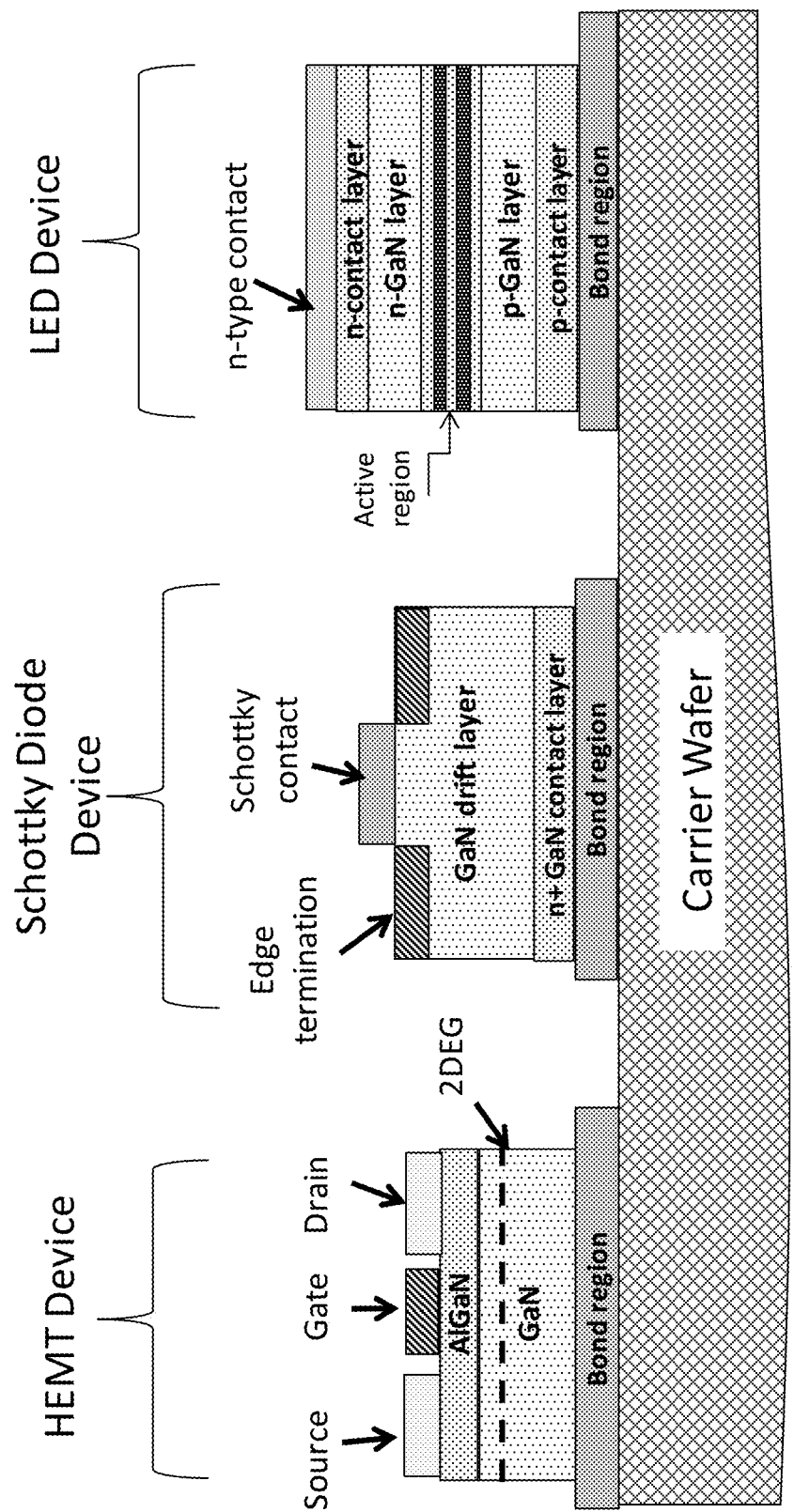
Figure 13A: Device integration on the carrier

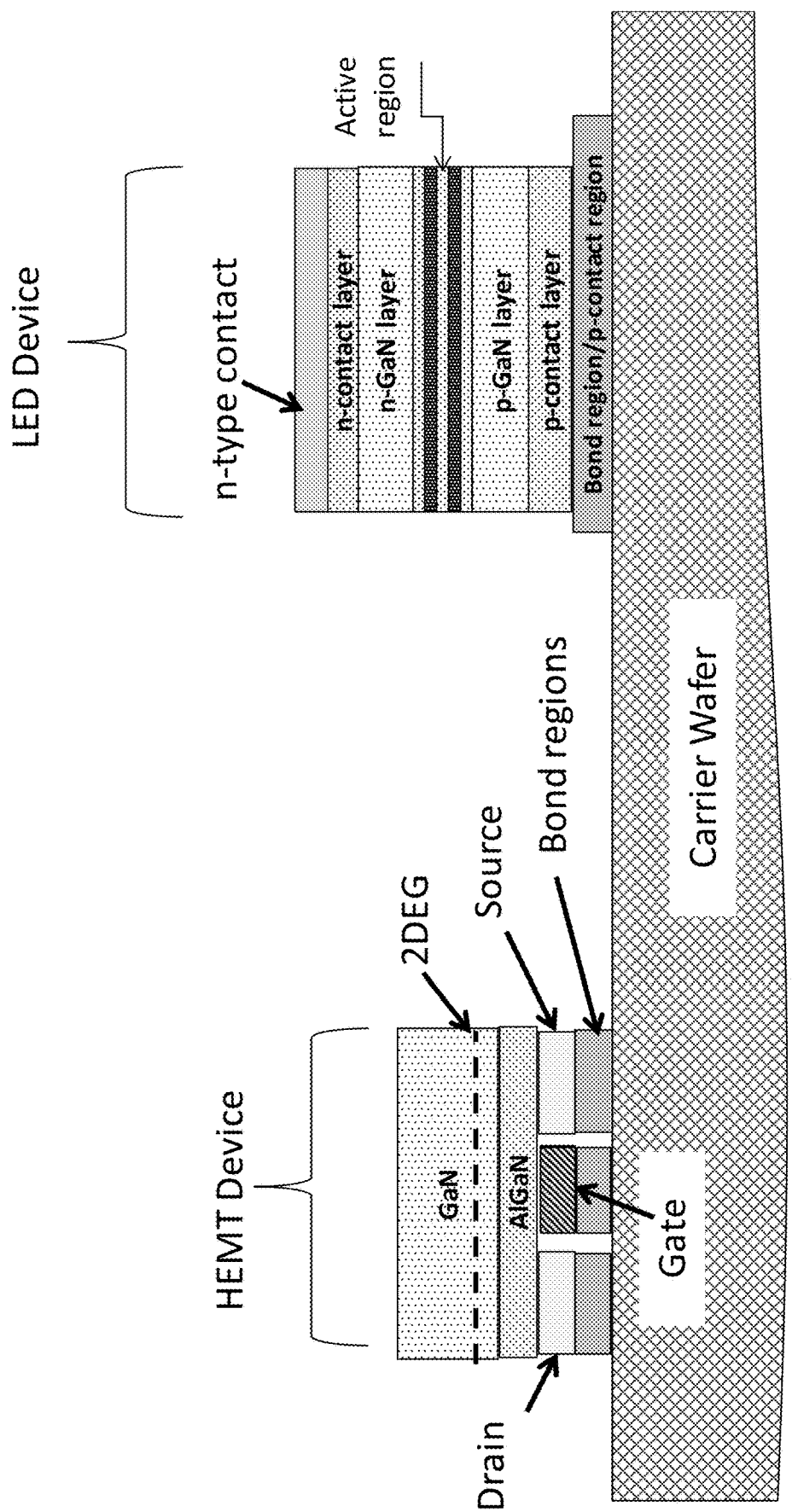
Figure 13B: Device integration on carrier wafer

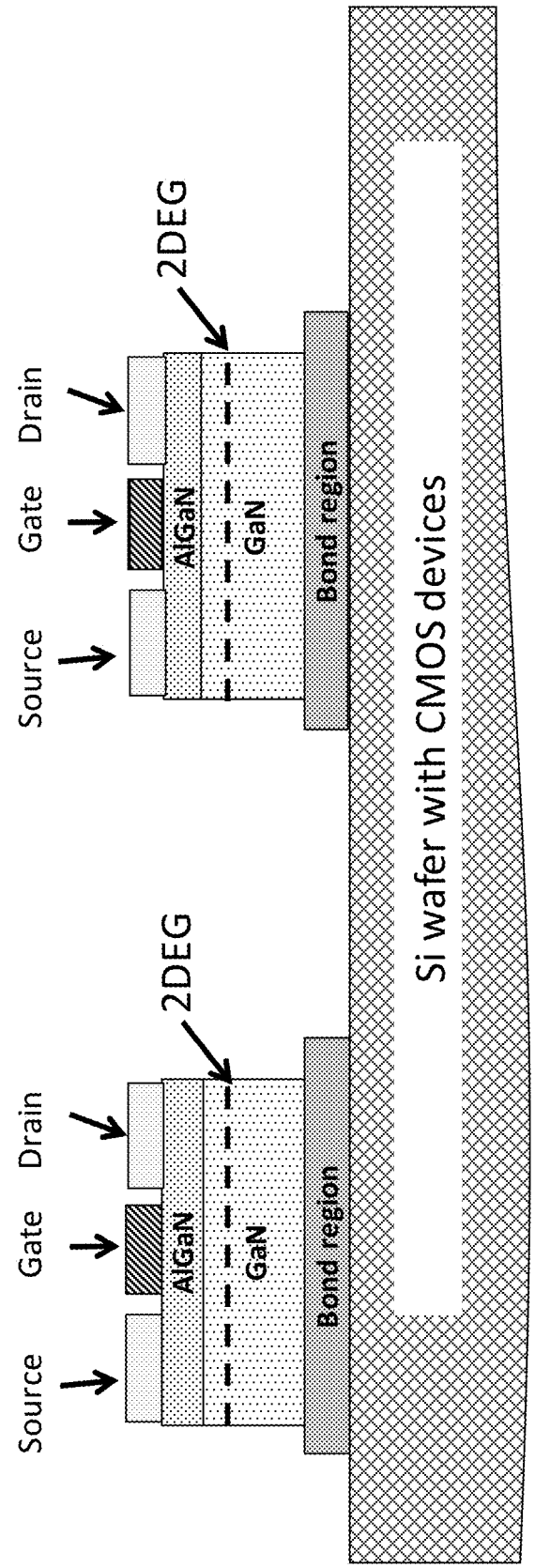
Figure 13C: Device integration on carrier wafer

MANUFACTURABLE THIN FILM GALLIUM AND NITROGEN CONTAINING DEVICES INTEGRATED WITH SILICON ELECTRONIC DEVICES

CROSS-REFERENCE TO RELATED APPLICATIONS

This application is a continuation of Ser. No. 16/005,255, filed Jun. 11, 2018, which is a continuation of Ser. No. 15/480,239, filed Apr. 5, 2017, which is a continuation of Ser. No. 15/209,309, filed Jul. 13, 2016, which is a continuation-in-part of U.S. application Ser. No. 14/580,693, filed Dec. 23, 2014, the contents of which are incorporated herein by reference in their entirety for all purposes.

BACKGROUND

Devices based on wide bandgap III-V semiconductor materials such as gallium nitride (GaN) play a major role in our modern world. They play critical roles in essentially all of our electronic devices and are instrumental in almost all of the machines and apparatus we rely on every day. Examples of such semiconductor devices include light emitting devices such as light emitting diodes and laser diodes, electronic devices such as Schottky diodes, pn diodes, bipolar junction transistor, field effect transistors, metal-oxide-semiconductor field-effect transistor, insulated gate bipolar transistors, high electron mobility transistors, and heterojunction bipolar transistors to name a few, along with light absorbing devices such as solar cells. Forming such GaN devices of the highest performance often requires epitaxial structures with minimum defect density and the highest crystal quality and purity. To achieve the low defect density and high crystal quality it is most optimum to grow the epitaxial device epitaxial layers on a native GaN substrates to form a pseudomorphic epitaxial structure that is relatively free from strain related defects that occur when growing on foreign substrates.

Unfortunately, the synthesis of GaN single crystal substrates has been an extraordinarily difficult task. The highly successful Czochralski method for silicon crystal growth would have impractical process requirements comparable to conditions very deep within the Earth's mantle. Alternative approaches have been investigated for growing GaN bulk substrates, such as hydride vapor phase epitaxy (HVPE) and ammonothermal growth. Additionally it is still a great challenge to scale up bulk GaN growth to larger wafer sizes. GaN substrates are currently available in 2" diameter at high volume and recent announcements have revealed availability in 4" in the near future, which is still drastically smaller than more mature substrate technologies such as 12" single crystal silicon. At the current GaN wafer diameter and prices, the native substrate option is not economically feasible for realizing semiconductor devices in many applications, specifically light emitting diode applications and power electronic applications. Given the obstacles in GaN native substrate manufacturing, there has been substantial effort devoted to the epitaxy on foreign substrate materials. Common choices for GaN heteroepitaxy include sapphire, silicon carbide, and silicon. In the past decade, SiC and sapphire substrates have been widely used in nitride LEDs and RF transistors.

Light emitting diodes (LED) based on gallium nitride are lighting the world around us. An LED is a two-lead semiconductor light source. It is a basic pn-junction diode, which emits electromagnetic radiation when activated. The emission from an LED is spontaneous and is typically in a Lambertian pattern. When a suitable voltage is applied to the leads, electrons are able to recombine with electron holes within the device, releasing energy in the form of photons. This effect is called electroluminescence, and the color of the light (corresponding to the energy of the photon) is determined by the energy band gap of the semiconductor [1].

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness [1].

The earliest blue and violet GaN-based LEDs were fabricated using a metal-insulator-semiconductor structure due to a lack of p-type GaN. The first p-n junction GaN LED was demonstrated by Amano et al. using the LEEBI treatment to obtain p-type GaN in 1989 [2]. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 uW at 20 mA. The first p-GaN/n-InGaN/n-GaN DH blue LEDs were demonstrated by Nakamura et al. in 1993 [3]. The LED showed a strong band-edge emission of InGaN in a blue wavelength regime with an emission wavelength of 440 nm under a forward biased condition. The output power and the EQE were 125 uW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm [4]. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps [1].

LEDs have many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

A laser diode is a two-lead semiconductor light source that that emits electromagnetic radiation that is comprised primarily of stimulated emission. The laser diode is comprised of a gain medium that functions to provide emission through the recombination of electron-hole pairs and a cavity region that functions as a resonator for the emission of the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. Unlike LEDs, laser diodes emit very directional light and have orders of magnitude higher spatial brightness. Moreover, above threshold, they do not suffer from the droop phenomenon that plagues LEDs.

Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lasers at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lasers at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Based on essentially all the pioneering work on GaN LEDs described above, visible laser diodes based on GaN technology have emerged. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common bulk GaN c-plane substrate size today with recent progress enabling 4" diameter, which are still relatively small compared to the 6" and greater diameters that are commercially available for mature substrate technologies.

Semiconductor power electronic devices are a key class of semiconductor devices that hugely affect the world we live in. Power electronics started with the development of the mercury arc rectifier. Invented by Peter Cooper Hewitt in 1902, it was used to convert alternating current (AC) into direct current (DC). From the 1920's on, research continued on applying thyratrons and grid-controlled mercury arc valves to power transmission. Uno Lamm developed a valve with grading electrodes making mercury valves usable for high voltage direct current transmission. In 1933 selenium rectifiers were invented [5].

In 1947 the bipolar point-contact transistor was invented by Walter H. Brattain and John Bardeen under the direction of William Shockley at Bell Labs. In 1948 Shockley's invention of the bipolar junction transistor improved the stability and performance of transistors, and reduced costs. By the 1950's, semiconductor power diodes became available and started replacing vacuum tubes. In 1956 the Silicon Controlled Rectifier (SCR) was introduced by General Electric, greatly increasing the range of power electronics applications [6]. In the 1960's the switching speed of bipolar junction transistors allowed for high frequency DC/DC converters. In 1976 power MOSFETs became commercially available. In 1982 the Insulated Gate Bipolar Transistor (IGBT) was introduced [6].

Power electronic devices may be used as switches, or as amplifiers. An ideal switch is either open or closed and so dissipates no power; it withstands an applied voltage and passes no current, or passes any amount of current with no voltage drop. Semiconductor devices used as switches can approximate this ideal property and so most power electronic applications rely on switching devices on and off, which makes systems very efficient as very little power is wasted in the switch. By contrast, in the case of the amplifier, the current through the device varies continuously according to a controlled input. The voltage and current at the device terminals follow a load line, and the power dissipation inside the device is large compared with the power delivered to the load [5].

The very high breakdown voltages, high electron mobility and saturation velocity of GaN has made it an ideal candidate for high-power and high-temperature power electronic devices, as evidenced by its high Johnson's Figure of Merit. Potential markets for high-power/high-frequency devices based on GaN include microwave radio-frequency power amplifiers (such as used in high-speed wireless data transmission) and high-voltage switching devices for power grids. A potential mass-market application for GaN-based RF transistors is as the microwave source for microwave ovens, replacing the magnetrons currently used. The large band gap means that the performance of GaN transistors is maintained up to higher temperatures than silicon transistors. The first gallium nitride metal semiconductor field-effect transistors (GaN MESFET) were experimentally demonstrated in 1993 and they are being actively developed. Other devices include pn junction diodes, Schottky diodes, field effect transistors (FET), junction field effect transistor (JFET), insulated gate bipolar transistors (IGBT), heterojunction bipolar transistors (HBT), and high electron mobility transistors (HEMT). Such devices can be deployed in many applications such as in automobiles, hybrid electric automobiles, cell phones, iphones, ipads, computers, and others [1 g 7].

In 2010 the first enhancement mode gallium nitride transistors became generally available. These devices were designed to replace power MOSFETs in applications where switching speed or power conversion efficiency is critical. These transistors, also called eGaN FETs, are built by growing a thin layer of GaN on top of a standard silicon wafer. This allows the eGaN FETs to maintain costs similar to silicon power MOSFETs, but with the superior electrical performance GaN [7].

SUMMARY

Embodiments of the invention provide methods for fabricating semiconductor devices based on high quality gallium and nitrogen containing epitaxial materials pseudomorphically grown on native gallium and nitrogen containing substrates such as GaN substrates. Typically these devices are fabricated using an epitaxial deposition of semiconductor device layers on a gallium and nitrogen containing substrate followed by processing steps on the epitaxial substrate and overlying epitaxial material. By using a selective etch process such as a photo electrochemical (PEC) etch combined with a bonding process at least a portion of the epitaxial material is transferred to the carrier wafer. Subsequently, the carrier wafer with the bonded epitaxial material is subjected to subsequent processing steps to form semiconductor devices including optical devices such as lasers and light emitting diodes, or electronic devices such as diode or transistor devices, Schottky diodes, pn diodes, transistors, field effect transistors, bipolar junction transistors, high electron mobility transistor, or solar cell devices. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, flat panel displays, curved or flexible panel displays, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like. In other embodiments the semiconductor devices are fully or partially formed in the epitaxial material before transfer to a carrier wafer or to an integrated circuit. What follows is a general description of the typical configuration and fabrication of these devices.

In one embodiment, the present invention is applied to the manufacturing of a display device. Specifically, the technology is used to make a highly efficient, cost effective, and high performance display based on micro-LEDs by transferring multiple color small LEDs to a common carrier such that the multiple color LEDs form individual pixels, which can be individually addressed to adjust the color and brightness of the pixel. Existing display devices based on liquid crystal technology are highly inefficient due to the use of multiple polarizers, color filters, light guides, and the need to electrically drive both the liquid crystal element and the backlighting element such as LEDs. Such displays typically result in single digit electrical to optical energy efficiency values and require complicated fabrication technologies with many elements leading to high cost. Advances have been made in organic LED [OLED] display technology over the past several years. However, OLED displays suffer from poor OLED efficiency, lower brightness, manufacturing challenges, and reliability barriers.

The present invention breaks the barriers associated with currently available display technology. Specifically, by patterning arrays of micro-LEDs into multiple donor wafers with different emission colors and then selectively transferring these LEDs onto a carrier or host wafer a 2-dimensional matrix of individual pixels comprising multiple color LEDs, such as red, green, and blue LEDs, can be configured. For example a first donor wafer comprised of a gallium and arsenic substrate can be fabricated to form an array of red emitting LED structures, a second donor wafer comprised of a gallium and nitrogen substrate can be fabricated to form an array of green emitting LED structures, and a third donor wafer comprised of a gallium and nitrogen substrate can be fabricated to form an array of blue emitting LED structures can be formed. Subsequently, the donor wafers can then be subjected to the transfer process described in this invention wherein only a fraction of the LED structures are transferred to a carrier wafer. In some embodiments the carrier wafer is comprised of a gallium and nitrogen containing substrate or a gallium and arsenic containing substrate, or an alternative substrate and comprises micro LEDs with one of the emission colors formed directly on the carrier wafer.

The carrier wafer is designed to receive the different color LEDs into pixel domains. The micro LEDs can be formed in various shapes such as circles, squares, rectangles, triangles, pentagons, hexagons, octagons, or any geometrical shape possible. The largest dimension of the LED emission areas could be smaller than 1 mm, smaller than 200 um, smaller than 100 um, smaller than 50 um, smaller than 20 um, smaller than 10 um, or smaller than 5um. The carrier wafer is comprised with an interconnect network configured to enable addressability of the micro LEDs in the pixels to generate high resolution display images. Any relevant interconnect schemes, configurations, processes could be taken from existing display technologies such as LCD or OLED, or even from other technologies such as imaging technologies like focal plane arrays (FPA) and applied to the present invention.

The present invention enables a highly manufacturable and cost efficient process for producing micro LED based displays not readily possible with prior art. Specifically, the current invention allows for a wafer level transfer process from a donor LED wafer to a common carrier wafer forming the display panel. Since it is a wafer level process, thousands, tens of thousands, or hundreds of thousands of LEDs can be transferred in one process step [depending on wafer size and pixed pitch] and hence avoiding any one-by-one pick and place techniques. This advantage can enable high throughput for low cost and high alignment tolerances for tight packing of the LEDs. Moreover, since it is a selective transfer process from the donor to the carrier and the pitch of the LEDs from the donor wafer to the carrier wafer can be expanded using the anchor technology, a much higher density of LEDs can be formed on the single color donor wafers than the final density of that single color as expanded on the carrier wafer to form the display panel. For example, a red donor wafer, green donor wafer, and blue donor wafer may be prepared with an LED pitch of X. At the transfer step to the first carrier wafer only ⅓ of the LEDs are transferred to the carrier wafer at a pitch of X/3 such that the resulting donor wafer has a repeating array of red, green, and blue LEDs that spaced from each other by X, but spaced from their next nearest neighbor with the same color by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In an example, the present invention provides a method for manufacturing a gallium and nitrogen containing semiconductor devices with low cost and/or improved performance. The method includes providing a gallium and nitrogen containing substrate having a surface region and forming epitaxial material overlying the surface region, the epitaxial material comprising a sacrificial release region and a specific layer stack of high quality epitaxial material designed for the semiconductor device to be fabricated in. For example, in a light emitting device such as and LED the stack would have at least one n-type gallium and nitrogen containing layer, an active region comprising at least one active gallium and nitrogen containing layer overlying the one or more n-type 1 gallium and nitrogen containing layer s, and one or more p-type gallium and nitrogen containing layers overlying the active region. In another example, in a Schottky diode power electronic device the layer stack would comprise at least a nominally undoped or intrinsic gallium and nitrogen containing layer and a least an n-type gallium and nitrogen containing layer. In yet another example, in a pn diode power electronic device the layer stack would comprise at least a nominally undoped or intrinsic gallium and nitrogen containing layer, a least an n-type gallium and nitrogen containing layer, and at least a p-type gallium and nitrogen containing layer. In yet another example, in a high electron mobility transistor (HEMT) power electronic device the layer stack would comprise at least two layers with different bandgaps such as GaN and AlGaN to form a 2 dimensional electron gas at the interface between the two layers with different bandgaps. The method includes patterning and then etching the epitaxial material to form a plurality of mesa regions corresponding to dice, each of the dice corresponding to at least one semiconductor device, such as an LED, a laser diode, an electronic device, a power electronic device, a solar cell device, or a combination thereof characterized by a first pitch between a pair of dice, the first pitch being larger than, equal to, or less than a design width. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

The method includes transferring each of the plurality of dice to a carrier wafer such that each pair of dice is configured with a second pitch between each pair of dice, the second pitch being less than, equal to, or larger than the first pitch corresponding to the design width. The method includes singulating the carrier wafer into a plurality of semiconductor devices on carrier chips.

In various embodiments the carrier wafer can be larger in diameter than the gallium and nitrogen containing substrate. For example the gallium and nitrogen containing substrate can be a 2" round substrate or a smaller GaN substrate and the carrier wafer can be a 4", 6", 8", or 12" round silicon, sapphire, or silicon carbide wafer. After the plurality of devices are transferred from the gallium and nitrogen containing substrate, the substrate can be prepared for re-use.

In an example, the present semiconductor device die configured with carrier, which can serve as a submount, can be packaged into a module without any further liftoff process or the like. The process is efficient and uses conventional process technology. Depending upon the embodiment, these and other benefits may be achieved.

In an example, the present invention enables the integration of different semiconductor devices onto a common carrier for integration to increase functionality of the resulting semiconductor chip formed on the carrier wafer.

The present invention achieves these benefits and others in the context of known process technology. However, a further understanding of the nature and advantages of the present invention may be realized by reference to the latter portions of the specification and attached drawings.

Various embodiments of this invention can be used to realize one or more of the following benefits for semiconductor devices based on gallium and nitrogen containing epitaxial material;

1. This invention enables wafer process of high quality pseudomorphically grown gallium and nitrogen containing devices on carrier wafers with very large diameter. For example, the gallium and nitrogen containing devices can be processed on 2", 4", 6", 8", 12" or even larger carrier wafers for dramatically reduced wafer fabrication costs compared to processing on native GaN substrates. Since current native GaN substrates are limited to 2" diameter in high volume and are only now being introduced at 4" diameter in low volume such substrates are far behind the scaling roadmap of the more mature silicon, sapphire, silicon carbide and other substrates. This invention enables wafer process of high quality gallium and nitrogen containing devices on carrier wafers of more mature substrate technologies, overcoming the limitations associated with small GaN wafer availability. As an example, laser, LED, and power electronic devices formed on native bulk GaN substrates are limited to 2" or 4" wafer fab, which is not competitive with devices formed on silicon, sapphire, silicon carbide. Of course, in some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

2. This invention enables the fabrication of semiconductor devices from high quality low-defect-density gallium and nitrogen epitaxial material pseudomorphically grown on native substrates with drastically reduced consumption of the native substrate such as a GaN substrate, allowing device implementation in applications where very low cost is critical. Using conventional growth and processing techniques on native GaN substrates is cost prohibitive since it requires consumption of the native substrates with each wafer fabrication. These native substrates are orders of magnitude more expensive than more mature substrate technologies such as silicon, sapphire, silicon carbide, gallium arsenide, and indium phosphide. Since this invention provides a method to transfer high-quality gallium and nitrogen containing material from a native gallium and nitrogen containing substrate to a carrier wafer without destruction of the native substrate, the native substrate can be re-used. This invention enables the native GaN substrate to be re-used 10 or more times. As an example, high electron mobility transistors are conventionally formed on silicon wafers, sapphire wafers, or silicon carbide wafers and are comprised of a buffer layer at the substrate interface to mitigate defects resulting from the heteroepitaxial structure. Although this heteroepitaxial approach is not ideal because the defects in the epitaxy can limit the device performance, it does enable the formation HEMT devices with sufficient performance and the required cost structure. However, this invention will enable HEMT devices to be fabricated from pseudomorphic epitaxial material for much lower defect density material with a very similar scale and cost structure.

3. This invention enables improved utilization of the high quality gallium and nitrogen containing through a "die expansion" technology. Since this invention enables the high quality gallium and nitrogen containing epitaxial material to be transferred to the carrier wafer at a different [i.e. larger] pitch than the pitch formed on the gallium and nitrogen containing substrate, the epitaxial material can be strategically positioned on the carrier wafer to only occupy regions where it is needed within the final semiconductor device. That is, the epitaxial semiconductor device layers can be sized and positioned only where they are needed within the final semiconductor device architecture. Since many finished semiconductor devices have chip area functioning to support bond pad regions, dissipate heat, help light extraction, etc. wherein active epitaxial material is not required, it is wasteful to use area that is occupied or was occupied by the costly epitaxial material. As an example, in a conventional GaN based laser device the typical chip width ranges from 150 um to 200 um, but the active laser stripe region wherein the epitaxial material is only about 1.5 um to about 30 um. Thus, the epitaxial material is only required on a small fraction of the chip. In this invention small GaN mesas can be positioned on the carrier wafer only where the laser stripe will be formed during wafer processing.

4. This invention enables the use of gallium and nitrogen containing nonpolar and semipolar oriented substrates in commercial semiconductor devices. The current small size and high cost of nonpolar and semipolar substrates limits their application to commercially viable semiconductor devices. Through the improved usage of substrate and epitaxial area by die expansion, the transfer of the epitaxy to large carrier wafers for device fabrication, and the ability to re-use the gallium and nitrogen containing substrates, the cost and size challenges can be overcome, enabling proliferation of nonpolar and semipolar based GaN devices in a wide range of applications.

BRIEF DESCRIPTION OF THE DRAWINGS

FIG. 1A is a simplified process flow for epitaxial preparation in an example of the present invention.

FIG. 1B is a simplified process flow for epitaxial preparation in an example using active region protect layers of the present invention.

FIG. 2A is a simplified process flow for bonding and then etching the sacrificial regions in an example of the present invention.

FIG. 2B is a simplified process flow for partially or nearly completely etching the sacrificial region and then bonding wherein the unetched regions act as anchors used for mechanical support to epitaxial mesas in an example of the present invention.

FIG. 2C is a simplified process flow for etching the sacrificial region and then bonding wherein non semiconductor anchor features are used for mechanical support to epitaxial mesas in an example of the present invention.

FIG. 2D is a simplified process flow for etching the sacrificial region and then bonding wherein semiconductor anchor features are used for mechanical support to epitaxial mesas in an example of the present invention.

FIG. 2E is a simplified top-view schematic of semiconductor anchor features providing mechanical support to epitaxial mesas in an example of the present invention.

FIG. 2F is a simplified side-view schematic of process flow for using semiconductor anchor features providing mechanical support to epitaxial mesas in an example of the present invention.

FIG. 2G is a simplified top-view schematic of metal anchor features providing mechanical support to epitaxial mesas in an example of the present invention.

FIG. 2H is a simplified side-view schematic of process flow for using metal anchor features providing mechanical support to epitaxial mesas in an example of the present invention FIG. 2I is a simplified schematic of electrical circuit formed during PEC etching with metal anchors connecting the anode and cathode in an example of the present invention.

FIG. 3A is a simplified side view of a selective area bonding process in an example of the present invention.

FIG. 4A is a simplified schematic diagram illustrating transferring epitaxy device layers from various substrate sizes to 100, 200 and 300 mm carrier wafers in an example of the present invention.

FIG. 4B is a simplified schematic illustrating how the of carrier wafer can be processed to form the submount of the final semiconductor device structure in an example of the present invention.

FIG. 5 is a simplified schematic process flow illustrating substrate re-use in an example of the present invention.

FIG. 6A is a simplified schematic of an epitaxial structure of an LED device according to an example of the present invention.

FIG. 6B is a simplified schematic of an epitaxial structure of an LED according to an example of the present invention.

FIG. 6C is a simplified schematic process flow of bonding of the LED device wafer epitaxial wafer to the carrier wafer in an example of the present invention.

FIG. 6D is a simplified top-view schematic process flow of bonding of the LED device wafer epitaxial wafer to the carrier wafer in an example of the present invention.

FIG. 6E is a simplified top-view schematic illustration of die expansion of an LED device epitaxial structure in an example of the present invention.

FIG. 6F is a simplified schematic illustration of die expansion of an LED device epitaxial structure with a non-rectangular shape in an example of the present invention.

FIG. 6G is a simplified schematic illustrating the formation of a micro LED display panel example according to the present invention.

FIG. 6H is a simplified schematic illustrating the formation of a micro LED display panel example according to the present invention.

FIG. 6I is a simplified schematic illustrating the formation of a micro LED display panel example according to the present invention.

FIG. 6J is a simplified schematic illustrating the formation of a micro LED display panel example according to the present invention.

FIG. 6K is a simplified schematic illustrating an example of a multiplexing configuration in a transferred micro LED display array according to this invention.

FIG. 6L is a simplified schematic illustrating an example of a multiplexing configuration in a transferred micro LED display array according to this invention.

FIG. 6M is a simplified schematic illustrating the micro LED display apparatus example according to the present invention.

FIG. 7A is a simplified schematic of an epitaxial structure of a laser diode according to an example of the present invention.

FIG. 7B is a simplified schematic cross-section of a structure of a laser diode device according to an example of the present invention.

FIG. 7C is a simplified cross-sectional schematic illustration of die expansion of a laser diode device structure in an example of the present invention.

FIG. 7D is a simplified top-view schematic illustration of die expansion of a laser diode device epitaxial structure in an example of the present invention.

FIG. 7E is a simplified top-view schematic illustration of die expansion of a laser diode device epitaxial structure in an example of the present invention.

FIG. 8A is a table listing example material properties of GaN, SiC, and Si at 300K.

FIG. 8B is a plot of theoretical on-resistance vs blocking voltage for GaN, SiC, and Si.

FIG. 9A is a simplified schematic of an epitaxial structure of a Schottky diode power device according to an example of the present invention.

FIG. 9B is a simplified schematic cross-section of a structure of a Schottky diode power device according to an example of the present invention.

FIG. 9C is a simplified schematic of an epitaxial structure of a Schottky diode power device according to an example of the present invention.

FIG. 9D is a simplified schematic cross-section of a structure of a Schottky diode power device according to an example of the present invention.

FIG. 10A is a simplified schematic of an epitaxial structure of a p-n diode power device according to an example of the present invention.

FIG. 10B is a simplified schematic cross-section of a structure of a p-n diode power device according to an example of the present invention.

FIG. 10C is a simplified schematic of an epitaxial structure of a p-n diode power device according to an example of the present invention.

FIG. 10D is a simplified schematic cross-section of a structure of a p-n diode power device according to an example of the present invention.

FIG. 11A is a simplified example of a conventional HEMT device formed epitaxially on a foreign substrate.

FIG. 11B is a simplified schematic of an epitaxial structure of a HEMT device according to an example of the present invention.

FIG. 11C is a simplified schematic cross-section of a structure of a HEMT device according to an example of the present invention.

FIG. 11D is a simplified schematic cross-section of a structure of a HEMT device according to an example of the present invention.

FIG. 11E is a simplified schematic cross-section of a structure of a HEMT device according to an example of the present invention.

FIG. 11F is a simplified schematic of an epitaxial structure of a HEMT device according to an example of the present invention.

FIG. 11G is a simplified schematic cross-section of a structure of a HEMT device according to an example of the present invention.

FIG. 11H is a simplified schematic cross-section of a structure of a HEMT device according to an example of the present invention.

FIG. 11I is a simplified schematic cross-section of a structure of a HEMT device according to an example of the present invention.

FIG. 11J is a simplified schematic cross-section of a structure of a HEMT device according to an example of the present invention.

FIG. 11K is a simplified schematic cross-section of a structure of a HEMT device according to an example of the present invention.

FIG. 11L is a simplified schematic of an epitaxial structure of a HEMT device according to an example of the present invention.

FIG. 11M is a simplified schematic cross-section of a structure of a plurality of HEMT devices formed on a bulk GaN substrate according to an example of the present invention.

FIG. 11N is a simplified schematic cross-section of a structure of a plurality of HEMT devices selectively bonded to multiple carrier wafers or printed circuit boards according to an example of the present invention.

FIG. 12A is a simplified cross-section schematic example of preparation of Schottky diode epitaxial device layers for die expanded transfer according to one embodiment of this invention.

FIG. 12B is a simplified cross-sectional schematic example of selective bonding of Schottky diode epitaxial device layers for die expansion according to one embodiment of this invention.

FIG. 12C is an example top-view schematic of conventional Schottky diode device.

FIG. 12D is an example cross-sectional view of a conventional Schottky diode device.

FIG. 12E is an example cross-sectional view of Schottky diode device according to this invention.

FIG. 12F is an example top-view schematic of conventional HEMT device.

FIG. 12G is an example cross-sectional view of a conventional HEMT device.

FIG. 12H is an example cross-sectional view of HEMT device according to this invention.

FIG. 13A is a simplified schematic example of semiconductor device integration onto a common carrier wafer according to this invention.

FIG. 13B is a simplified schematic example of semiconductor device integration onto a common carrier wafer according to this invention.

FIG. 13C is a simplified schematic example of semiconductor device integration onto a carrier wafer configured with device functionality.

DETAILED DESCRIPTION

Embodiments of the invention provide methods for fabricating semiconductor devices based on gallium and nitrogen containing epitaxial materials grown on bulk gallium and nitrogen containing substrates. Typically these devices are fabricated using an epitaxial deposition on a gallium and nitrogen containing substrate followed by processing steps on the epitaxial substrate and overlying epitaxial material. In some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. By using a selective etch process such as a photoelectrochemical (PEC) etch combined with a bonding process at least a portion of the epitaxial material is transferred to one or more carrier wafers. Subsequently, the carrier wafer with the bonded epitaxial material is subjected to processing steps to form semiconductor devices including optical devices such as lasers and light emitting diodes, or electronic devices such as Schottky diode, pn diode, transistors, field effect transistors, bipolar junction transistors, high electron mobility transistor, or solar cell devices. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, flat panel displays, curved or flexible panel displays, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like. What follows is a general description of the typical configuration and fabrication of these devices.

The invention involves a semiconductor device wafer composed of one or more sacrificial layers and one or more device layers overlying the surface region of a substrate wafer. The substrate wafer comprising a bulk gallium and nitrogen containing material such as GaN, but can be others. In the example of a GaN substrate, the GaN substrate can be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the substrate surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

Current state of the art is to use bulk GaN substrates produced by growth of reduced defect density boules either by hydride vapor phase epitaxy or ammonothermal growth. In both cases relatively large (e.g. typically two inch diameter or greater) GaN c-plane substrates can be produced which have relatively low density of uniformly distributed defects. Growth on c-plane wafers is advantageous to growth on non-polar and semi-polar oriented GaN wafers only in the aspect that two-inch and greater diameter c-plane wafers are currently available and non-polar and semi-polar orientations are generally restricted in size due to their being crosscut from c-plane oriented boules.

Polar c-plane GaN wafers with no offcut are oriented primarily with the surface normal parallel to the [0001] direction of the wurtzite crystal lattice. The wafer may have an offcut, where the surface normal of the wafer is tilted towards one or a combination of the <11-20> or <10-10> directions. For an arbitrary offcut direction one would normally specify the tilt towards orthogonal pairs of directions found in the <11-20> and <10-10> families. For example, [10-10] and [1-210] are orthogonal and might be used to specify an arbitrary offcut. In general, offcuts will be predominantly towards only one of the <11-20> or <10-10> directions, with only relatively small deviations. For example, a c-plane wafer may have an offcut between 0.1 and 10 degrees towards the [10-10] direction or it may have an offcut between 0.1 and 10 degrees towards the [11-20] direction. Though larger and smaller offcuts would be possible, a wafer with an offcut less than 0.1 degrees would be considered to be nominally on-axis.

Wafer offcut is important because it will determine both the density of atomic steps on the wafer surface as well as the termination of the step edges. Because an arbitrarily oriented surface of a crystal is likely to have a high surface energy, a crystal will tend to form an approximation of an inclined face using a collection of low energy planes. In general, an offcut c-plane wafer would result in a stepped surface comprised of [0001] step surfaces and step-edges composed of prismatic planes (i.e. (11-20) or (10-10)). Due to anisotropy in the crystal structure the number and configuration of dangling bonds at (11-20) step edges will be different from those at a (10-10) step edge. Since the direction and magnitude of the offcut controls the density and orientation of the step edges, a large amount of control over the chemical character of the substrate can be affected by offcut. Many growth processes such as chemical ordering, incorporation of volatile species and formation of stacking faults can be linked to the way atoms incorporate at the edges of steps. Therefore, proper selection of substrate offcut is critical to achieving the best epitaxial film quality.

Though c-plane wafers are larger than non-polar and semi-polar oriented wafers and offer a cost advantage, they have a severe drawback is in some semiconductor devices that result from internal fields originating from spontaneous and piezo induced polarization fields. In light emitting devices that use quantum wells, the internal polarization field result in a spatial separation of electron and hole states within the quantum wells that negatively impacts the radiative recombination efficiency. Using narrow wells has been the approach taken in both LED and laser devices based on polar GaN. In LEDs, the narrow quantum wells lead to high carrier density, which exacerbates the droop phenomenon that leads to the nonlinear light output versus current input of LEDs, and ultimately limits the efficiency. In laser devices the quantum wells are not effective at guiding the optical mode due to the limited index contrast that can be achieved between the active region and GaN cladding layers. In order to increase the index contrast between the active region and the cladding layers and thereby increase the optical confinement, c-plane devices typically utilize aluminum containing cladding layers. By using nonpolar or semipolar GaN substrate orientations for LEDs and laser diodes, these internal fields can be reduced and improved performance is possible. Similarly, in electronic devices there are aspects wherein having reduced internal fields or reduced polarization fields, semiconductor electronic devices with improved performance can be formed.

The limited currently available size and increased cost of nonpolar and semipolar substrates limits their practicality for deployment in commercial semiconductor devices. A powerful breakthrough enabled by this present invention is the use of nonpolar or semipolar substrates at a low cost since die expansion can be used, substrates can be re-used, and the overlying epitaxy of small wafers can be transferred onto larger carrier wafers for device fabrication. In a specific embodiment, the gallium nitride substrate member is a bulk GaN substrate characterized by having a semipolar or nonpolar crystalline surface region, but can be others. In a specific embodiment, the bulk nitride GaN substrate comprises nitrogen and has a surface dislocation density between about $10E5\ cm^{-2}$ and about $10E7\ cm^{-2}$ or below $10E5\ cm^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10E5\ cm^{-2}$ and about $10E8\ cm^{-2}$, in a direction that is substantially orthogonal or oblique with respect to the surface. As a consequence of the orthogonal or oblique orientation of the dislocations, the surface dislocation density is between about $10E5\ cm^{-2}$ and about $10E7\ cm^{-2}$ or below about $10E5\ cm^{-2}$.

Of course, in some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

Another advantage offered by the present invention is the ability to access either the Ga-face or the N-face of the gallium and nitrogen containing epitaxial device layers for device fabrication and contact formation. For example, if the epitaxial layers are grown on a Ga-face substrate the epitaxial layers will be formed terminating with a Ga-face surface. After the epitaxy is transferred to the carrier wafer for process the N-face will be exposed for process. The N-face may provide an advantage to the device such as an improved contact property or an improved behavior for the semiconductor layers. In the case where it is desirable to do the device fabrication with the Ga-face on the surface, semiconductor process steps may be performed on the epitaxial wafers prior to transfer to the carrier wafer. The order of the epitaxial stack can be arranged to provide the most benefit to the device.

Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is used to fully or partially remove the one or more sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the one or more sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

The preparation of the epitaxy wafer is shown in FIG. 1A. A substrate 100 is overlaid by a buffer layer 101, a selectively removable sacrificial layer 107, an buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching.[8,9] The first step depicted in FIG. 1A is a top down etch to expose the sacrificial layers, followed by a bonding metal deposition as shown in FIG. 1A. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall, as shown in FIG. 1B. The device layers 102 are exposed using an etch and an etch resistant protect layer 104 is deposited overlaying the edges of the device layers such that they are not exposed to the etch chemicals. The sacrificial layer is then exposed by an etch of vias. A bonding layer 108 is deposited and a selective etch process is used to remove the sacrificial layers. In some embodiments the bonding layer is deposited after the selective etch. This work flow is advantageous when the device layers are susceptible to damage from the etch process used to remove the sacrificial layer. With the sacrificial region exposed a bandgap selective PEC etch is used to undercut the mesas. At this point, the selective area bonding process shown in FIG. 1B is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In one embodiment wherein the semiconductor device comprises active light emitting layers such as LEDs, PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with one or more of acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In another embodiment, the carrier wafer is selected based on size and cost. For example, single crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

In one embodiment of this invention, the bonding of the semiconductor device epitaxial material to the carrier wafer process can be performed prior to the selective etching of the sacrificial region and subsequent release of the gallium and nitrogen containing substrate. FIG. 2A is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 2A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer.

The device layers can be comprised of many configurations suited for the specific semiconductor device. For example, an LED device structure would be comprised of one or more n-type gallium and nitrogen containing layers, an active region comprised of one or more quantum well layers, and one or more p-type gallium and nitrogen layers. In another example, a laser diode device structure would be comprised of one or more n-type gallium and nitrogen containing cladding layers, an active region comprised of one or more quantum well layers, and one or more p-type gallium and nitrogen cladding layers. In yet another example, a p-n diode device would be comprised structure would be comprised of at least one or more n-type gallium and nitrogen containing layers and one or more p-type gallium and nitrogen layers. In yet another example, a Schottky diode device would be comprised of an n-type gallium and nitrogen containing layer and a very low doped layer intended to be an intrinsic layer. As used herein, the term intrinsic or intrinsic region is used to describe a semiconductor material with very low doping or carrier concentration. The intrinsic region can be formed by growing epitaxial materials that are not intentionally doped [ND], unintentionally doped [UID], or may be intentionally doped to compensate the unintentional background doping to reduce the carrier concentration. The intrinsic region is typically configured as an insulating region, a semi-insulating region, or a drift region. The epitaxial material is subjected to processing steps such as metal and dielectric deposition steps, lithography, and etching steps to form mesa regions with a bond region on the top. The carrier wafer 108 which is patterned with bond pads 107 is brought into contact with the bond layers 105 using a precision alignment process. After the bonding process is complete, the sacrificial etch is carried out. The selective etch of the sacrificial layer releases the mesas from the substrate.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In an example, FIG. 2B is a schematic representation of the "etch then bond" process flow where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing substrate prior to the bonding step wherein they are releases from the gallium and nitrogen containing substrate and transferred to the carrier wafer.

Anchor regions are special features that can be designed into the photo masks which attach the undercut device layers to the gallium and nitrogen containing substrate, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. FIG. 2C is a schematic representation of the "etch then bond" process flow where the mesas are retained on the substrate by deposition of an etch resistant material acting as an anchor by connecting the mesas to the substrate. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photo-electrochemical etch process for selectively removing the sacrificial layer. A layer of etch resistant material 107, which may be composed of metal, ceramic, polymer or a glass, is deposited such that it connects to both the mesa and the substrate. The selective etch process is carried out such that the sacrificial layer is fully removed and only the etch-resistant layer 107 connects the mesa to the substrate FIG. 2D is a simplified schematic representation of the "etch then bond" process flow where the mesas are retained on the substrate by use of an anchor composed of epitaxial material. A substrate wafer 101 is overlaid by a buffer layer 102, a selectively etchable sacrificial layer 104 and a collection of device layers 101. The sacrificial layer is exposed using the process described in FIG. 1A. The bond layer 105 is deposited along with a cathode metal 106 that will be used to facilitate the photoelectrochemical etch process for selectively removing the sacrificial layer. The anchor is shaped such that during the etch, a small portion of the sacrificial layer remains unetched 108 and creates a connection between the undercut mesa and the substrate wafer.

In one embodiment the anchors are positioned either at the ends or sides of the undercut die such that they are connected by a narrow undercut region of material. FIG. 2E shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

FIG. 2E shows a top-view schematic of an example of a transferable mesa of GaN epitaxial material with a metal anchor bridging between the bond metal on the top of the mesa and the cathode metal in the etched field. FIG. 2F presents a cross-sectional view of an example of a transferable semiconductor device layer mesa at the location of a metal anchor. Here the mesa is formed by dry or wet chemical etching, and for an example of an LED structure includes the one or more p-type GaN layers, the light emitting layers, and the one or more n-type GaN layers, the sacrificial layer, and a portion of the n-type GaN epitaxial layer beneath the sacrificial layer. A p-contact metal is first deposited on the p-type GaN in order to form a high quality electrical contact with the p-type GaN. A second metal stack is then patterned and deposited on the mesa, overlaying the p-contact metal. The second metal stack consists of an n-contact metal, forming a good electrical contact with the n-type GaN beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

FIG. 2G is a schematic representation of charge flow in a device using a metal anchor during PEC etching of the sacrificial layer. It is possible to selectively etch the sacrificial layer even if the pump light is absorbed by the active region. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal anchors where they recombine. The flat band conditions in the sacrificial region result in a buildup of holes that result in rapid etching of the sacrificial layers.

The use of metal anchors as shown have several advantages over the use of anchors made from the epitaxial device material. The first is density of the transferable mesas on the donor wafer containing the epitaxial semiconductor device layers and the gallium and nitrogen containing bulk substrate or on the foreign substrate in the case of heteroepitaxy. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers.[9,10] Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate or foreign substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

FIG. 3A is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 3A, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 3A. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 3A. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 micron and about 500 microns wide or between about 500 micron and about 3000 microns wide and between about 100 and about 3000 µm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

In some embodiments, multiple semiconductor device die are transferred to a single carrier wafer and placed within close proximity to each other. Dice in close proximity are preferably within one millimeter of each other, but could be other.

In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

A most important breakthrough of this technology is enabling the die expansion technology as described above. By enabling the gallium and nitrogen containing epitaxial layer dice to be transferred to the carrier wafer at a larger pitch the expensive gallium and nitrogen containing substrate and epitaxial device layers can be more efficiently utilized. Additionally, a larger area will be required on the carrier wafer than the area of the gallium and nitrogen containing substrate. For example, in a fix expansion configuration, a carrier wafer with 4 times larger area will be required to receive all of the transferred device dice. This is powerful feature for GaN devices formed on GaN substrates since currently bulk GaN substrates are commercially available in 2" diameter with recent announcements of 4" diameter sampling. These wafer diameters are relatively small compared to the well-established silicon substrate technology, which are currently available at diameters up to 12". For example, a 12" substrate has 36 times the substrate area of a 2" GaN substrate and 9 times the substrate area of a 4" GaN substrate, which are not yet available in high volume. This drastically larger area enables device processing with orders of magnitude more device die per wafer to provide massive reductions in manufacturing costs.

FIG. 4A is an illustration of bondable area for various substrate dimensions on a 100 mm diameter carrier wafer 1001. In this configuration die expansion is happening in one dimension only. The number of transfers possible is fixed by the size and shape of the substrate relative to the carrier. Several examples are shown, including 25.4 mm diameter wafers 1002, 32 mm diameter wafers 1003 and 2×2 cm² substrates 1004. Other combinations of 50 mm diameter substrates 1006 and various carrier wafers are shown: 100 mm 1001, 200 mm 1005 and 300 mm 1007.

Selection of the carrier wafer with high thermal conductivity (e.g. greater than about 150 K/mW) can offer many advantages including enabling a lower device operation temperature, which typically improves device performance. In addition, a high thermal conductivity submount may also allow for the use of full thickness carrier wafers (e.g. >about 300 microns) with low thermal resistance, therefore no thinning of the carrier wafer is required. In another embodiment of the invention bar and die singulation is achieved with a sawing process. Sawing is a well-established process used for the singulation of LEDs and other semiconductor devices.

In one example where high thermal conductivity is desired, SiC is used as both a carrier and a submount. SiC is available in wafer diameters up to about 150 mm from multiple vendors with high thermal conductivities ranging from about 360-490 W/mK depending on the crystal polytype and impurities. FIG. 4B (12) shows a schematic of the cross section of a SiC wafer 402 used as both a carrier wafer and a submount for a resulting semiconductor device. Before transfer of the device material the SiC wafer is fabricated with a bonding layer 401 for attachment to the semiconductor device package. The opposing face of the SiC wafer is fabricated with a thin, electrically insulating layer 403, electrically conductive traces and wire-bond pads 405 and an electrically conductive bonding media 108. The device material is then transferred to the carrier via previously described processes. Electrical isolation layers 408 are fabricated on the wafer using standard lithographic processes and electrical contacts and wire bond pads 407 are made to the top-side of the semiconductor device. The electrical isolation layers are important to insure that the semiconductor devices are electrically isolated from the package or heat sink. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401.

After completion of fabrication of the semiconductor devices on the carrier wafer, the carrier wafer will be diced into semiconductor devices in a die singulation process. In one embodiment of the invention, the die singulation is achieved with a sawing process. Sawing is a well-established process used for the singulation of LEDs and other semiconductor devices. For example, DISCO saws can be used. DISCO's dicing saws cut semiconductor wafers (Si, GaAs, etc.), glass, ceramic, and a wide variety of other materials at a level of precision measured in micrometers.

In another embodiment of the invention the die singulation is achieved by a scribing and breaking process. For example, a diamond or laser scribing process may be used wherein the carrier wafer is subjected a scribing. In the case of a laser scribing process, a UV laser may be used induce a scribe profile in the carrier substrate. The carrier substrate is then subjected to a breaking process.

In another embodiment of the invention the die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment the carrier wafer is a device wafer itself. In one example, the carrier wafer is a silicon wafer and comprised of Si Complementary metal-oxide-semiconductor (CMOS) devices such as transistors.

Another advantage is that this invention transfers the epitaxial material comprising the semiconductor device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. Since it is both substrate size and substrate cost associated with many types of semiconductor devices formed on bulk gallium and nitrogen containing substrates preventing mainstream adoption, this technology overcomes this barrier and can enable mainstream adoption of highly cost sensitive devices such as LEDs and power electronic devices. Relative to more mature substrate technologies such as silicon, sapphire, and silicon carbide, GaN substrates are both small and expensive. This in itself is prohibitive to the realization of cost competitive LED and electronic power devices using conventional methods on bulk GaN substrates. By enabling both die expansion and substrate re-use, this invention breaks those barriers and allows for the fabrication of high performance LED devices and power devices at a competitive cost. Moreover, it enables the fabrication of GaN-based laser diodes at a fraction of the cost of laser diodes fabricated with conventional technologies where die expansion and substrate re-use are not possible.

In this invention the substrate can be recycled by reconditioning the surface to an epi-ready state using a combination of one or more of lapping, polishing and chemical mechanical polishing. Substrate recycling would require removal of any variation in wafer height remaining from the transfer process. FIG. 5 is an illustration of a substrate re-use process. According to this embodiment, an epitaxial substrate 504 is provided. An epitaxial process is carried out where a buffer-layer 503 is deposited with a thickness between 1 and 50 microns. The buffer layer consists of the same material as the substrate. The buffer layer is overlaid by the selectively removable sacrificial layer 502 and the device layers 501. The epitaxial wafer is then processed in accordance with embodiments of this invention including deposition of a cathode layer 505 and a bond layer 506. The selective etch and bond process is carried out such that the device mesas are transferred from the substrate. The substrate now consists of the original substrate, the buffer layer which is now patterned with mesas and trenches and the cathode layer. The cathode layer is optionally removed with etches. Finally, the buffer layer is removed by lapping, polishing and chemical mechanical polishing (CMP) such that the semiconductor substrate surface is returned to an equivalent condition as before the epitaxial growth. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process. Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (<about 10 nm) roughness. Final cleaning steps may include use of a surfactant to remove residual slurry as well as cleans to remove contaminants such as exposure to acidic solutions (for example HCl, HCl:$HNO_3$, HF and the like) and exposure to solvents (for example isopropanol, methanol and acetone). In some embodiments the buffer layer thickness is chosen such that the substrate thickness is not reduced after lapping and CMP. In other embodiments the substrate is allowed to thin during successive reclamations. We estimate a substrate could be recycled more than 10 times without significant change in thickness. In some embodiments, the epitaxial layers include thick buffers that are subsequently removed by the recycling process, thereby leaving the net thickness of the substrate unchanged or even enabling the thickness to increase.

With the basics of the invention describing the transfer of the gallium and nitrogen containing device layers from the bulk gallium and nitrogen containing substrate to a carrier wafer using a PEC undercut and bonding technology described that enables die expansion, leveraging of large carrier wafer size for fabrication, re-use of native gallium and nitrogen containing substrates, and integration of multiple functionality semiconductor devices, specific examples of device layers and the resulting devices can now be described. This invention can be extended to many and almost all semiconductor devices so the descriptions provided here are merely examples and there could be many others.

Of course, in some embodiments of the present invention the gallium and nitrogen containing epitaxial device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

In an embodiment of this invention, the epitaxial device layers comprise an AlInGaN light emitting diode (LED). AlInGaN LEDs contain n-type and p-type cladding layers surrounding light emitting layers. The p-GaN is typically kept thin with p-GaN thicknesses typically on the order of 100-300 nm and preferably on the order of 0.5 to 1.5 times the wavelength in GaN of the light emitted from the LED. The p-contact metal is usually either highly reflective, such as Ag, or in the case where light is extracted through the p-GaN surface the contact is formed from a transparent conductive oxide [i. e., ITO or ZnO] such that adequate current spreading is achieved in the relatively resistive but thin p-GaN. The n-type cladding is normally thicker than the p-type. Often the surface of the n-type GaN is roughened or the interface between the n-type GaN and a heteroepitaxial substrate (as in the case of GaN grown on sapphire) is roughened so as to scatter light out of the crystal.

AlInGaN LEDs are typically more efficient as the operational current density is reduced. In order to produce useful amounts of light with high efficiency, LED die tend to be relatively large compared to other devices such as laser diodes. State of the art LEDs often have areas bigger than 1 mm2, and at industry standard operating currents of 350, 750 and 1000 mA operate at current densities of 35, 75 and 100 A/cm2. These current densities are 1-2 orders of magnitude lower than typical operational current densities for state of the art high-power blue-light-emitting GaN laser diodes. Due to the large amount of epitaxial material used in LEDs it is highly advantageous for manufacturers to utilize as high a fraction of the epitaxial material as possible from each wafer, and unlike a conventional laser diode the majority of the device area is light emitting. In typical AlInGaN LED manufacturing processes, the die are singulated from the epitaxial device wafer by thinning and either cleaving or sawing the wafer. The dice are then transferred to a submount using a serial pick-and-place process. The submount is typically formed from a wafer or tile of electrically insulating material, can be patterned with bond pads and electrical interconnects, acts as a mechanical support for the LED die, provides a means of electrical access to the die, supports primary optics and encapsulation materials which are in general formed from silicone and often supports accessory semiconductor devices such as diodes providing protection from electrostatic discharge damage.

In an embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical (PEC) etch process where the sacrificial InGaN is optically pumped with wavelengths of light shorter than 450 nm. Overlying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is an active region consisting of one or more InGaN quantum wells with thickness between 1.5 and 10 nm separated by barriers of substantially wider bandgap. Typically the barriers will be formed from GaN. Overlying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3. An example of this embodiment is shown in FIG. 6A. The n-type InGaN buffer is typically included to improve the internal quantum efficiency of the LED. Many explanations are given for the mechanism behind this improvement, including relaxation of strain in the active region quantum wells, a surfactant effect of the indium resulting in advantageous surface morphology during active region growth and alteration of the electric fields in the active region.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that shown in FIG. 6A wherein the GaN substrate would be replaced by the foreign substrate such as sapphire, SiC, or silicon. Further, in many embodiments of heteroepitaxial growth a nucleation layer would be included on the foreign substrate underlying the buffer layer.

In another embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical etch process where the sacrificial InGaN is optically pumped with wavelengths of light shorter than 450 nm. Overlying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an active region consisting of one or more InGaN quantum wells with thickness between 1.5 and 10 nm separated by barriers of substantially wider bandgap. Typically the barriers will be formed from GaN. Overlying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3. An example of this embodiment is shown in FIG. 6B.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that shown in FIG.

6B wherein the GaN substrate would be replaced by the foreign substrate such as sapphire, SiC, or silicon. Further, in many embodiments of heteroepitaxial growth a nucleation layer would be included on the foreign substrate underlying the buffer layer.

In an embodiment, blue and green LEDs based on gallium and nitrogen containing epitaxial materials could be provided by heteroepitaxial growth of on a substrate that is not gallium nitride. These heteroepitaxial substrates may include sapphire, SiC, gallium oxide, spinel, lanthanum aluminate, magnesium oxide, and silicon among others. The orientation of these gallium and nitrogen containing epitaxial films may be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the film surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

In an example embodiment, a gallium and nitrogen containing epitaxial film is deposited via heteroepitaxial growth on a sapphire substrate. The sapphire substrate is first overlaid with a nitrogen containing nucleation layer. Typically the nucleation layer material is GaN, though it may also be AlN or AlGaN and may also contain a layer provided by converting part of the sapphire wafer surface. For example, the surface of the sapphire wafer could be converted from $Al_2O_3$ to AlN or $AlO_xN_y$ (where x+y=1) by exposing the sapphire substrate to ammonia at high temperatures in the MOCVD reactor. The nucleation layer is grown relatively cold, at a temperature below 700 degrees Celsius. Relatively cold growth is used to produce a high density of individual GaN crystals on the substrate surface. Each crystal of the nucleation layer is partially or fully strain-relaxed, which is accommodated by a network of misfit dislocations that form at the interface between the nucleation layer and the substrate. The substrate is then annealed in the MOCVD reactor at elevated temperature; typically above 1000 degrees Celsius. The anneal is intended to refine the grain structure of the nucleation layer by desorbing material such that smaller grains are fully desorbed. After the anneal, a gallium and nitrogen containing "buffer" or "coalescence" layer is grown. The buffer layer is grown under conditions promoting lateral growth of gallium and nitrogen containing crystals preferentially to vertical growth. This results in the coalescence of the individual crystals into a continuous and fully dense film covering the sapphire surface. When individual crystals coalesce into a continuous film the misfit dislocations that relieve strain turn upwards at the boundaries between the individual crystals and form a network of threading dislocations that extend through the thickness of the epitaxial film. Threading dislocation density of the resulting gallium and nitrogen containing film is dependent on three factors: minimizing the number of crystals in the nucleation layer and thereby limiting the amount of interface between coalescing crystals, selecting conditions for nucleation layer growth and anneal that minimize misorientation of the nitrogen containing crystals relative to the heteroepitaxial substrate crystal orientation, and selection of buffer layer growth conditions that cause threading dislocations to bend such that as the epitaxial layers are grown thicker threading dislocations have the opportunity to intersect and either combine or annihilate such that the total threading dislocation density is reduced. By using such techniques, it is possible to achieve threading dislocation densities in the range of 1E7-1E8 $cm^{-2}$.

The fully coalesced epitaxial layer is then overlaid with a gallium and nitrogen containing buffer layer where dislocation density is further reduced and surface morphology improved; i.e. made smoother. The buffer layer is overlaid by a sacrificial layer as previously described to be used in the selective removal of the epitaxial device layers from the heteroepitaxial substrate. The sacrificial layer is overlaid by an n-type conducting cladding layer (n-cladding). The n-cladding layer is overlaid by the light emitting layers and other layers comprising the active region of the device and which may have the same or similar designs to those of homoepitaxially grown devices on bulk gallium and nitrogen containing substrates as previous described, The active region is overlaid by a p-type conducting cladding layer (p-cladding). The n-cladding may contain a more highly n-type doped layer which is exposed by the device transfer and fabrication process and which is used to make low-resistance, ohmic contacts to the n-cladding. The p-cadding is terminated by a more highly p-type doped layer which is the last layer grown in the process and which is used to make an electrical contact to the p-cladding with relatively low-resistance and relatively low schottky barrier.

In some embodiments, the nucleation and buffer layers are used to chemically passivate the heteroepitaxial substrate. For example, in growth on silicon and SiC it is possible for a gallium-rich environment to result in dissolution of the substrate yielding degradation of the substrate surface morphology as well as subsequent unintentional doping of the heteroepitaxial layers with silicon or carbon. In an example, a nucleation layer of AlN grown under highly nitrogen rich conditions is used as a nucleation layer on Si and SiC substrates to prevent gallium from accessing the substrate surface.

In some cases, the heteroepitaxial gallium and nitrogen containing device layers are highly strained. This can be caused either by growth on a heteroepitaxial substrate with a very large difference in lattice constant relative to GaN or, as is the case silicon when the thermal expansion coefficient of the heteroepitaxial substrate is small relative to GaN and related alloys. In this case, while the heteroepitaxial films may be sufficiently lattice matched to the substrate during growth, after growth is complete and the epitaxial wafer is cooled to room temperature, the gallium and nitrogen containing epitaxial films reduce in lattice constant more than the substrate, which places the films under a large tensile stress. Such large tensile stresses can result in film cracking. In an embodiment, a heteroepitaxial film is grown on silicon such that it is under compressive strain during growth. The compressive strain is chosen such that the film is under a small strain or no strain after cooling to room temperature. In an example, a AlGaN nucleation layer is used or a thick AlGaN buffer layer is grown and partially or fully relaxed and overlaid with a GaN layer. Because the relaxed AlGaN layer has a smaller lattice constant than GaN, the GaN film is grown under compression, such that upon cooldown the net tensile strain imposed by the mismatch in coefficient of thermal expansion with the silicon substrate is partially or fully canceled by the compressive strain of the GaN film.

In another embodiment of this invention the LED device wafer does not contain separate n-InGaN buffer layers and InGaN sacrificial layers. Rather the InGaN buffer layer and the sacrificial layer are the same. In this case either the composition of the InGaN buffer is increased such that it absorbs the pump light for PEC etching, or the wavelength of the PEC etch pump light is shortened to a wavelength absorbed by the n-InGaN buffer.

In an embodiment the LED mesa is fabricated with both a p-contact metal and an n-contact metal before transfer. This is shown in the left-hand side of FIG. 6C in a schematic cross-section. The carrier wafer 209 has two sets of bond pads 206 and 208 that correspond to the on-die p-type bond pad 205 and on-die n-type bond pad 207 respectively. To form the on-die n-type bond pad A via is etched through the p-type 204 and active region 203 layers exposing the n-type layer 202. In this depiction, the removed sacrificial layer is shown between the mesa layers and the epitaxial substrate 201. Metal anchors would be used in this embodiment, but are not shown in this depiction. The right-hand side of FIG. 6C shows the die on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. Bonding alignment tolerances using modern flip-chip bonders is on the order of several microns or less, which is adequate for aligning these types of vias in relatively large area LED mesas. Bonding in this way is advantageous because it allows for immediate on-wafer testing of devices after transfer, exposes the entire n-type GaN surface to allow for roughening to enhance light extraction and does not require any opaque metal features on the n-type GaN surface that might block light. The p-type contact would act as a reflector, and as such must be formed from a material with low absorption of the emitted light. The preferred metal is silver, which has the highest reflectivity in the visible range of light wavelengths. Aluminum could be used, but would not form a good electrical contact to p-type GaN by itself. Aluminum would need to be combined with a transparent conductive oxide (TCO) such that the TCO formed a transparent contact to the p-type GaN and the aluminum formed the electrical contact to the TCO as well as the reflective surface. The n-type contact metal can be anything that forms a good electrical contact to n-type GaN, such as Al, Ti, Ni, among others. Ideally the contact would be highly reflective. While the active region is absent in the regions occupied by the n-contacts, laterally guided light may interact with the n-contact metal. Reducing the absorption of this light is therefore highly important for achieving high extraction efficiencies.

In another embodiment the LED mesa is fabricated without an n-contact metal before transfer. This is shown in the left-hand side of FIG. 6D in a schematic cross-section. The carrier wafer 307 has only one set of bond pads 304 per die corresponding to the on-wafer p-side bond pad 306. The p-type 305, active region 303 and n-type 302 layers are only exposed at the edges of the mesa. In this depiction, the removed sacrificial layer is shown between the mesa layers and the epitaxial substrate 301. Metal anchors would be used in this embodiment, but are not shown in this depiction. The right-hand side of FIG. 6D depicts in schematic-cross-section the die on carrier wafer after transfer. The surface of the n-type layer 308 is exposed. In this embodiment, a transparent or semi-transparent n-type contact would be deposited on the n-type surface in order to make electrical contact to the LED while enabling light to escape from the top of the device. Possible contact materials would be semi-transparent annealed Ni/Au and transparent conducting oxides such as ZnO, indium tin oxide (ITO), gallium oxide, GaZnO, InZnO, AlZnO, AlInGaZnO, among others. The n-contacts may also be formed from high aspect ratio metal features that are limited in area but efficiently and uniformly inject electrons into the n-type material such that the active region is uniformly illuminated. Electrical contact is made to the n-contact material using either inter-connect metal lines deposited with lithography or by wire bonding.

The LED structures are prepared with a lithographically defined etch exposing forming mesas on the epitaxial wafer and exposing the sacrificial layers at the mesa sidewalls. P-type contact metals are deposited on top of the mesas and n-type contact metals are deposited in the trenches between mesas. Metal interconnects are deposited, which connect electrically the p-type and n-type contact metals. These interconnects both electrically short the active region pn-junction, thereby inhibiting PEC etching as described above, and function as non-etchable anchors that retain the mesas on the epitaxial wafer after sacrificial layers are fully removed by the selective PEC etch. The left half of FIG. 6E shows a schematic representation of the plan-view of a closely packed array of LED die before transfer to a carrier wafer. The metal stack consists of the p-contact metal and bond pad 403, the metal anchors 404 and the cathode and n-contact metal 401. The p-contact and bond pad overlay the LED device mesa 402, which has a square shape. Note that the schematic is not drawn to scale. The mesas may be of the typical dimension of 1×1 mm2 found in many state-of-the-art high-power LEDs, while the trenches between wafers may only be 50 microns or less wide. The right half of FIG. 6E shows mesas after a 4-to-1 transfer process where by one fourth of the LED die are transferred in a single bonding process (or "stamp"). The dotted square 405 indicates the area of the carrier wafer occupied by a single LED die. It is clear that, after singulation of the carrier wafer, a single LED will be bonded to a chip at least four times the area of an individual mesa. The trench area between mesas on the epitaxial wafer will be similar to the kerf loss from sawing or dicing the wafer with a laser, therefore there is little improvement in epitaxial material utilization from transferring the die in this way. There are, however, other advantages. For example, the transfer can be carried out in a highly parallel way, with all die on a wafer transferred in a few (e.g. less than 10) bonding operations depending on the relative decrease of die density from substrate to carrier. This is an improvement over the typical pick-an-place method of transferring die to carrier wafers, which is a serial process. This advantage becomes more significant as the die area is reduced. In an example, one may wish to operate an LED at a fixed current density using a fixed device area. In some applications on may wish the surface brightness of the device to be limited, such that it is advantageous to use a plurality of die with a total area equivalent to the target area but with large spacing between die on the submount such that the average surface brightness is reduced. A similar configuration could be advantageous for the elimination of waste heat in heat-sinks. Many small die widely spaced may be cooled more efficiently than a single die operated at the same power due to the finite thermal conductivity of the LED packaging. It is obvious that in a pick-and-place based die transfer model the number of transfer operations required scales with the number die. This invention is therefore advantageous in that the number of transfer operations scales only with the change in die density from substrate to carrier wafer.

In another embodiment, the transferred dice have non-rectangular or non-square shapes. FIG. 6F shows an example with hexagonal die. On the left of FIG. 6F is a schematic representation of an array of closely packed hexagonal LED die that are coded to show how all the die may be transferred to carrier wafers in four bonding operations. On the right of FIG. 6F is a schematic representation of a subset of the die transferred to a carrier wafer after a bonding operation. The dotted line 501 indicates the area occupied by a single hexagonal die. In this case the present invention is advantageous in that the die shapes are defined by a lithographic process rather than by a physical sawing or scribing of the epitaxial substrate wafer. Dicing saws blades are relatively large compared to die, such that it would be impossible to singulate a wafer into die of shapes with edges that do not form continuous parallel lines. A laser scribing process may be able to draw guide scribes on the epitaxial substrate, however it is unlikely that the subsequent cleaving process would follow the guide scribes accurately and yield loss would be very high.

Once the carrier wafer is populated with die, wafer level processing can be used to fabricate the die into LED devices. For example, in many embodiments the bonding media and die will have a total thickness of less than about 5 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools. In an example wherein the mesa dice are expanded onto a carrier and then fabricated into an array of individual LEDs spaced out on a carrier wafer for enhanced thermal or light extraction performance the packaging would be inherent to the process. Here, then, you would have a truly wafer-scale LED package, fabricated on a wafer level using standard semiconductor manufacturing techniques and equipment, which, once singulated from the carrier wafer, would be ready for encapsulation and combination with phosphor materials.

A powerful and important enabling element of this invention is the ability to perform integration of different color emitting epi layers and resulting device structures from various substrate members onto a common carrier wafer. In one such example of integration a blue LED based on gallium and nitrogen containing epitaxial materials is integrated onto a common carrier with a green LED based on gallium and nitrogen containing epitaxial materials. In this embodiment one could form a system with comprising of a network of blue and green LED functions. In an alternative example, red, green, and blue LEDs are combined on the common carrier. In yet, an additional example red, green, yellow, and blue LEDs are combined on the common carrier. The LEDs could be electrically addressed in several configurations including series connections, parallel connections, and fully separate addressability of the blue and green diodes.

In one embodiment, the present invention is applied to the manufacturing of a display device. Specifically, the technology is used to make a highly efficient, cost effective, and high performance display based on micro-LEDs by transferring multiple color small LEDs to a common carrier such that the multiple color LEDs form individual pixels, which can be individually addressed to adjust the color and brightness of the pixel. Existing display devices based on liquid crystal technology are highly inefficient due to the use of multiple polarizers, color filters, light guides, and the need to electrically drive both the liquid crystal element and the backlighting element such as LEDs. Such displays typically result in single digit electrical to optical energy efficiency values and require complicated fabrication technologies with many elements leading to high cost. Advances have been made in organic LED [OLED] display technology over the past several years. However, OLED displays suffer from poor OLED efficiency, lower brightness, manufacturing challenges, and reliability barriers.

The present invention breaks the barriers associated with currently available display technology. Specifically, by patterning arrays of micro-LEDs into multiple donor wafers with different emission colors and then selectively transferring these LEDs onto a carrier or host wafer a 2-dimensional matrix of individual pixels comprising multiple color LEDs, such as red, green, and blue LEDs, can be configured. For example a first donor wafer comprised of a gallium and arsenic substrate can be fabricated to form an array of red emitting LED structures, a second donor wafer comprised of a gallium and nitrogen substrate can be fabricated to form an array of green emitting LED structures, and a third donor wafer comprised of a gallium and nitrogen substrate can be fabricated to form an array of blue emitting LED structures can be formed. Subsequently, the donor wafers can then be subjected to the transfer process described in this invention wherein only a fraction of the LED structures are transferred to a carrier wafer. In some embodiments the carrier wafer is comprised of a gallium and nitrogen containing substrate or a gallium and arsenic containing substrate, or an alternative substrate and comprises micro LEDs with one of the emission colors formed directly on the carrier wafer.

The carrier wafer is designed to receive the different color LEDs into pixel domains. The micro LEDs can be formed in various shapes such as circles, squares, rectangles, triangles, pentagons, hexagons, octagons, or any geometrical shape possible. The largest dimension of the LED emission areas could be smaller than 1 mm, smaller than 200 um, smaller than 100 um, smaller than 50 um, smaller than 20 um, smaller than 10 um, or smaller than 5um. The carrier wafer is comprised with an interconnect network configured to enable addressability of the micro LEDs in the pixels to generate high resolution display images. Any relevant interconnect schemes, configurations, processes could be taken from existing display technologies such as LCD or OLED, or even from other technologies such as imaging technologies like focal plane arrays (FPA) and applied to the present invention.

The present invention enables a highly manufacturable and cost efficient process for producing micro LED based displays not readily possible with prior art. Specifically, the current invention allows for a wafer level transfer process from a donor LED wafer to a common carrier wafer forming the display panel. Since it is a wafer level process, thousands, tens of thousands, or hundreds of thousands of LEDs can be transferred in one process step [depending on wafer size and pixed pitch] and hence avoiding any one-by-one pick and place techniques or mechanical transfer head techniques. This advantage can enable high throughput for low cost and high alignment tolerances for tight packing of the LEDs. Moreover, since it is a selective transfer process from the donor to the carrier and the pitch of the LEDs from the donor wafer to the carrier wafer can be expanded using the anchor technology, a much higher density of LEDs can be formed on the single color donor wafers than the final density of that single color as expanded on the carrier wafer to form the display panel. For example, a red donor wafer, green donor wafer, and blue donor wafer may be prepared with an LED pitch of X. At the transfer step to the first carrier wafer only ⅓ of the LEDs are transferred to the carrier wafer at a pitch of X/3 such that the resulting donor wafer has a repeating array of red, green, and blue LEDs that spaced from each other by X, but spaced from their next nearest neighbor with the same color by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In one embodiment, the blue and green LEDs based on gallium and nitrogen containing epitaxial materials could be integrated with LEDs based on other material systems such as GaAs-based LEDs. In one example, the AlInGaAsP or GaAs-based LED is a red emitting LED resulting in system comprised of a network of red-green-blue LEDs to form an RGB emitter LED device such as a micro-LED display device wherein a two dimensional array of red, green, and blue LEDs are configured to create a two dimensional array or pixels, wherein each pixel comprises at least one red, one green, and one blue LED. Again, the red, green, and blue LEDs can be electrically connected and driven in many types of configurations. In preferred embodiments the red, green, and blue LEDs are individually addressable or addressable in a fashion that enables independent color control of each pixel in the micro-LED display. In fact, groups of red-green-blue LEDs can be used to comprise pixels to form an RGB based LED display. In alternative embodiments, different color or additional color LEDs are added to the pixels in the micro LED display. For example, a yellow emitting LED can be added to the pixels to achieve an enhanced display color quality.

With respect to LED devices based on GaAs and/or AlInGaAsP such as red LED devices, these devices include a substrate made of GaAs or Ge, but can be others. As used herein, the term "substrate" can mean the bulk substrate or can include overlying growth structures such as arsenic or phosphorus containing epitaxial region, or functional regions such as n-type GaAs, combinations, and the like. The devices have material overlying the substrate composed of GaAs, AlAs, AlGaAs, InGaAS, InGaP, AlInGaP, AlInGaAs or AlInGaAsP. Typically each of these regions is formed using at least an epitaxial deposition technique of metal organic chemical vapor deposition (MOCVD), molecular beam epitaxy (MBE), or other epitaxial growth techniques suitable for AlInGaAsP growth. In general these devices have an n-type and p-type conducting layer which may form part of a n-type cladding layer or p-type cladding layer, respectively, with lower refractive index than the light emitting active region. The n-cladding layers can be composed of an alloy of AlInGaAsP containing aluminum. The devices contain an active region which emits light during operation of the device. The active region may have one or more quantum wells of lower bandgap than surrounding quantum barriers.

Undercut AlInGaAsP based LEDs can be produced in a manner similar to GaN based LEDs and laser diodes described in this invention. There are a number of wet etches that etch some AlInGaAsP alloys selectively. In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>1E6 times that of GaAs) when etched with HF. InGaP and AlInP with high InP and AlP compositions can be etched with HCl selectively relative to GaAs. GaAs can be etched selectively relative to AlGaAs using $C_6H_8O_7$:$H_2O_2$:$H_2O$. There are a number of other combinations of sacrificial layer, etch-stop layer and etch chemistry which are widely known to those knowledgeable in the art of micromachining AlInGaAsP alloys. For example, phosphoric based etches, hydrogen peroxide based etches, hydrochloric acid based etches, and other etches can be employed, In one embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall. This step is followed by the deposition of a protective insulating layer on the mesa sidewalls, which serves to block etching of the active region during the later sacrificial region undercut etching step. A second top down etch is then performed to expose the sacrificial layers and bonding metal is deposited. With the sacrificial region exposed a compositionally selective etch is used to undercut the mesas. At this point, the selective area bonding process is used to continue fabricating devices. The device layers should be separated from the sacrificial layers by a layer of material that is resistant to etching. This is to prevent etching into the device layers after partially removing the sacrificial layers.

In one embodiment the LED RGB display is formed by transferring each of the red, green, and blue epitaxial structures to a common carrier using the undercut etching and selective bonding technique as described for gallium and nitrogen based devices. In this first RGB LED embodiment the carrier wafer could be comprised of Si, sapphire, SiC, GaAs, InP, AlN, polycrystalline AlN, polycrystalline SiC, metal-core printed circuit board (MCPCB), ceramic printed circuit board or other, and could include functionality such as photodetectors for monitoring individual LED output, and drive circuitry for the micro LEDs such as thin film transistors or other types of transistors. The LEDs would be configured with an interconnection system for electrical addressability to enable creation of high resolution images based on signals transmitted from a signal processing unit.

FIG. 6G shows a simplified schematic view of a two dimensional LED matrix comprising red, green, and blue LEDs to compromise an RGB display panel based on one embodiment of this invention. As shown in FIG. 6G, a first donor wafer with a first epitaxial material 401 is processed to form a first array of LED dice 402, a second donor wafer with a second epitaxial material 403 is processed to form a second array of LED dice 404, and a third donor with a third epitaxial material 405 is processed to form a third array of LED dice 406. In one example, the first epitaxial material is formed of gallium and nitrogen containing material and comprises a light emitting region configured to emit a blue wavelength, the second epitaxial material is formed of gallium and nitrogen containing material and comprises a light emitting region configured to emit a green wavelength, and the third epitaxial material is formed of gallium and arsenic containing material and comprises a light emitting region configured to emit a red wavelength. After subjecting the donor wafers to the process according to this invention wherein a release layer is removed underneath the LED epitaxial material, at least a fraction of the first array of LED dice 402, a fraction of the second array of LED dice 404, and a fraction of the third array of LED dice 406 are subsequently selectively transferred to the carrier wafer 407 in a predetermined pattern. The pattern shown in FIG. 6G is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels.

In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [eg ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In some embodiments, processes or designs are used to increase the light extraction from the LED. For example, wet or dry etching techniques can be used to roughen one or more surfaces from the LED and increase light extraction. In another example, shaping of the LED through etching, sawing, cutting, or other process is used to increase the light extraction. In an example, the p-contact layer of the LED dice is patterned prior to forming the p-contact and etched to produce features such as trenches or pits in the p-contact surface. These pits can be isolated electrically by application of a passivating dielectric prior to deposition of the reflective p-contact material. The features will scatter light incident on the p-contact at shallow angles that would normally not be reflected out of the LED die. In another example, after transfer of the LED dice the n-type conducting layer is patterned and etched to produce features such as trenches or pits. The features in the surface of the n-type conducting layer scatter light rays that would normally by totally internally reflected by the GaN to air interface. In an embodiment, features internal to the LED dice such as gratings or photonic crystals are used to promote scattering of light to enhance extraction. As an example, an LED device epitaxial wafer is grown up to the n-cladding layer. The growth is then interrupted and the wafer removed from the growth system. The wafer is patterned and etched to form features such as pits or trenches which may be of arbitrary configuration or be configured to produce a photonic crystal. The wafer is then reintroduced to the growth system and the remainder of the n-cladding is overlaid on the features such that they are either left as air-gaps or are filled in with a material of differing optical index so as to form a region of patterned index contrast. In the case of arbitrarily configured features, the features may act as random scattering centers that scatter light propagating laterally through the LED die such that more light is direct out through the upper surface of the die. In the case of a photonic crystal, the features are configured to promote scattering of light into specific modes defined by constructive interference which are more easily extracted from the LED die than the unscattered light. In an example, the LED dice are etched on the donor wafer such that the sidewalls of the die are inclined at some angle relative to the plane of the wafer. In the preferred embodiment the sidewalls are angled at 45 degrees with the base of the LED die being larger than the top. After selective etching and transfer, the top of the LED die now becomes the bottom, bonded surface and the die. Light propagating through the LED die in lateral guided modes can be reflected off of the inclined sidewall and directed upward through the n-type surface of the device. In an additional example alternative materials are used to encapsulate or coat one or more surfaces of the LEDs to enhance the light extraction. Specifically, high index materials may be used to reduce the index contrast between the LED chip and the outside world.

Reliability and conservation of the image quality are key considerations for a display system such as the micro LED display system according to this invention. In some embodiments of the present invention each pixel in the display comprises two or more of each color LED such as comprising two, three, or four of each of the red, green, and blue LEDs to provide a redundancy. This redundancy would help overall reliability of the display system since if one of the LEDs were to fail, the pixel would still be operable and the user or viewer would not recognize or comprehend the failed LED chip in the display.

In some embodiments of the present invention, each pixel in the display comprises more than three colors. For example, a single pixel may comprise a red, green and blue device emitting at center wavelengths of 630, 530 and 450 nm as well as a device emitting at a center wavelength of 480 nm. This has the advantage of allowing the display to render a wider color gamut than is achievable with only three colors. In a preferred embodiment, each pixel will comprise at least one red LED device with center wavelength between 600 and 650 nm, at least one blue LED device with center wavelength between 420 and 470 nm, at least one cyan LED device with center wavelength between 490 and 505 nm, at least one green LED device with center wavelength between 505 and 525 nm and at least one green LED device with center wavelength between 525 and 540 nm.

As described previously, a key benefit provided by this invention to the formation of a micro LED display panel is the ability to perform multiple transfer steps from the donor wafers to one or more carrier wafers. This is enabled by the selective nature of the transfer process according to this invention. This key feature allows for the LED dice to be placed on the carrier wafer at positional pitches greater than the pitch on the donor wafer and in various patterns, which is important for creating pixels. FIG. 6H illustrate this multiple-transfer process. FIG. 6H shows the first donor wafer 401 with the remaining epitaxial dice 402, the second donor wafer 403 with the remaining epitaxial dice 404, the third donor wafer 405 with the remaining epitaxial dice 406 after the first transfer process had been performed according to FIG. 6G. As can be seen in the figure some of the dice are depleted from each of the donor wafers due to the preceding transfer. A subsequent second transfer step to a separate carrier wafer or to a different region on the first carrier wafer is performed and results in the RGB LED matrix 407 comprised of repeating pixel elements 408. Subsequently, FIG. 6I illustrates first donor wafer 401 with the remaining epitaxial dice 402, the second donor wafer 403 with the remaining epitaxial dice 404, the third donor wafer 405 with the remaining epitaxial dice 406 after the second transfer process had been performed according to FIG. 6H. A subsequent third transfer step to a separate carrier wafer or to a different region on the first carrier wafer is performed and results in the RGB LED matrix 407 comprised of repeating pixel elements 408. According to this example, after the third transfer process all of the LED dice will be depleted from the donor wafers. At that point the donor wafers can be prepared for a re-use of the bulk gallium and nitrogen containing and bulk gallium and arsenic containing substrates. Of course this is just one example of the multiple transfer process using the selective transfer technique according to this invention and there could be many others.

In yet another embodiment of an RGB micro LED display panel based on this invention, the red, green, or blue LED is fabricated from epitaxial materials grown directly on the carrier substrate and the other color LEDs are fabricated from epitaxial material that is transferred from the bulk substrates they are epitaxially grown on to the carrier wafer. As an example, the carrier wafer could be comprised from the same GaAs substrate that the red LED epitaxial material is grown on and the red LEDs are fabricated in. In this embodiment the green and blue LEDs could be fabricated from gallium and nitrogen containing epitaxial materials grown on a GaN substrate that are transferred to the GaAs carrier substrate. This configuration may be desirable over using the GaN substrate from the green or blue epitaxial material because it allows for reuse of the GaN substrates, which are substantially higher cost than GaAs substrates. Moreover, GaAs substrates are available in larger diameters. FIG. 6H shows a schematic diagram of this configuration.

In one embodiment of this configuration presented in FIG. 6J, a first substrate with a first epitaxial material 401 is processed to form a first array of dice 402 and a second substrate with a second epitaxial material 403 is processed to form a second array of dice 404. However, in this embodiment the carrier wafer is a third substrate 405 with a third epitaxial material processed to form a third array of dice 406. In this example, the first epitaxial material comprises a light emitting region configured to emit a blue wavelength, the second epitaxial material comprises a light emitting region configured to emit a green wavelength, and the third epitaxial material formed on the carrier wafer comprises a light emitting region configured to emit a red wavelength. The first array of dice 402 and second array of dice 404 are transferred to the carrier wafer 405 to form a predetermined pattern array of RGB LEDs 407. FIG. 6J is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels. This is one such example pattern that could be used for an RGB display system.

After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others. In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [e. g., ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In alternative embodiments, the third substrate configured as the carrier wafer with the epitaxial material comprising the third array of dice could be a GaN substrate with epitaxial material configured to emit blue light, or alternatively the third substrate configured as the carrier wafer with the epitaxial material comprising the third array of dice could be a GaN substrate with epitaxial material configured to emit green light.

Further details of manufacturing, processing, and designing multiple color technologies such as RGB integration technologies according to this invention can be found in U.S. Pat. No. 9,379,525, and U.S. patent application Ser. No. 15/180,737, which are commonly owned, and hereby incorporated by reference herein. To create a high resolution display such as a 1080P display a dense two-dimensional array of LEDs is required. For example, wearable devices or handheld devices such as an Apple iWatch with a 312×390 resolution in a 1.5" diagonal screen requires a total pixel size of about 76 um with a pixel density of about 333 ppi, an Apple iPhone 6 with a 375×667 resolution in a 4.7" diagonal screen requires a pixel size of about 156 um with a pixel density of about 163 ppi, or an Apple iPad Pro with a resolution of 1024×1366 in a 12.9" diagonal screen requires a pixel size of about 191 um with a pixel density of about 132 ppi. Larger displays such as high definition television may have increased pixel size. For example a 1080P display with a 1920×1080 resolution on a 32" diagonal screen requires a pixel size of about 368 um with a density of about 69 ppi, on a 46" diagonal screen requires a pixel size of about 530 um with a density of about 38 ppi, or on a 80" diagonal screen requires a pixel size of about 922 um with a density of about 28 ppi. A 4K ultra high definition display with a 3840×2160 resolution on a 32" diagonal screen requires a pixel size of about 184 um with a density of about 138 ppi, on a 46" diagonal screen requires a pixel size of about 265 um with a density of about 96 ppi, or on a 80" diagonal screen requires a pixel size of about 461 um with a density of about 55 ppi. As can be understood from these examples and extending to more extreme cases such as smaller or larger displays, pixel sizes can range anywhere from less than 50 um to well greater than 1,000 um To accommodate these pixel sizes wherein at least three LEDs (such as red, green, and blue LEDs) must be configured along with other required components such as interconnects, isolating elements, and free space, etc, the LED die size must be substantially smaller than the pixel size. For example, the individual LED die size must be smaller than 1,000 um, smaller than 500 um, less than 250 um, less than 100 um, less than 50 um, less than 25 um, less than 10 um, or even less than Sum to accommodate pixel pitches of less than 3,000 um, less than 1000 um, less than 500 um, less than 250 um, less than 100 um, less than 50 um, less than 20 um, or even less than 10 um. In fact, in many preferred embodiments according to the present invention, more than three LEDs will be required in each pixel. In some examples of these preferred embodiments additional LEDs are included to enhance the color quality such as adding a yellow LED. In some examples of these preferred embodiments additional LEDs are included to for color redundancy to meet the strict reliability requirements of displays. In some examples, 2, 3, or even 4 of each color LED are included in each pixel. The inclusion of these additional LEDs within the pixel area further forces the area of the LED die to smaller dimensions.

Electrically addressing these pixels within such high pixel density displays in a suitable fashion is a key consideration within a LED display apparatus according to this invention. In one example an interconnect network is created with metal traces on the top surface of the carrier wafer such that the interconnects run between the LED die. Although this example may be the easiest from a process standpoint having the interconnects on the same plane as the LED consumes valuable display real estate area. In a preferred configuration, vertical interconnects are included wherein the interconnect network is formed above or below the plane that the LEDs are attached to and are configured to make a vertical electrical connection from the interconnect network to the micro LEDs. For example, an interconnection network would be formed on the carrier wafer itself, which is then buried in a dielectric layer such as silicon dioxide or silicon nitride, but could be other non-conductive layer such as benzocyclobutene (BCB), acrylic, photoresist, silicon oxide, poly(methyl methacrylate) (PMMA), polyimide, acrylate, or epoxy to planarize the surface. The micro LEDs are attached to a surface overlying the planarization layer such that the planarization layer electrically isolates the interconnects from the micro LEDs. Vias would be formed in the planarization layer to form electrical connections from the interconnect network to the individual LEDs to provide the electrical drive signal to form the display.

It is to be understood that the above descriptions are merely examples. There is a wide range of existing technology currently used for the fabrication of LCD displays, OLED displays, or other panel displays that can be easily applied to the present invention. Additionally, alternative interconnect technology like focal plane array interconnect technology, such as that found at www.raytheon.com/news/technology_today/2015_i1/wafer.html or in Quiping et al, Journal of Semiconductors Vol. 31, No. 11 Nov. 2010, can be applied to the present invention. The interconnection network routes electrical power from a power source to the LEDs within the display panel. Specifically, current must be supplied to the p-side [anode] of the LEDs. In a preferred embodiment of the present invention the p-side will be down on the carrier or back plane such that the LEDs are flip-chip bonded. Common circuitry can include switching transistors, driving transistors, and storage capacitors. These elements can be configured in an architecture to supply current to the anode or pull current from the cathode through various arrangements. There are many suitable drive architectures in the prior art that can be applied to the micro LED display according to the present invention.

The carrier wafer is selected from any suitable material and preferably is configured with interconnection scheme to provide current to the micro LEDs in the display panel and can be configured with electronics to form drive circuitry including resistors, capacitors, and transistor such as a thin film transistor (TFT) network. For example, the primary carrier wafer could be selected from a silicon wafer, a sapphire wafer, an aluminum nitride wafer, a silicon nitride wafer, a silicon carbide wafer, a glass wafer, a group V semiconductor, a III-V semiconductor, or a II-VI semiconductor, or others. In a preferred embodiment the carrier wafer is selected from a silicon wafer. In one example the silicon wafer has interconnects or integrated circuit functionality defined within the wafer such as TFT technology. Such circuits or features defined in the silicon wafer can be formed using Complementary metal-oxide-semiconductor (CMOS) processing. By using such CMOS technology electronic devices such as metal-oxide-semiconductor field-effect transistor (MOSFETs) including nMOSFETs and pMOSFETS and others can be defined directly in the carrier wafer. CMOS processing is ideal for high volume, high circuit density, low cost manufacturing of the logic gates and multiplexing drive circuitry required in the LED based display device. In an alternative embodiment including TFTs, the TFT substrate can be configured on a primary carrier wafer. In alternative embodiments, the carrier wafer material may be flexible or curved to create a flexible or curved display. Some examples of flexible materials would be polymers, other organic based materials, and thin metallic.

The bonding of the micro-LEDs to the carrier wafer is preferably comprised of conductive interfaces such as metallic interfaces like Au—Au bonds to provide an electrical pathway from the interconnection network formed on the carrier wafer to the anode or cathode of the micro LEDs. In some examples of metallic interfaces such as a Au—Au interface the bonding can be performed using a thermo-compressive process such as using a wafer bonding tool. In alternative embodiments, the micro-LEDs are bonded using a reflow process such as using an indium reflow or a AuSn reflow. Using an indium reflow process may be advantageous to limit the temperature exposure of the LED devices.

A display panel and a method of forming a display panel are described. In an embodiment a display panel electronic drive circuitry such as a TFT substrate including regions defining the RGB pixels and regions separating the RGB pixels. The pixel regions could include an array of bank openings and an array of bottom electrodes within the array of bank openings. A ground line would be formed to provide a grounding for the LED banks.

In some embodiments the micro LED devices may be vertical micro LED devices such that they conduct the electrical current parallel to the epitaxial growth direction. A combination of transparent and reflective contact layers and passivation layers are configured to maximize the light escape from the top and/or the sides of the LED chips at their respective emission wavelengths. In one example, an array of top electrode layers are configured over the array of micro LED devices to form an electrical connection of the array of micro LED devices to the ground line or other lines.

In other embodiments the LEDs may be formed for a lateral current conduction such that the current path is characterized by at least one flow of current that is perpendicular to the epitaxial growth direction. In this example, an array of separate top electrode layers are formed over the array micro LED devices electrically connecting the array of micro LED devices to the ground line.

In an example embodiment, an array of micro LED devices are on the array of bottom electrodes within the corresponding array of bank openings. The micro LED devices are flip-chip micro LED devices, and may have a maximum width of 1 μm-100 μm. By "flip chip" it is meant that the micro LEDs are configured as shown in FIG. 6C with a p-type contact region 205 as well as an n-type contact region 207 on the bonded side of the transferred epi layers. The carrier wafer 209 has two sets of bond pads 206 and 208 that correspond to the on-die p-type bond pad 205 and on-die n-type bond pad 207 respectively. To form the on-die n-type bond pad A via is etched through the p-type 204 and active region 203 layers exposing the n-type layer 202. In this depiction, the removed sacrificial layer is shown between the mesa layers and the epitaxial substrate 201. Metal anchors would be used in this embodiment, but are not shown in this depiction. The right-hand side of FIG. 6C shows the die on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. The non-bonded side of the transferred epi layers 210 does not have an electrical contact, but may be patterned or coated as previously described to enhance light extraction. In this embodiment, the backplane comprises an array of a TFT substrate including a pixel area and a non-pixel area, where the pixel area includes an array of bank openings and an array of bottom electrodes within the array of bank openings. The TFT substrate also includes an array of cathode lines and an array of anode lines, with one cathode line corresponding to each row of the micro LEDS and one anode line corresponding to each column of the micro LEDs. The cathode and anode lines are comprised of metal or other conductors and are isolated from one another with a dielectric such as silicon dioxide, silicon nitride, BCB, hardened photoresist, epoxy, or a ceramic such as AlN, aluminum oxy-nitride or the like. The LEDs are configured such that the p-contact of the micro LED is bonded to an anode line and the n-contact is bonded to a cathode line such that each micro LED is individually addressable.

In an embodiment, the micro-LED devices are individually addressable via multiplexing. In an example, FIG. 6K shows a circuit diagram for a multiplexing scheme where positive voltage supply lines or anode lines run from a voltage source 1401. Each anode line is provided with a control transistor 1403 which converts a voltage supplied by control circuitry into a current. The cathode of each micro-LED is connected to a cathode or ground line. Each ground line is provided with a control transistor 1404. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates of the anode and ground line control transistors. In an example, if a sufficiently high voltage is provided to the control transistor 1403 of the first anode line the control transistor will allow current to pass. If sufficiently high voltage is provided to the control transistor 1404 of the first ground line then the transistor will conduct and short the ground line to ground. The micro-LED 1402 connecting the on-state anode control transistor to the ground line corresponding to the on-state ground-line control transistor 1404 will then be provided with current and emit light. All other micro-LED devices will not emit light because either their anode line is open and not conducting or their ground line is open and not conducting. Because the anode and ground lines are individually addressable via their control transistors, it is possible to run all micro-LEDs in each row simultaneously while keeping them individually addressable. An image can be formed by cycling through rows of micro-LEDs at rates too high for humans to perceive, for example cycling through all rows in less than one twentieth of a second or faster would be sufficient. It should be understood that larger, multiplexed micro-LED arrays are possible.

In another example, FIG. 6L shows a circuit diagram for a multiplexing scheme where positive voltage supply lines or anode lines run from a voltage source 1405. The anode of each micro-LED 1408 is tied to an anode line via a control transistor 1407. The gate of each anode line control transistor is tied to a control line 1409. The cathode of each micro-LED is connected to a cathode or ground line. Each ground line is provided with a control transistor 1406. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates ground line control transistor and to the control lines. In an example, if a sufficiently high voltage is provided to the control transistor 1407 of the first micro-LED by applying a voltage to the first control line 1409 the control transistor will enter an on-state and will conduct electricity. If sufficiently high voltage is provided to the control transistor 1406 of the first ground line then the transistor will conduct and short the ground line to ground. The micro-LED 1408 connecting the on-state anode control transistor to the ground line corresponding to the on-state ground-line control transistor 1406 will then be provided with current and emit light. All other micro-LED devices will not emit light because either their control transistor is in the off state and not conducting or their ground line is open and not conducting. Because the anode control lines and ground lines are individually addressable, it is possible to run all micro-LEDs in each column simultaneously while keeping them individually addressable. An image can be formed by cycling through columns of micro-LEDs at rates too high for humans to perceive, for example cycling through all columns in less than one twentieth of a second or faster would be sufficient. It should be understood that larger, multiplexed micro-LED arrays are possible.

The multiplexing configuration found in FIG. 6K is advantageous over that in FIG. 6L because significantly fewer transistors need to be fabricated on the backplane. In certain embodiments, the control transistors are provided by a separate control circuit that is not fabricated on the backplane. This embodiment greatly reduces the complexity of the backplane as it becomes only a grid of electrically isolated conductor lines and bond pads. The configuration in FIG. 6L is also limited to transistors that can be fabricated on the backplane. For example, if the backplane is glass or other insulating material, the transistors would be limited to those that can be fabricated on such substrates such as thin-film transistors (TFTs), organic or polymer semiconductor transistors and the like. In another example, if the backplane is a silicon wafer, then the transistors could be TFTs, bipolar junction-transistors (BJTs), metal-oxide-semiconductor field effect transistors (MOSFETs) or the like and could be fabricated either with deposition of semiconducting layers such as with TFTs or fabricated in the backplane wafer using diffusion processes as in BJTs or MOSFETs.

The multiplexing configuration found in FIG. 6L is advantageous over that in FIG. 6K in that control transistors in the FIG. 6K configuration would need to be able to source current for all micro-LED devices in a column. Design limitations of the transistor may therefore limit how big a micro-LED matrix is practical. By employing the FIG. 6L design, where each micro-LED is driven by a separate transistor, each transistor can be designed to source a relatively small current. It should be understood that other multiplexing configurations in accordance with an embodiment of this invention are possible. For example, an larger array of micro-LEDs could be segmented into individually addressable sub-arrays driven by one or more control circuits. Micro-LED apparent brightness can be controlled in several ways. In an example, the voltage on the control transistors is variable such that the current passed to the micro-LEDs is dynamically controllable. In another example, the voltage supplied to the control transistors is pulse-width-modulated with varying duty cycle such that the time average current passed to the micro-LED is dynamically controllable. In another example, the voltage supplied to the control transistors is applied for various amounts of time. For example, each row of micro-LEDs may be addressed for one millisecond. If one of the micro-LEDs in that row is held in the on-state for 0.1 millisecond every time the row is addressed, then on average it will appear to be 10% of the brightness of micro-LEDs held in the on-state for the entire millisecond every time the row is addressed.

Moreover, techniques used in other methods of forming micro LED displays can be applied such as that found in US 2014/0159067 A1 or US 2016/0013170 A1.

Of course, to form a full display apparatus from the micro LED display panel, the display apparatus must include additional elements such as input interfaces for electrical power and image and sound data, video processing and other imaging conditioning functions, and optionally memory storage. The display can include an input interface receives one or more frames of images to form a video. The input interface can include any conventional connection including hard wire connections such as USB, serial port, video, HDMI, etc, can include wireless interfaces such as WiFi or Bluetooth, and include interfaces to data storage devices such as compact discs, USB drives or thumb drives, hard drives, etc, and additionally the display apparatus may include an internal memory module to store video and sound content. The apparatus could include a video processing module to properly condition the image signal before routing it through the interconnects to the LEDs on the display panel. Moreover, the display device would include a power input interface to receive electrical power and could include batteries to form a portable display device. The display apparatus would be configured with a screen such as a glass screen or a plastic screen, wherein the screen could be configured to be sensitive to touching for data input and user functionality. An example display apparatus according to this invention is provided in FIG. 6M. The micro LED display apparatus according to the present invention could find use in a wide range of applications including mobile devices such as iPhones or Droid phones, tablet devices, televisions, laptop computers and computer monitors, digital camera, electronic book devices, gaming devices, or large lumen display like theatre and signage.

Of course, the LED based micro-display panel device according to this invention could be integrated with the other semiconductor device technologies according to this invention such as transistors, diodes, and laser diodes.

In an embodiment of this invention, the gallium and nitrogen containing epitaxial device layers comprise an AlInGaN laser diode (LD) device stack. Such GaN-based LDs contain n-type and p-type cladding layers surrounding light emitting layers to provide optical confinement in the transverse direction. The cladding layers are typically comprised of AlGaN, but can be comprised of GaN or AlInGaN. The layers must be low enough index and thick enough to provide sufficient modal overall lap within the active region while preventing overlap with the lossy metal contact regions. P-type and n-type contacts are made to inject current into the active region for radiative recombination.

In a specific embodiment, the gallium and nitrogen containing substrate member is a bulk GaN substrate characterized by having a polar, nonpolar, or semipolar crystalline surface region, but can be others. In a specific embodiment, the bulk nitride GaN substrate comprises nitrogen and has a surface dislocation density between about $10E5$ cm$^{-2}$ and about $10E7$ cm$^{-2}$ or below $10E5$ cm$^{-2}$. The nitride crystal or wafer may comprise Al$_x$In$_y$Ga$_{1-x-y}$N, where 0≤x, y, x+y≤1. In one specific embodiment, the nitride crystal comprises GaN. In a specific embodiment, the device can be fabricated on a slightly off-cut polar substrate.

The substrate typically is provided with one or more of the following epitaxially grown elements, but is not limiting:
  a buffer layer such as an n-type GaN layer
  a sacrificial region such as an InGaN quantum well region
  an n-GaN or n-AlGaN cladding region with a thickness of about 50 nm to about 6000 nm with a Si or oxygen doping level of about $5E16$ cm$^{-3}$ to about $1E19$ cm$^{-3}$
  an InGaN SCH region with a molar fraction of indium of between about 1% and about 10% and a thickness of about 30 nm to about 300 nm;
  quantum well active region layers comprised of one to five about 1.0 to 7.5 nm InGaN quantum wells separated by about 1.5-15.0 nm GaN or InGaN barriers
  optionally, a p-side SCH layer comprised of InGaN with a molar fraction of indium of between about 1% and about 10% and a thickness from about 15 nm to about 250 nm
  optionally, an electron blocking layer comprised of AlGaN with molar fraction of aluminum of between about 5% and about 20% and thickness from about 10 nm to about 25 nm and doped with Mg.
  a p-GaN or p-AlGaN cladding layer with a thickness from about 400 nm to about 1000 nm with Mg doping level of about $5E17$ cm$^{-3}$ to about $1E19$ cm$^{-3}$
  a p++-GaN contact layer with a thickness from about 10 nm to about 40 nm with Mg doping level of about $2E19$ cm$^{-3}$ to about $1E21$ cm$^{-3}$ As in LED structures, each of these regions are typically formed using at least an epitaxial deposition technique of metal organic chemical vapor deposition (MOCVD), molecular beam epitaxy (MBE), or other epitaxial growth techniques suitable for GaN growth. The active region can include one to about twenty quantum well regions according to one or more embodiments. As an example following deposition of the n-type Al$_u$In$_v$Ga$_{1-u-v}$N layer for a predetermined period of time, so as to achieve a predetermined thickness, an active layer is deposited. The active layer may comprise a single quantum well or a multiple quantum well, with about 2-10 quantum wells. The quantum wells may comprise InGaN wells and GaN barrier layers. In other embodiments, the well layers and barrier layers comprise Al$_w$In$_x$Ga$_{1-w-x}$N and Al$_y$In$_z$Ga$_{1-y-z}$N, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or Al$_w$In$_x$Ga$_{1-w-x}$N layer about 10 nm to about 100 nm thick surrounded by GaN or Al$_y$In$_z$Ga$_{1-y-z}$N layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise Al$_s$In$_t$Ga$_{1-s-t}$N, where 0≤s, t, s+t≤1, with a higher bandgap than the active layer, and may be doped p-type or the electron blocking layer comprises an AlGaN/GaN superlattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about 10E16 cm-3 and about 10E22 cm-3, and may have a thickness between about 5 nm and about 1000 nm. The outermost 1-50 nm of the p-type layer may be doped more heavily than the rest of the layer, so as to enable an improved electrical contact.

An example of an epitaxial structure for a laser diode device is shown in FIG. 7A. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm-3, though is other embodiments the doping may range between 1E18 and 1E19 cm-3. Overlaying the contact layer is an n-type AlGaN cladding layer with a thickness of 1 micron with an average composition of 4% AlN, though in other embodiments the thickness may range from 0.25 to 2 microns with an average composition of 1-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting layers consisting of two 3.5 nm thick $In_{0.15}Ga_{0.85}N$ quantum wells separated by 4 nm thick GaN barriers, though in other embodiments there may 1 to five light emitting layers consisting of 1 nm to 6 nm thick quantum wells separated by GaN or InGaN barriers of 1 nm to 25 nm thick. Overlaying the light emitting layers is an InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an AlGaN electron blocking layer [EBL] with a composition of 10% AlN, though in other embodiments the AlGaN EBL composition may range from 0% to 30% AlN. Overlaying the EBL a p-type AlGaN cladding layer with a thickness of 0.2 micron with an average composition of 4% AlN, though in other embodiments the thickness may range from 0.25 to 2 microns with an average composition of 1-8% AlN. Overlaying the p-AlGaN cladding is p-GaN cladding with a thickness of 700 nm, though in other embodiments the p-GaN cladding thickness may range from 0 nm to 1500 nm. The p-GaN cladding is terminated at the free surface of the crystal with a highly doped p++ or p-contact layer that enables a high quality electrical p-type contact to the device.

Once the laser diode epitaxial structure has been transferred to the carrier wafer as described in this invention, wafer level processing can be used to fabricate the die into laser diode devices. For example, in many embodiments the bonding media and die will have a total thickness of less than about 7 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device will have laser stripe region formed in the transferred gallium and nitrogen containing epitaxial layers. In the case where the laser is formed on a polar c-plane, the laser diode cavity can be aligned in the m-direction with cleaved or etched mirrors. The laser stripe region is characterized by a cavity orientation substantially in an m-direction, which is substantially normal to an a-direction, but can be others such as cavity alignment substantially in the a-direction. The laser strip region has a first end 107 and a second end 109 and is formed on an m-direction on a {0001} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAME), or other method. Typical gases used in the etching process may include Cl and/or BCl3. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. Through the deployment of the die expansion technology enabled by this invention, the current invention is a method of maximizing the number of devices which can be fabricated from a given gallium and nitrogen containing substrate and overlying epitaxial material by spreading out the epitaxial material onto a carrier In an example of die expansion for the laser diode devices, the laser die are transferred to a carrier wafer at a second pitch where the second pitch is greater than the first pitch. This invention enables fabrication of laser die at very high density on a substrate. This high density being greater than what is practical for a laser device built using current fabrication processes. Laser die are transferred to a carrier wafer at a larger pitch (e.g. lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the die can be processed into laser devices using standard lithographic processes. The carrier wafer diameter can be chosen such that laser die from multiple gallium and nitrogen containing substrates can be transferred to a single carrier and processed into laser devices in parallel using standard lithographic processes.

Semiconductor devices play a key role in power electronic systems. Most of these applications today are enabled by silicon. Silicon has been a dominant material for power management since the late 1950's. The advantages silicon had over earlier semiconductors included enabling new applications, higher reliability, ease of use, and lower cost. All of these advantages stemmed from the basic physical properties of silicon combined with a huge investment in manufacturing infrastructure and engineering. Wide bandgap (WBG) semiconductors, such as silicon carbide (SiC) and gallium nitride (GaN) possess material properties that are superior to silicon for power switching operation. They have been under extensive academic research for more than 20 years and promise to replace silicon with better energy efficiency. In the example of hybrid electric vehicles (HEV), existing silicon insulated gate bipolar transistors (IGBT) and diodes contribute about 20-25% of traction inverter system cost. Power devices based on GaN is one of the most anticipated technology candidates for the next-generation HEV power conversion application.

Recent technology advancements make its application prospect increasingly realistic, such as the availability of native and GaN-on-silicon substrates, development of normally-off gate structures, suppression of the current collapse phenomenon as well as the demonstration of high-voltage blocking capability. Perfectly crystalline GaN has superior materials properties as compared to silicon for certain power electronics applications. It has a higher bandgap, higher thermal conductivity, higher breakdown voltage, and higher electron mobility than silicon. In principle, these properties should provide lower losses in high power conversion, higher frequency switching, and high operating temperatures: For references, please see WHITE PAPER: WP001 from *Efficient Power Conversion Corporation (EPC)*, by Alex Lidow PhD, CEO and Johan Strydom, PhD, Vice President Applications Engineering, Gallium Nitride (GaN) Technology Overview [11].

FIG. 8A shows four key electrical properties of GaN, Si, and SiC—the primary three semiconductor materials currently competing for market share of the power management market. To compare potential device performance in a power transistor the best theoretical performance can be calculated. For power devices there are many characteristics that matter in the variety of power conversion systems available today. Five of the most important are conduction efficiency, breakdown voltage, switching efficiency, size and cost. Using the data from FIG. 8A (and adjusting for the enhanced mobility of the GaN 2DEG), the theoretical minimum device on-resistance (the inverse of conductivity) as a function of breakdown voltage and as a function of material is calculated. As shown in FIG. 8B, SiC and GaN both have a superior relationship between on-resistance and breakdown voltage due to their higher critical electric field strength. This allows devices to be smaller and the electrical terminals closer together for a given breakdown voltage requirement. GaN has an extra advantage compared with SiC as a result of the enhanced mobility of electrons in the 2DEG. This translates into a GaN device with a smaller size for a given on-resistance and breakdown voltage. Additional advantages of GaN over SiC include various device possibilities using GaN/AlGaN heterojunctions which are not available in the SiC and the ability to use AlGaN layers with larger band gaps to achieve higher critical electric fields than in GaN alone. For reference, see WHITE PAPER: WP001 from *Efficient Power Conversion Corporation (EPC)*, by Alex Lidow PhD, CEO and Johan Strydom, PhD, Vice President Applications Engineering, Gallium Nitride (GaN) Technology Overview [11].

In the present invention a wide range of power electronic and transistor devices can be formed. Examples of such devices include Schottky diode devices, p-n diode devices, bipolar junction transistor (BJT), field-effect transistor (FET), metal-oxide-semiconductor field (MOSFET), junction field effect transistor (JFET), metal-semiconductor FETs (MESFETs), high-electron-mobility transistors (HEMT), insulated gate bipolar transistors (IGBT), heterojunction bipolar transistors (HBT), and others. In one embodiment, the semiconductor device layers are epitaxially grown on a bulk polar GaN substrate. In another embodiment, the semiconductor device layers are epitaxially grown on bulk nonpolar or semipolar GaN substrate, The devices may be processed to form contacts on the N-face and the Ga-face to provide performance enhancements and the layer structures may be ordered to provide an advantage over what is possible using conventional device fabrication technologies.

One embodiment of a GaN power device fabricated using this invention is a Schottky diode, which is a two terminal majority carrier device with a low forward voltage drop and a very fast switching action. When current flows through the Schottky diode device there is a small voltage drop across the diode terminals. An ideal Schottky diode should have characteristics such as high breakdown voltage, low leakage current, low forward voltage drop, low on-state resistance, and fast recovery. The keys characteristics for the fabrication of ideal Schottky diodes are the selection of a semiconductor material with optimum intrinsic properties, high crystal quality of the semiconductor layers, high quality intrinsic layer as a drift region with desired thickness, proper device structure and design, good edge termination, rectifying Schottky contact, low contact resistance for the ohmic contact, and high conductivity from the ohmic contacts to the intrinsic drift region. In GaN the majority carrier is most typically electrons, or n-type, but it can be p-type. As used herein, the term intrinsic or intrinsic region is used to describe a semiconductor material with very low doping or carrier concentration. The intrinsic region can be formed by growing epitaxial materials that are not intentionally doped [ND], unintentionally doped [UID], or may be intentionally doped to compensate the unintentional background doping to reduce the carrier concentration. The intrinsic region is typically configured as an insulating region, a semi-insulating region, or a drift region.

The three primary or typical device geometries for Schottky diodes are lateral, semi-vertical mesa, and vertical. The earliest GaN Schottky type diodes were lateral type, which suffer from very poor lateral conductivity. The semi-vertical structure comprises a mesa etched in GaN that is typically grown on a foreign substrate. A Schottky contact is made on top of the mesa and ohmic contacts are made on the etched region surrounding the mesa. These structures were improved over the lateral structures, but were still limited by lateral conductivity of the epi layers connecting the ohmically contacted material to the intrinsic material. With the advent of native bulk GaN substrates truly vertical Schottky diodes were enabled. By forming epitaxial intrinsic layers on top of highly doped GaN substrates and forming the ohmic contact to the substrate and the Schottky contacts to the intrinsic layers extremely high performance Schottky diodes were realized. This invention enables a truly vertical Schottky diode without the need for a substrate in the final device by using a highly conductive metal region to laterally conduct to the ohmic contact in one configuration or laterally conduct to the Schottky contact region in an alternative configuration. Since the metal layers are highly conductive and can be made several microns thick (1-15 microns or more) the lateral conductivity will be extremely high and even improved over the conductivity in conventional vertical Schottky diodes, which include the resistance of the substrate.

In a typical embodiment, a metal-semiconductor junction is formed between a metal and a semiconductor, creating a Schottky barrier on the anode side of the device. Typical metals used for the Schottky barrier are molybdenum, platinum, palladium, nickel, gold, chromium, tungsten, but can be others. The metal region forming the Schottky barrier can be comprised of a metal stack comprising multiple layers including additional metals such as gold. The semiconductor layers forming the Schottky barrier are typically comprised of a gallium and nitrogen containing material such as GaN with very low conductivity [intrinsic region or drift] that is either unintentionally doped or may be intentionally doped with a species to compensate the unintentional background doping to achieve a low conductivity. These regions may be comprised of one or more layers, wherein the layers are comprised of GaN or other gallium and nitrogen containing alloys. These layers typically need to have carrier concentrations of less than about 1E17 cm-3, less than about 6E16 cm-3, less than about 3E16 cm-3, or less than about 1E16 cm-3. The thickness of this region is typically between 0.5 um and 10 um, or about 10 um and 30 um, or about 30 um and 60 um. Sometimes referred to as the standoff region or the drift region, the thickness and conductivity of this intrinsic region sets the resistivity of the device, which will determine power dissipation and maximum current density of the device. The thicker and less conductive this region, the larger the breakdown voltage or critical field of the device.

In this embodiment, the cathode side of the device is typically formed with an ohmic metal contact to a semiconductor layer. Typical metals used to form the ohmic contact include titanium or aluminum, but could be others. The ohmic metal contact region is often comprised of a metal stack that may include additional metals such as gold, nickel, palladium, or platinum. The ohmic contact is made to a semiconductor contact layer such as an n-type gallium and nitrogen containing material such as GaN. In one example the n-type GaN layer is doped with an n-type dopant such as silicon at a doping level between 5E17 and 1E20 $cm^{-3}$. The n-type contact layer may have a thickness between about 25 nm and 100 nm, or about 100 nm to about 1000 nm, or about 1000 nm to about 3000 nm.

In one embodiment of this invention, a Schottky diode epitaxial structure is grown on a bulk gallium and nitrogen containing substrate. The growth is comprised of an epitaxial technique such as metal organic vapor deposition (MOCVD), molecular beam epitaxy (MBE), hydride vapor phase epitaxy (HVPE), or a combination. As shown in FIG. 9A, the epitaxial structure would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising an n-type contact layer such as n-type GaN and a nominally unintentionally doped or intrinsic region comprised of gallium and nitrogen containing material such as GaN overlying the n-type contact region. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical Schottky diode device structure is formed from the epitaxial structure in FIG. 9A to result in a device structure as shown in FIG. 9B. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAME), or other. Typical gases used in the etching process may include Cl and/or BCl3. Alternatively the mesa could be defined through a wet etch process. The wet etch process may be selective and designed to terminate on the sacrificial region. In this embodiment a Schottky diode contact is formed on top of epitaxial region on the intrinsic GaN material, which can be done either before or after the mesa is defined. The metal contact would be selected from one of or a combination of molybdenum, platinum, palladium, nickel, gold, chromium, tungsten, or others. Overlying the Schottky contact is a bonding region comprised of a metal. The metal may be the same metal as used for the Schottky contact, or in a preferred embodiment additional layers of metal would be deposited over the Schottky contact metal. In one embodiment, this metal would be a gold metal to form a gold-gold bond. Metal depositions can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote higher conductivity or coverage.

In addition to preparing the epitaxial device layers for transfer step with the formation of the mesa structures with Schottky contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the Schottky barrier contact. Once bonded, with the substrate released the remainder of the device process would be performed to the epitaxial device material on carrier wafer. The subsequent processing steps would include forming the n-type ohmic contact with the exposed n-type contact layer on the top of the transferred mesa. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. The ohmic metal deposition can be performed by conventional methods such as electron beam deposition, sputtering, or thermal evaporation, and annealing steps may be used to improve the contact quality.

Additional processing steps to form the completed Schottky diode device could include photolithography, deposition of dielectric passivation regions such as silicon dioxide or silicon nitride. Dry or wet etching or lift off of the dielectric may be necessary to form a patterned regions. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a Schottky diode epitaxial structure is grown on a bulk GaN substrate. The growth is comprised of an epitaxial technique such as metal organic vapor deposition (MOCVD), molecular beam epitaxy (MBE), hydride vapor phase epitaxy (HVPE), or a combination. As shown in FIG. 9C, the epitaxial structure in this embodiment would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising a nominally unintentionally doped or intrinsic region comprised of gallium and nitrogen containing material such as GaN and an n-type contact layer such as n-type GaN overlying the nominally unintentionally doped or intrinsic region. In one embodiment the intrinsic or drift region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In an alternative embodiment of a vertical Schottky diode device structure according to this invention the epitaxial structure in FIG. 9C is fabricated to result in a device structure as shown in FIG. 9D. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. In this embodiment an n-type ohmic contact is formed on top of epitaxial region on the n-type GaN contact layer, which can be done either before or after the mesa is defined. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. Metal depositions can be performed by conventional methods such as electron beam deposition, sputtering, thermal evaporation, or others. In some embodiments electroplating may be used to deposit a thick layer of a conductive metal such as gold to promote higher conductivity or coverage. In addition to preparing the epitaxial device layers for transfer step with the formation of the mesa structures with Schottky contacts and comprising bonding regions, the carrier wafer would be prepared for the transfer process. Overlying the ohmic contact is a bonding region comprised of a metal. The metal may be the same metal as used for the ohmic contact layer, or in a preferred embodiment additional layers of metal would be deposited over the ohmic contact metal to form a metal layer stack. In one embodiment, this metal would be comprised of at least a gold metal to form a gold-gold bond.

In addition to preparing the epitaxial device layers for transfer step with the formation of the mesa structures with ohmic contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold.

Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the ohmic contact in contact with the n-type contact layer. Once bonded, with the substrate released the remainder of the device process would be performed to the epitaxial device material on carrier wafer. The subsequent processing steps would include forming the Schottky barrier contact with an exposed portion of the intrinsic or nominally undoped layer on the top of the transferred mesa. The Schottky barrier metal contact would be selected from one of or a combination of molybdenum, platinum, palladium, nickel, gold, chromium, tungsten, or others. Metal depositions can be performed by conventional methods such as electron beam deposition, sputtering, or thermal evaporation.

Additional processing steps to form the completed Schottky diode device could include photolithography, deposition of dielectric passivation regions such as silicon dioxide or silicon nitride. Dry or wet etching or lift off of the dielectric may be necessary to form a patterned regions. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown. A final device structure of this embodiment including edge termination regions is shown in FIG. 9D.

In another embodiment of this invention, a p-n diode power electronic device can be fabricated. A p-n diode power device is a two terminal semiconductor diode based upon the p-n junction wherein the diode conducts current in only one direction, and it is made by joining a p-type semiconducting layer to an n-type semiconducting layer. Under a forward bias current flows with a small resistance and in reverse bias little or no current is able to flow until the diode reaches breakdown. Semiconductor p-n diodes have multiple uses including rectification of alternating current to direct current, detection of radio signals, emitting light and detecting light.

An ideal p-n diode should have characteristics such as high breakdown voltage, low leakage current, low forward voltage drop, low on-state resistance, and fast recovery. The key properties to form ideal p-n diodes are the selection of a semiconductor material with optimum intrinsic properties, semiconductor crystal quality with very low defect density, high quality intrinsic layer as drift region with desired thickness, a good ohmic n-contact for low n-type contact resistance for, a good ohmic p-contact for low p-type contact resistance; highly conductive n-type and p-type semiconductor layers sandwiching the intrinsic drift region, proper device structure and design, and good edge termination.

Two typical device geometries for p-n diodes are semi-vertical mesa and vertical. The GaN-based semi-vertical mesa structure typically comprises a mesa structure formed with an etching process into gallium and nitrogen containing material such as GaN. The epitaxial structure can be grown on either native GaN or foreign substrates such as silicon or sapphire. In one example an ohmic metal contact is made to a p-type semiconductor on the top of the mesa and an ohmic metal contact to an n-type semiconductor is made in the region surrounding the mesa. This performance can be limited in the semi-vertical mesa structure by the lateral conductivity of the n-type epi layers connecting n-type ohmic contact to the mesa region where current will flow vertically. With the introduction of native bulk GaN substrates truly vertical p-n diodes were enabled. By forming epitaxial intrinsic drift layers overly a highly doped GaN substrates, forming a p-type gallium and nitrogen containing layer such as p-type GaN overlying the intrinsic layer, and forming ohmic contacts to both the p-type region overlying the intrinsic region and the highly doped n-type substrates high performance truly vertical p-n diodes were realized. In this invention enables a truly vertical p-n diode device without the need for a substrate in the final device by using a highly conductive metal region to laterally conduct to the n-type contact in one configuration or laterally conduct to the p-type contact region in an alternative configuration. Since the metal layers such as gold are highly conductive and can be made several microns thick (1-10 microns or more) the lateral conductivity will be extremely high and even improved over the conductivity in conventional vertical Schottky diodes, which include the resistance of the substrate.

In a typical embodiment, an gallium and nitrogen containing semiconductor material intrinsic or unintentionally doped drift region is sandwiched between a p-type semiconductor gallium and nitrogen containing semiconductor such as GaN and n-type semiconductor gallium and nitrogen containing semiconductor such as GaN. A metal-semiconductor contact is formed between a metal and a p-type semiconductor such as p-GaN and a metal-semiconductor contact is formed between a metal and an n-type semiconductor such as n-type GaN. Typical metals used for a high quality p-type contacts are palladium, platinum, nickel, or nickel-gold, but can be others. The metal region forming the Schottky barrier can be comprised of a metal stack comprising multiple layers including additional metals such as gold. The semiconductor unintentionally doped drift region or intrinsic region comprised of a gallium and nitrogen containing material such as GaN with very low conductivity is either unintentionally doped or may be intentionally doped with a species to compensate the unintentional background doping to achieve a low conductivity. These drift regions may be comprised of one or more layers, wherein the layers are comprised of GaN or other gallium and nitrogen containing alloys. These drift layers typically need to have carrier concentrations of less than about 1E17 cm-3, less than about 6E16 cm-3, less than about 3E16 cm-3, or less than about 1E16 cm-3. The thickness of this region is typically between 0.5 um and 10 um, or about 10 um and 30 um, or about 30 um and 60 um. The thicker and less conductive this region, the larger the breakdown voltage or critical field of the device.

In one embodiment of this invention, a p-n diode epitaxial structure is grown on a bulk gallium and nitrogen containing substrate such as GaN. The growth is comprised of an epitaxial technique such as metal organic vapor deposition (MOCVD), molecular beam epitaxy (MBE), hydride vapor phase epitaxy (HVPE), or a combination. As shown in FIG. 10A, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an n-type contact layer such as n-type GaN, a nominally unintentionally doped drift region or intrinsic region comprised of gallium and nitrogen containing material such as GaN overlying the n-type contact region, and an p-type contact layer such as p-type GaN overlying the nominally unintentionally doped drift region or intrinsic region comprised of gallium and nitrogen containing material. In one embodiment the n-contact layer is comprised n-type GaN with a thickness of between 10 nm and 100 nm or 100 nm and 3000 nm. In one embodiment the n-type GaN may be silicon doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the p-contact layer is comprised p-type GaN with a thickness of between 10 nm and 100 nm or 100 nm and 3000 nm. In one embodiment the p-type GaN may be magnesium doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical p-n diode device structure is formed from the epitaxial structure in FIG. 10A to result in a device structure as shown in FIG. 10B. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAME), or other. Typical gases used in the etching process may include Cl and/or BCl3. Alternatively the mesa could be defined through a wet etch process. The wet etch process may be selective and designed to terminate on the sacrificial region. In this embodiment an ohmic contact is formed on top of epitaxial region on the p-type gallium and nitrogen containing material, which can be done either before or after the mesa is defined. The metal contact would be selected from one of or a combination of platinum, palladium, nickel, nickel-gold, gold, or others. Overlying the p-type contact is a bonding region comprised of a metal. The metal may be the same metal as used for the ohmic p-type contact, or in a preferred embodiment additional layers of metal would be deposited over the p-type contact metal. In one embodiment, this metal would be a gold metal to form a gold-gold bond. Metal depositions can be performed by conventional methods such as electron beam deposition, sputtering, thermal evaporation, or others, and annealing steps may be used to enhance the contact properties. In some embodiments electroplating may be used to deposit a thick layer of a conductive metal such as gold to promote higher conductivity or coverage.

In addition to preparing the epitaxial device layers for the transfer step with the formation of the mesa structures with p-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the p-type contact. Once bonded, with the substrate released the remainder of the device process would be performed to the epitaxial device material on the carrier wafer. The subsequent processing steps would include forming the n-type ohmic contact with the exposed n-type semiconductor contact layer on the top of the transferred mesa. The n-type contact would comprise a metal to allow for a good ohmic contact such as titanium or aluminum. In many embodiments a metal stack would be deposited with more than one layers wherein the n-type contact layer is in contact with the n-type GaN layer and metals such as gold, nicker, platinum, or palladium are configured in the stack overlying the n-type contact layer. The n-type metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a p-n diode epitaxial structure is grown on a bulk gallium and nitrogen containing substrate such as GaN. The growth is comprised of an epitaxial technique such as metal organic vapor deposition (MOCVD), molecular beam epitaxy (MBE), hydride vapor phase epitaxy (HVPE), or a combination. The epitaxial structure according to this embodiment, as shown in FIG. 10A, comprises a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an p-type contact layer such as p-type GaN, a nominally unintentionally doped drift region or intrinsic region comprised of gallium and nitrogen containing material such as GaN overlying the p-type contact region, and an n-type contact layer such as n-type GaN overlying the nominally unintentionally doped drift region or intrinsic region comprised of gallium and nitrogen containing material. In one embodiment the p-contact layer is comprised p-type GaN with a thickness of between 10 nm and 100 nm or 100 nm and 3000 nm. In one embodiment the p-type GaN may be magnesium doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In one embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In this embodiment, a vertical p-n diode device structure is formed from the epitaxial structure in FIG. 10C to result in a device structure as shown in FIG. 10D. In this embodiment, the epitaxial device material is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAME), or other. Typical gases used in the etching process may include Cl and/or BCl3. Alternatively the mesa could be defined through a wet etch process. The wet etch process may be selective and designed to terminate on the sacrificial region. In this embodiment an ohmic contact is formed on top of epitaxial region on the n-type gallium and nitrogen containing material, which can be done either before or after the mesa is defined. The metal contact would be selected from one of or a combination of aluminum, titanium, platinum, palladium, nickel, nickel-gold, gold, or others. Overlying the n-type contact is a bonding region comprised of a metal. The metal may be the same metal as used for the ohmic n-type contact, or in a preferred embodiment additional layers of metal would be deposited over the n-type contact metal. In one embodiment, this metal would be a gold metal to form a gold-gold bond. Metal depositions can be performed by conventional methods such as electron beam deposition, sputtering, thermal evaporation, or others, and annealing steps may be performed. In some embodiments electroplating may be used to deposit a thick layer of a conductive metal such as gold to promote higher conductivity or coverage.

In addition to preparing the epitaxial device layers for the transfer step with the formation of the mesa structures with n-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the n-type contact. Once bonded, with the substrate released the remainder of the device process would be performed to the epitaxial device material on the carrier wafer. The subsequent processing steps would include forming the p-type ohmic contact with the exposed p-type semiconductor contact layer on the top of the transferred mesa. The p-type ohmic contact would comprise a metal to allow for a good ohmic contact such as platinum, palladium, nickel, nickel-gold, or a combination thereof. In many embodiments a metal stack would be deposited with more than one layers wherein the ohmic contact layer is in contact with the n-type GaN layer and metals such as gold, nickel, platinum, or palladium are configured in the stack overlying the contact layer. The p-type contact metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

Another embodiment of a GaN power device fabricated according to this invention is a high electron mobility transistor device (HEMT), which is a three terminal device comprised of a source, a gate, and a drain. The HEMT is a heterostructure field-effect transistor (FET) based on a heterojunction which consists of at least two different semiconducting materials such as GaN and AlGaN brought into contact with each other to form an interface, typically using epitaxial growth. Due to the different band gaps of the semiconductor materials and their relative alignment to each other band discontinuities form at the interface. By choosing proper materials and compositions of the semiconductor materials, the conduction band offset can form a triangular shaped potential well confining electrons in the horizontal direction. Within the well the electrons can only move in a two-dimensional plane parallel to the heterointerface and are therefore referred to as a two-dimensional electron gas (2DEG). Since the HEMT is a field effect transistor (FET) formed with a heterostructure it is also known as an (HFET) or modulation-doped FET (MODFET). The advantages of the HEMT include its high carrier concentration and its higher electron mobility due to reduced ionized impurity scattering. The combination of high carrier concentration and high electron mobility results in a high current density and a low channel resistance, which are especially important for high frequency operation and power switching applications.

GaN HEMTs have attracted attention due to their high-power performance. HEMT transistors are able to operate at higher frequencies than ordinary transistors, up to millimeter wave frequencies, and are used in high-frequency products such as cell phones, satellite television receivers, voltage converters, and radar equipment.

GaN power transistors are typically formed as planar HEMT devices, where the conductive transistor channel is a 2DEG formed at the interface between a high bandgap layer such as AlGaN, AlN, or InAlGaN, and a lower bandgap layer such as GaN or InGaN. Source and drain contacts are formed to the 2DEG, while a gate is formed over the higher bandgap layer such as AlGaN. Imperfections in the crystalline epitaxial structure that create traps or other defects can limit performance such as compressing the gain and other nonlinear effects. Forming a very high quality epitaxial material free from defects and excessive impurities is critical to the device performance. Efforts to form higher quality epi-layers in AlGaN/GaN HEMTs have resulted in significant improvement of the large-signal characteristics. This first step of device formation comprises forming the epitaxial layer structure on a substrate. The lack of large area, low cost GaN substrates has historically necessitated heteroepitaxy on compatible substrates, commonly sapphire, silicon carbide, or silicon, but can be others such as aluminum nitride. The epitaxial layers may be either grown entirely by MBE or MOCVD or on a resistive GaN buffer grown by vapor phase epitaxy.

Heteroepitaxy on such severely lattice-mismatched substrates makes the nucleation layer and buffer one of the most critical aspects of the growth. With sapphire as a substrate, the nucleation layer typically consists of GaN or AlN. Overlying the buffer layer is typically an insulating GaN layer with a thickness ranging from about 0.5 um to about 5 um or about 5 um to 10 um. The insulating layer can be an intrinsic region, a not intentionally doped region (NID) an unintentionally doped region (UID), or a region intentionally doped to compensate the unwanted background dopants and increase the resistance. Typical carrier concentrations in this insulating layer would be less than about 1E17 cm-3, less than about 5E17 cm-3, or less than about 1E16 cm-3. Overlying the insulating GaN layer is the AlGaN electron supply region. The AlGaN electron supply region may be comprised of an AlGaN layer doped with silicon at a concentration of between 5E17 cm-3 and 1E20 cm-3 with a thickness ranging from 5 nm to about 100 nm. In some embodiments no doping is used or a modulation doped is implemented. In some embodiments the AlGaN supply region is comprised of multiple layers including an undoped AlGaN spacer layer ranging in thickness from 1 nm to about 15 nm overlying the GaN insulating layer, the n-type doped AlGaN layer with a thickness ranging from 5 nm to 100 nm overlying the AlGaN spacer layer, and an undoped AlGaN barrier layer with a thickness ranging 5 nm to 100 nm overlying the n-type doped AlGaN layer. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The composition of the AlGaN electron supply region is a critical design parameter as it can influence the carrier concentration. In some embodiments, a GaN cap or n-type GaN layer may be formed over the AlGaN electron supply region.

An example of a conventional HEMT device grown on a foreign substrate is shown in FIG. 11A. Following the formation of the AlGaN and GaN epitaxial layers, device fabrication of a typical AlGaN/GaN HEMT as shown in FIG. 11A may initiate with the definition of the active device area. This can be either be defined through a patterning and etching of a mesa process or an implantation process. In the more typical etching embodiment, wet or dry etching techniques can be deployed wherein Cl2 or BCl3 are common gases used in etching by RIE, ICP, or CAME methods of etching. Next, the source and drain ohmic contacts are formed. In one embodiment the source and drain contacts are made by partially etching the AlGaN region in the source and drain regions and depositing the ohmic contact metals. In another embodiment the source and drain contacts are formed directly to the AlGaN surface region. In yet another embodiment the source and drain contacts are made by etching through the AlGaN region and into the insulating GaN region to form an ohmic contact directly with the 2DEG. In yet another embodiment, the source and drain contacts are formed on an n-type GaN or NID GaN layer overlying the AlGaN region. The source and drain contact metallization is often followed by an annealing step to improve the contact characteristics. An example ohmic contact may be Ti/Al/Ni/Au, but it could be others such as Al/Ni/Au, a Ta-based ohmic contact, or others. The gate metal is typically defined by a deposition and lift-off process of a metal such as Ni/Au, but could be others such as Pt, Pd, or Au. The deposition method can be electron beam deposition, sputtering, thermal evaporation, or other techniques. In many of the early GaN transistors, this gate electrode was formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET. Dielectric passivation layers are formed on the device to electrically isolate certain features, protect certain regions, and to eliminate dispersion between the large signal alternating current (AC) and the direct current (DC) characteristics of the HEMT.

In the example conventional HEMT device in FIG. 11A, as with any power FET, there are gate, source, and a drain electrodes. The source and drain electrodes form an ohmic contact with the underlying 2DEG. This creates a short-circuit between the source and the drain until the 2DEG is depleted and the semi-insulating GaN crystal can block the flow of current. The gate electrode is placed on top of the AlGaN layer functioning to deplete the 2DEG. In some embodiments, the gate electrode is formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET and is a normally ON device. Embodiments for normally OFF devices are possible in the present invention.

In one embodiment according to this invention, a HEMT epitaxial device structure is grown on a bulk gallium and nitrogen containing substrate such as GaN. The growth is comprised of an epitaxial technique such as metal organic vapor deposition (MOCVD) or molecular beam epitaxy (MBE), but can be others. As shown in FIG. 11B, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the HEMT device layers comprising a higher bandgap material such as AlGaN electron supply region overlying the sacrificial region and an intrinsic region or nominally UID or ND insulating gallium and nitrogen containing material such as GaN overlying the higher bandgap region. The AlGaN electron supply region may be comprised of an AlGaN layer doped with silicon at a concentration of between 1E18 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an ND, UID, or an intentionally doped region to compensate the unwanted background dopants and increase the resistance and create the insulating property. The insulating region would comprise a thickness ranging from about 0.5 um to about 5 um or about 5 um to 10 um with a typical carrier concentrations of less than about 1E17 cm-3, less than about 5E16 cm-3, or less than about 1E16 cm-3, or less than about 5E15 cm-3. In other embodiments the high bandgap layer may be comprised of AlN.

In one embodiment according to this invention, the epitaxial device material, such as that shown in FIG. 11B, is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. Examples of insulating bond regions would oxide bonding regions, dielectric bonding regions, glass bonding regions, or polymer bonding regions, or other.

In addition to preparing the epitaxial device layers for the transfer step with the formation of the mesa structures and bonding regions, the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In a preferred embodiment, the bonding region would be similar to the bonding region on the top of the mesa structures such that the bond interface would be comprised of a like-like material, such as oxide-oxide, semiconductor-semiconductor, or metal-metal. In the case of oxide or dielectrics, depositions may be performed with chemical vapor deposition processes, sputtering processes, electron beam deposition processes, or other processes. For metal interfaces, the material can be deposited by conventional methods such as electron beam deposition, sputtering, thermal evaporation, or others. In an alternative embodiment the bonding region is comprised of two dissimilar materials such as semiconductor-glass, oxide-glass, semiconductor-polymer, or other. The transfer process would comprise a PEC etch to selectively remove the sacrificial release material followed by a bonding step to selectively transfer the epitaxial material to the carrier wafer and release the substrate. The bonding may be selected from a thermocompression bonding, a diffusion bonding, or other. Once bonded, with the substrate released the remainder of the device process would be performed to the epitaxial device material on the carrier wafer.

The subsequent processing steps would determine the final device structure of the HEMT device. Simplified example HEMT device structures that could be fabricated from the epitaxial structure in FIG. 11B according to this invention are shown in FIG. 11C and FIG. 11D. In both device structures the process includes forming an isolation structure for the active device area by etching a mesa or by ion implantation, or in a preferred embodiment the transferred epitaxial mesa would provide the isolation for the active device area. In the embodiment shown in FIG. 11C the source and drain contacts are made to the surface of the exposed AlGaN region. In the embodiment according to FIG. 11D the source and drain contacts are made after etching either into the AlGaN layer or through the AlGaN to directly contact the insulating layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In another embodiment of this invention a gate insulator is implemented by placing an insulating material such as a dielectric or oxide between the semiconductor material and the gate electrode. In this metal-insulator-semiconductor high-electron-mobility transistor (MIS-HEMT) device several insulator materials can be used including SiO2, SiNx, $Al_2O_3$, AlN, HfO2, ZrO2, La2O3, and Ta2O5. A gate insulator is not needed for RF devices, but is required for power devices to suppress the gate leakage current and current collapse. An example of a MIS-HEMT device according to one embodiment of this invention is shown in FIG. 11E.

In another HEMT device embodiment according to the present invention the epitaxial device stack would include a GaN layer between the sacrificial region and the AlGaN region. As shown in FIG. 11F, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the HEMT device layers comprising a cap layer, a higher bandgap material such as AlGaN electron supply region overlying the sacrificial region and an intrinsic region or nominally UID or NID insulating gallium and nitrogen containing material such as GaN overlying the higher bandgap region. In one embodiment the cap layer is a GaN cap layer comprised of UID or NID GaN to create an insulating region. In an alternative embodiment the cap layer is a GaN cap layer comprised of an n-type GaN to create a conductive region. In an alternative embodiment the cap layer is an AlGaN cap layer, which can be a p-type or n-type AlGaN. In an alternative embodiment the cap layer is an InGaN cap layer, which can be a p-type or n-type InGaN. The AlGaN electron supply region may be comprised of an AlGaN layer doped with silicon at a concentration of between 5E17 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an NID, UID, or an intentionally doped region to compensate the unwanted background dopants and increase the resistance and create the insulating property. The insulating region would comprise a thickness ranging from about 0.5 um to about 5 um or about 5 um to 10 um with a typical carrier concentrations of less than about 1E17 cm-3, less than about 5E16 cm-3, or less than about 1E16 cm-3, or less than about 5E15 cm-3.

In one embodiment according to this invention, the epitaxial device material, such as that shown in FIG. 11F, is prepared for transfer by forming a mesa region by etching the epitaxial material to a depth at or below the sacrificial region. The etching process can be a dry etching process such as a RIE, ICP etch, CAIBE, or other. Typical gases used in the etching process may include Cl and/or BCl3. Alternatively the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. In this embodiment the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In one embodiment, the bonding region would be similar to the bonding region on the top of the mesa structures such that the bond interface would be comprised of a like-like material, such as oxide-oxide, semiconductor-semiconductor, or metal-metal. In an alternative embodiment the bonding region is comprised of two dissimilar materials such as semiconductor-glass, oxide-glass, semiconductor-polymer, or other.

The subsequent processing steps would determine the final device structure of the HEMT device. Simplified example HEMT device structures that could be fabricated from the epitaxial structure in FIG. 11F according to this invention are shown in FIG. 11G, FIG. 11H, FIG. 11I, FIG. 11J, and FIG. 11K. In all device structures the process includes forming an isolation structure for the active device area by etching a mesa or by ion implantation, or in a preferred embodiment the transferred epitaxial mesa would provide the isolation for the active device area. In the embodiment shown in FIG. 11G the cap layer is an n-type GaN cap layer. In this embodiment the source and drain contacts are made to the surface of the exposed n-type GaN cap layer overlying the AlGaN region to form good ohmic contacts, while the gate contact is made to the AlGaN region. In the embodiment according to FIG. 11H the cap layer is an n-type GaN cap layer. In this embodiment the source and drain contacts are made after etching through the n-GaN cap layer to contact the AlGaN region, while the gate contact is made to the n-type GaN cap layer. In yet another embodiment according to FIG. 11I the cap layer is a UID or NID GaN cap layer. In this embodiment the source and drain contacts are made to a UID or NID GaN cap layer and an insulator material is placed between gate and the GaN cap layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In a conventional HEMT applying a bias to the gate electrode depletes electrons in the channel below to prohibit current flow and turn the device OFF, the device is a normally ON device. Normally OFF devices are desirable for several applications. For example, a normally-off device operation is required to simplify the inverter circuit for in electric or hybrid electric vehicles. Normally-off operation in GaN HEMT can be achieved by several methods, although they face limitations and tradeoffs. The most widely used method is by gate recess etching.

This can be performed by ICP plasma to remove the AlGaN layer on top of the GaN channel layer. The reduction of AlGaN thickness results in a lower polarization-induced 2DEG density. A recessed gate HEMT device according to one embodiment of this invention is show in FIG. 11J as an example. In this embodiment the cap layer is a GaN cap layer. In this embodiment the source and drain contacts are made to the GaN cap layer. An etch is performed to etch into the AlGaN region in the gate region. A passivation layer or insulating layer is applied in the etched region and the gate electrode is formed.

Another HEMT device enabling normally OFF operation is the gate injection transistor (GIT) device. In this device a p-type GaN, InGaN, or AlGaN layer is placed between the gate electrode and the AlGaN supply region. In the example of p-type AlGaN, the GIT structure is normally off because a p-AlGaN layer raises the potential at the AlGaN/GaN interface channel above the Fermi level. This could also be understood as a natural depletion of mobile electrons on the n-side due to the built-in p-n junction. By applying a positive gate bias, the channel begins to accumulate 2DEG as the quantum well reaches the Fermi level, thereby turning the device on.

A GIT device according to one embodiment of the present invention is show in FIG. 11K as an example. In this embodiment the cap layer is a p-type AlGaN cap layer. In this embodiment the source and drain contacts are made to the AlGaN supply layer after etching through the p-type AlGaN cap layer. The gate contact is made to the p-type AlGaN cap region between the source and the drain.

In alternative embodiment according to this invention, a HEMT epitaxial device layers would be grown on the gallium and nitrogen containing substrate in a reverse order compared to FIG. 11B and FIG. 11F. That is, overlying the sacrificial region first the lower bandgap intrinsic region or nominally UID or NID insulating gallium and nitrogen containing material such as GaN is formed. Overlying the insulating region the higher bandgap region such as AlGaN is formed. An example of this embodiment according to the present invention is shown in FIG. 11L. Of course this is just one example and the structure could include additional features such as a cap layer overlying the AlGaN region. The cap layer could be comprised of UID, n-type, or p-type GaN, AlGaN, or InGaN. The HEMT power devices would then be fabricated on the gallium and nitrogen containing substrate such as GaN. In the process, source, drain, and gate electrodes would be applied and sufficient insulating and passivating layers would be configured on the devices according to the descriptions provided in earlier examples. Mesas would be formed using an etching process to expose the sacrificial region. The etching process can be a dry etching process such as RIE, ICP etch, a CAIBE, or other. Typical gases used in the etching process may include Cl and/or BCl3. Alternatively the mesa could be defined through a wet etch process. The wet etch process may be selective and designed to terminate on the sacrificial region. Following the mesa formation process the sacrificial region would be fully or partially removed using a selective etch process such as PEC etching. In a preferred embodiment an anchor regions would be formed to mechanically support the HEMT device mesas and hold them in place with sacrificial region removed prior to the bonding step. The anchor regions could be formed from a semiconductor material, a metal material, an oxide, or a dielectric. Bonding regions would be formed configured to bond the HEMT devices to a carrier wafer. In a preferred embodiment the bonding regions would be metal regions overlying the source, drain, and gate electrodes, but can be others. FIG. 11M shows an example of an array of HEMT devices prepared for transfer to a carrier wafer according to this invention.

In addition to preparing the HEMT devices for the transfer step with the fabrication of the devices structures including forming the source, gate, and drain regions along with the applying the necessary passivation layers, formation of the mesa structures, anchor structures, and bonding regions, along with selectively etching the sacrificial region, the carrier wafer is prepared for the transfer process. The carrier wafer could be selected from silicon, silicon carbide, sapphire, aluminum nitride, or others. In one embodiment the carrier wafer would be insulating or semi-insulating and would be selected from sapphire, silicon carbide, or aluminum nitride. In another embodiment the carrier wafer would be configured from silicon and comprise electronic devices formed from a Complementary metal-oxide-semiconductor (CMOS) process. In another embodiment the power devices would be transferred directly to a printed circuit board. In preparation for the transfer process, bonding regions may be formed on the carrier wafer. In a preferred embodiment, the bonding regions would be comprised of metal and be configured to bond to the source, gate, and drain metal bond regions. The metal regions on the carrier may be comprised of gold, platinum, titanium, palladium, copper, aluminum, or a combination thereof. The metal material can be deposited by conventional methods such as electron beam deposition, sputtering, thermal evaporation, or others such as electroplating.

The bonding may be selected from a thermocompression bonding, a diffusion bonding, or other. Once bonded, with the substrate released the remainder of the device process would be performed to the epitaxial device material on the carrier wafer. In one configuration bond pad regions to access the source, gate, and drain would be formed substantially on the carrier wafer. In another configuration electrical interconnects would be used to connect the GaN power devices to other devices on the carrier wafer such as CMOS devices integrated within the carrier or other devices transferred to the carrier wafer according to this invention. FIG. 11N shows an example of selective bonding wherein the bond interface regions from the GaN wafers comprising the HEMT devices is bonded to the bond region on a carrier wafer or a printed circuit board. By selective bonding, one or more HEMT devices can be transferred to multiple carrier wafers or printed circuit boards. An advantage to this device structure is the lack of conduction layers below the insulating GaN region.

As in any of the gallium and nitrogen containing semiconductor devices according to this invention, the die expansion process can be applied to electronic devices such as Schottky diode devices, p-n diode devices, HEMT devices, FET devices, heterojunction bipolar transistor, or any other transistor devices. As an example a cross-sectional schematic process flow illustrating the semiconductor epitaxial device layers of a Schottky diode device in preparation for die expansion is shown in FIG. 12A. As described in this invention, after deposition of the device layers over the sacrificial region mesa regions are defined at a first pitch. Before or after the mesa regions are defined the ohmic contact is formed to the n-type contact layer and a bonding region is formed overlying the mesa. The sacrificial region is then selectively etched using a selective etching process such as PEC etching. The etch can be a full etch wherein the entirety of the sacrificial region is removed or wherein the sacrificial region is partially removed such that a portion remains unetched. The unetched sacrificial region could function as an anchor region, providing mechanical support to the epitaxial layers to hold them in place prior to the bonding steps. As previously described, other materials can be used for anchor features such as metal regions, dielectric regions, oxide regions, or other. FIG. 12B is an example illustration of the selective bonding process to a carrier wafer wherein the mesa on the GaN substrate comprised of the Schottky diode device layers are transferred to the carrier wafer in a sequential fashion according to a second pitch that is greater than the pitch that mesa was formed on the GaN substrate. After bonding to the carrier wafer the remaining steps for the fabrication of the Schottky diode device.

The value of such die expansion applied to electronic devices could be enormous through the greatly increased utilization of the epi area similar to its application to laser diodes. The origin of this large value creation is that typical GaN based power devices have a very small "active" area relative to the total chip area required for the device. This is due to the fact that the electrodes or bond pads that are used to connect the "active" device area to external or on-chip power sources often require factors of 5 or more area than the active devices themselves require. As an example, a top-view schematic of an example conventional Schottky diode device is shown in FIG. 12C. According to FIG. 12C, the device is comprised by a total area depicted by 100. Within the total area 100 of the device, the active area 101 is depicted with the dashed line. As shown, the active area wherein Schottky diode function is generated where the Schottky contact electrode 102 and the ohmic contact electrode 103 actually connects to the active area 101 is much smaller than the area 100 configured to provide sufficient area for the full Schottky contact electrode 102 and the ohmic contact electrode 103.

A cross section of the conventional Schottky diode device shown in FIG. 12C is shown in FIG. 12D. According to FIG. 12D, Epitaxial layers are formed on the substrate 200, which may be selected from silicon, silicon carbide, sapphire, or other. The epitaxial layers are configured with a nucleation layer 201 overlying the substrate 200, an n-contact layer and/or conduction region 202 overlying the nucleation region 201, and an intrinsic, UID, or NID drift region 203 overlying the n-contact layer region 202. In this example, a mesa region is formed to define the active area. In some embodiments the mesa is formed using an etching process wherein the etch destructively removes the epitaxial semiconductor material and terminates at or near the substrate. On top of the active area mesa the Schottky diode contact is made with a Schottky diode contact electrode 204 to the drift region 203 in the active area. In this embodiment, the Schottky contact electrode is primarily positioned overlying the substrate wherein the semiconductor was destructively etched. In typical configurations, insulating layers such as dielectrics or oxides would be positioned between the mesa and the electrode and/or between the substrate and the electrode. On the side of the active area wherein the semiconductor layers have been exposed to leave a portion of the n-contact layer region 202 exposed, the ohmic n-contact and n-contact electrode 205 is formed. In this conventional embodiment, the ohmic n-contact electrode is primarily positioned overlying the n-contact and lateral conduction regions and/or overlying the substrate wherein the semiconductor was etched to the substrate. In typical configurations, insulating layers such as dielectrics or oxides would be positioned between the mesa and the electrode and/or between the substrate and the electrode.

A cross section of a Schottky diode device according to this invention is shown in FIG. 12E. According to FIG. 12E, the Schottky diode device layer mesa has been transferred from a native gallium and nitrogen containing substrate to a carrier wafer 300. In this embodiment, the transferred mesa region substantially defines the active area of the device. Overlying the carrier wafer 300 is the bond region 301, overlying the bond region 301 is the intrinsic, or UID, or NID drift region 302, and overlying the drift region 302 is the n-contact layer region 303. In this embodiment the bond region 301 is formed from a highly conductive metal configured with the designed thickness and conductivity to enable a high current operation with minimal resistance and hence, enable a vertical Schottky diode device. According to the present invention, the Schottky contact electrode is overlying the metallic bond region to form an electrical contact. In some embodiments a thick electrode metal is formed over the metallic bond region to enable probing or wirebonding. In another embodiment, the bond region metal on the carrier wafer is the electrode region. Overlying the n-contact layer region 303 is the ohmic n-contact electrode 305, which extends off the mesa and onto the carrier wafer. In typical configurations, insulating layers such as dielectrics or oxides would be positioned between the mesa and the electrode and/or between the carrier wafer and the electrode. The critical aspect of this invention embodiment is the transferred epitaxial material that was initially formed on a bulk GaN substrate is only occupying the "active" area where it is needed and a vast majority of the electrode metal is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a Schottky diode device, very little of the gallium and nitrogen containing epitaxial material is wasted.

In an alternative example of die expansion for semiconductor power electronic devices, a top-view schematic of an example conventional HEMT device is shown in FIG. 12F. According to FIG. 12F, the device is comprised by a total area depicted by 400. Within the total area 400 of the device, the active area 401 is depicted with the dashed line. As shown, the HEMT function is generated where the source electrode 402, gate electrode 403, and drain electrode 404 actually connect to the active area 401 is much smaller than the area 400 configured to provide sufficient area for the full area of the source contact electrode 402, gate contact electrode 403, drain contact electrode 404.

A cross section of the conventional HEMT diode device shown in FIG. 12F is shown in FIG. 12G. According to FIG. 12G, epitaxial layers are formed on the substrate 500, which may be selected from silicon, silicon carbide, sapphire, or other. The epitaxial layers are configured with a nucleation layer 501 overlying the substrate 500, a low bandgap region 502 such as GaN that is typically, UID, or NID overlying the nucleation layer 501, and a high bandgap region 503 such as AlGaN overlying the low bandgap region 502. In this example, a mesa region is formed to define the active area. In some embodiments the mesa is formed using an etching process wherein the etch destructively removes the epitaxial semiconductor material and terminates at or near the substrate. On top of the active area mesa the source contact is made with a source contact electrode 504, a gate contact is made with a gate contact electrode 505, and drain contact is made with the drain contact electrode 506. In this embodiment, the source, gate, and drain contact electrodes are primarily positioned overlying the substrate wherein the semiconductor was destructively etched. In typical configurations, insulating layers such as dielectrics or oxides would be positioned between the mesa and the electrode and/or between the substrate and the electrode.

A cross section of a HEMT device according to this invention is shown in FIG. 12H. According to FIG. 12H, the HEMT diode device layer mesa has been transferred from a native gallium and nitrogen containing substrate to a carrier wafer 600. In this embodiment, the transferred mesa region substantially defines the active area of the device. Overlying the carrier wafer 600 within the active area is the bond region 601, the lower bandgap material such as GaN region 602 overlying the bond region 601, and the higher bandgap region 603 overlying the lower bandgap region 602. In this embodiment the bond region 601 may be formed from an insulating region such as an oxide material. In alternative embodiments it may be formed by a metal. On top of the active area mesa the source contact is made with a source contact electrode 604, a gate contact is made with a gate contact electrode 605, and drain contact is made with the drain contact electrode 606. In this embodiment, the source, gate, and drain contact electrodes are primarily positioned overlying the carrier wafer. In typical configurations, insulating layers such as dielectrics or oxides would be positioned between the mesa and the electrode and/or between the substrate and the electrode. The critical aspect of this invention embodiment is the transferred epitaxial material that was initially formed on a bulk GaN substrate is only primarily occupying the "active" area where it is needed to generate the HEMT function and a vast majority of the electrode metal that is required for making electrical connections is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a HEMT device, very little of the gallium and nitrogen containing epitaxial material is wasted.

A powerful feature of the present invention is the ability to fabricate devices with increased functionality by transferring various semiconductor components to a common carrier wafer to form an integrated semiconductor device. There are many applications where it would be advantageous to have various semiconductor components on a common carrier wafer to form an integrated device. One example is the integration of LEDs with electronic power devices. GaN based LEDs used in lighting applications typically require dedicated electronic driver circuits for AC-DC power conversion, current sourcing, and dimming using pulse-width modulation (PWM) or analog current control methods. GaN power devices such as MOSFETs, HEMTs, and MOS-Channel HEMTs (MOSCHEMTs) have shown outstanding performance. Thus, integration of GaN-based LEDs and GaN power devices such as HEMTs can reduce the cost, size, and efficiency of solid state lighting systems. Another emerging application wherein LEDs would benefit from the integration with electronics is in LI-FI, which is a bidirectional, high speed and fully networked wireless communications, like WI-FI, using visible light. Since LI-FI requires driver circuitry to modulate the light output of the LED devices, merging electronic devices onto the same chip as the LED would be advantageous. FIG. 13A is an example of an LED device integrated with a HEMT device and Schottky diode device. The integrated devices in FIG. 13A is merely an example of integration using the present invention. According to this invention any configuration and any number of semiconductor devices can be integrated onto a common carrier wafer, and in some embodiments the carrier wafer is comprised of semiconductor devices such as silicon devices. In this embodiment shown in FIG. 13A, a HEMT device is fabricated on a substrate, which could be on a native GaN substrate or a foreign substrate. The HEMT device is comprised of a sacrificial region underlying the HEMT device layers. Mesas are formed using an etching process and the sacrificial region is selective etched. In a preferred embodiment, anchor structures or regions are formed to maintain the structural integrity of the HEMT device layers to hold them in place. Following the formation of the bond region overlying the mesa region the HEMT structure is transferred to a carrier wafer. Similar process steps are employed to transfer the Schottky device layers and the LED device layers to the carrier wafer. The HEMT, Schottky diode, and LED device layers are then processed into their respective devices. A simplified schematic of the resulting structure is shown in FIG. 13A.

In another embodiment of integrating an LED device with a HEMT device, the HEMT device is processed on the gallium and nitrogen substrate such as GaN. The gate, source, and drain regions are formed along with all of the passive regions. The HEMT device is then transferred to the carrier wafer such that the gate, source, and drain regions form metal bonds to the carrier wafer. In one embodiment the LED epitaxial layers are transferred to the carrier wafer and then the LED device is formed using process steps. In other embodiments, processing steps are performed on the LED epitaxial layers on the gallium and nitrogen containing substrate.

In yet another embodiment of semiconductor device integration according to this invention a gallium and nitrogen semiconductor device or epitaxial layer structure is transferred to a carrier wafer comprising semiconductor devices. An example of this embodiment is transferring an LED device to a silicon wafer with CMOS circuitry configured as the driver for the LED device. In another example of this embodiment a GaN based HEMT is bonded to a silicon carrier wafer comprising silicon MOSFET devices. By cascading a high-voltage, normally-on GaN device and a low-voltage silicon MOSFET device, a normally OFF high power device can be formed. This approach can provide a simple and low cost method to deliver a normally-off GaN device. A simplified schematic of the device is shown in FIG. 13C.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

REFERENCES 1. www.en.wikipedia.org/wiki/Light-emitting_diode
2. H. Amano, M. Kito, K. Hiramatsu, and I. Akasaki, "p-type conduction in Mg-doped
   GaN treated with low-energy electron beam irradiation (LEEBI)," Jpn. J. Appl. Phys. vol. 28, pp. L2112-L2114, 1989.
3. S. Nakamura, M. Senoh, and T. Mukai, "p-GaN/n-InGaN/n-GaN double-heterostructure blue-light-emitting diodes," Jpn. J. Appl. Phys., vol. 32, pp. L8-L11, 1993.
4. S. Nakamura, T. Mukai, and M. Senoh, "Candera-class high-brightness InGaN/AlGaN double-heterostructure blue-light-emitting diodes," Appl. Phys. Lett., vol. 64, pp. 1687-1689, 1994.
5. www.en.wikipedia.org/wiki/Power_electronics
6. www.en.wikipedia.org/wiki/Transistor
7. www.en.wikipedia.org/wiki/Gallium_nitride
8. Holder, C., Speck, J. S., DenBaars, S. P., Nakamura, S. & Feezell, D. Demonstration of Nonpolar GaN-Based Vertical-Cavity Surface-Emitting Lasers. Appl. Phys. Express 5, 092104 (2012).
9. Tamboli, A. Photoelectrochemical etching of gallium nitride for high quality optical devices. (2009). at <http://adsabs.harvard.edu/abs/2009PhDT . . . . . . . . 68T>
10. Yang, B. MICROMACHINING OF GaN USING PHOTOELECTROCHEMICAL ETCHING. (2005).
11. Lidow, Alex, Strydom, Johan; GaN Technology Overview, EPC White Paper. (2012)

What is claimed is:

1. A method for manufacturing a semiconductor device, the method comprising:
   providing a substrate having a surface region;
   forming a first material overlying the surface region, the first material comprising a release material overlying the substrate and at least an intrinsic-type or unintentionally doped gallium and nitrogen containing region overlying the release material or at least an n-type gallium and nitrogen containing region overlying the release material or at least a p-type gallium and nitrogen containing region overlying the release material or at least a combination of one or more of the n-type gallium and nitrogen containing region, the p-type gallium and nitrogen containing region, and the intrinsic-type or unintentionally doped gallium and nitrogen containing region overlying the release material;
   patterning the first material and forming mesas to form a plurality of dies arranged in an array, each die corresponding to a plurality of semiconductor devices and being arranged by a first pitch between adjacent die in the array;
   forming an interface region overlying the first material, the interface region comprising a metal, a semiconductor, a dielectric, oxide, glass, or a polymer;
   subjecting the release material to an energy source to fully or partially remove the release material, the release material disposed between the surface region and the one or more of the n-type gallium and nitrogen containing region, the p-type gallium and nitrogen containing region, and the intrinsic-type or unintentionally doped gallium and nitrogen containing region, wherein fully or partially removing the release material leaves undercuts between the surface region and the one or more of the n-type gallium and nitrogen containing region, the p-type gallium and nitrogen containing region, and the intrinsic-type or unintentionally doped gallium and nitrogen containing region;
   bonding the interface region to a carrier wafer to form a bonded structure, while maintaining the release material completely or partially removed from the bonded structure; and
   releasing the plurality of dies provided on the substrate to transfer the plurality of dies to the carrier wafer, wherein each pair of the transferred dies is configured with a second pitch between each pair of adjacent dies on the carrier wafer;
   wherein the carrier wafer comprises silicon and includes complementary metal oxide semiconductor (CMOS) circuitry for integration with at least some of the plurality of semiconductor devices, and the plurality of semiconductor devices include at least one of: one or more transistor devices, one or more light emitting devices, one or more power diode devices, or combinations thereof.

2. The method of claim 1 wherein the circuitry on the carrier wafer includes thin film transistors (TFTs).

3. The method of claim 1 wherein the circuitry on the carrier wafer includes metal-oxide-semiconductor field-effect transistors (MOSFETs).

4. The method of claim 1 wherein the plurality of semiconductor devices include the one or more power diode devices, and the circuitry on the carrier wafer includes silicon metal-oxide-semiconductor field-effect transistor (MOSFET) devices.

5. The method of claim 1 wherein the plurality of semiconductor devices include the one or more light emitting devices, and the circuitry on the carrier wafer includes drivers for the one or more light emitting devices.

6. The method of claim 1 wherein the plurality of semiconductor devices include at least one high electron mobility transistor, and the circuitry on the carrier wafer includes a silicon metal-oxide-semiconductor field-effect transistor (MOSFET) device.

7. The method of claim 1 wherein the substrate is selected from a gallium and nitrogen containing substrate, a sapphire substrate, a SiC substrate, a gallium oxide substrate, a spinel substrate, a lanthanum aluminate substrate, a magnesium oxide substrate, or a silicon substrate.

8. The method of claim 1 wherein the first material is a gallium and nitrogen containing material.

9. The method of claim 1 wherein the one or more transistor devices include at least one of a thin film transistor, a bipolar junction transistor, a high electron mobility transistor, a field effect transistor, or a heterojunction bipolar transistor.

10. The method of claim 1 wherein the one or more power diode devices include at least one of a Schottky diode or a p-n diode.

11. The method of claim 1 wherein the one or more light emitting devices include at least one of a light emitting diode (LED) device or a laser diode device.

12. A method for manufacturing a semiconductor device, the method comprising:
    providing a substrate having a surface region;
    forming a first material overlying the surface region, the first material comprising a release material overlying the substrate and at least an intrinsic-type or unintentionally doped gallium and nitrogen containing region overlying the release material or at least an n-type gallium and nitrogen containing region overlying the release material or at least a p-type gallium and nitrogen containing region overlying the release material or at least a combination of one or more of the n-type gallium and nitrogen containing region, the p-type gallium and nitrogen containing region, and the intrinsic-type or unintentionally doped gallium and nitrogen containing region overlying the release material;

patterning the first material and forming mesas to form a plurality of dies arranged in an array, each die corresponding to a plurality of semiconductor devices and being arranged by a first pitch between adjacent dies in the array;

forming an interface region overlying the first material, the interface region comprising a metal, a semiconductor, a dielectric, oxide, glass, or a polymer;

subjecting the release material to an energy source to fully or partially remove the release material, the release material disposed between the surface region and the one or more of the n-type gallium and nitrogen containing region, the p-type gallium and nitrogen containing region, and the intrinsic-type or unintentionally doped gallium and nitrogen containing region, wherein fully or partially removing the release material leaves undercuts between the surface region and the one or more of the n-type gallium and nitrogen containing region, the p-type gallium and nitrogen containing region, and the intrinsic-type or unintentionally doped gallium and nitrogen containing region;

bonding the interface region to a carrier wafer to form a bonded structure, while maintaining the release material completely or partially removed from the bonded structure;

releasing the plurality of dies provided on the substrate to transfer the plurality of dies to the carrier wafer;

processing at least one of the plurality of dies to form the plurality of semiconductor devices, wherein the carrier wafer comprises silicon and includes circuitry for integration with at least some of the plurality of semiconductor devices, and the plurality of semiconductor devices include at least one of: one or more transistor devices, one or more light emitting devices, one or more power diode devices, or combinations thereof.

13. The method of claim 12 wherein the circuitry on the carrier wafer is formed via complementary metal oxide semiconductor (CMOS) processing.

14. The method of claim 12 wherein the circuitry on the carrier wafer includes thin film transistors (TFTs).

15. The method of claim 12 wherein the circuitry on the carrier wafer includes metal-oxide-semiconductor field-effect transistors (MOSFETs).

16. The method of claim 12 wherein the plurality of semiconductor devices include the one or more power diode devices, and the circuitry on the carrier wafer includes silicon metal-oxide-semiconductor field-effect transistor (MOSFET) devices.

17. The method of claim 12 wherein the plurality of semiconductor devices include the one or more light emitting devices, and the circuitry on the carrier wafer includes drivers for the one or more light emitting devices.

18. The method of claim 12 wherein the plurality of semiconductor devices include at least one high electron mobility transistor, and the circuitry on the carrier wafer includes a silicon metal-oxide-semiconductor field-effect transistor (MOSFET) device.

19. The method of claim 12 wherein the substrate is selected from a gallium and nitrogen containing substrate, a sapphire substrate, a SiC substrate, a gallium oxide substrate, a spinel substrate, a lanthanum aluminate substrate, a magnesium oxide substrate, or a silicon substrate.

20. The method of claim 12 wherein the first material is a gallium and nitrogen containing material.

21. The method of claim 12 wherein the one or more transistor devices include at least one of a thin film transistor, a bipolar junction transistor, a high electron mobility transistor, a field effect transistor, or a heterojunction bipolar transistor.

22. The method of claim 12 wherein the one or more light emitting devices include at least one of a light emitting diode (LED) device or a laser diode device.

23. The method of claim 12 wherein the one or more power diode devices include at least one of a Schottky diode or a p-n diode.

24. A method for manufacturing a semiconductor device, the method comprising:

providing a substrate having a surface region;

forming a first material overlying the surface region, the first material comprising a release material overlying the substrate and at least an intrinsic-type or unintentionally doped gallium and nitrogen containing region overlying the release material or at least an n-type gallium and nitrogen containing region overlying the release material or at least a p-type gallium and nitrogen containing region overlying the release material or at least a combination of one or more of the n-type gallium and nitrogen containing region, the p-type gallium and nitrogen containing region, and the intrinsic-type or unintentionally doped gallium and nitrogen containing region overlying the release material;

patterning the first material and forming mesas to form a plurality of first dies arranged in an array, each first die corresponding to a plurality of first semiconductor devices and being arranged by a first pitch between adjacent first dies in the array;

forming an interface region overlying the first material, the interface region comprising a metal, a semiconductor, a dielectric, oxide, glass, or a polymer;

subjecting the release material to an energy source to fully or partially remove the release material, the release material disposed between the surface region and the one or more of the n-type gallium and nitrogen containing region, the p-type gallium and nitrogen containing region, and the intrinsic-type or unintentionally doped gallium and nitrogen containing region, wherein fully or partially removing the release material leaves undercuts between the surface region and the one or more of the n-type gallium and nitrogen containing region, the p-type gallium and nitrogen containing region, and the intrinsic-type or unintentionally doped gallium and nitrogen containing region;

bonding the interface region to a carrier wafer to form a bonded structure, while maintaining the release material completely or partially removed from the bonded structure;

releasing the plurality of first dies provided on the substrate to transfer the plurality of first dies to the carrier wafer;

processing at least one of the plurality of first dies to form the plurality of first semiconductor devices, wherein the carrier wafer comprises silicon and includes circuitry for integration with at least some of the plurality of semiconductor devices; and transferring a plurality of second dies to the carrier wafer, each second die corresponding to a plurality of second semiconductor devices, each second die comprising GaAs, AlAs, AlGaAs, InGaAs, InGaP, AlInGaP, AlInGaAs, or AlInGaAsP.

25. The method of claim 24 wherein the circuitry on the carrier wafer is formed via complementary metal oxide semiconductor (CMOS) processing.

26. The method of claim 24 wherein the circuitry on the carrier wafer includes thin film transistors (TFTs).

27. The method of claim 24 wherein the circuitry on the carrier wafer includes metal-oxide-semiconductor field-effect transistors (MOSFETs).

28. The method of claim 24 wherein the substrate is selected from a gallium and nitrogen containing substrate, a sapphire substrate, a SiC substrate, a gallium oxide substrate, a spinel substrate, a lanthanum aluminate substrate, a magnesium oxide substrate, or a silicon substrate.

29. The method of claim 24 wherein the first material is a gallium and nitrogen containing material.

* * * * *